United States Patent
Gao et al.

(10) Patent No.: US 7,502,127 B2
(45) Date of Patent: Mar. 10, 2009

(54) SENSOR DEVICE AND STAGE DEVICE

(75) Inventors: Wei Gao, Sendai (JP); Satoshi Kiyono, Sendai (JP); Yoshiyuki Tomita, Hiratsuka (JP); Toru Hirata, Yokohama (JP); Yoji Watanabe, Sendai (JP); Kennichi Makino, Hiratsuka (JP)

(73) Assignees: Sumitomo Heavy Industries, Ltd., Tokyo (JP); Tohoku Technoarch Co., Ltd., Sendai-shi (JP)

( * ) Notice: Subject to any disclaimer, the term of this patent is extended or adjusted under 35 U.S.C. 154(b) by 0 days.

(21) Appl. No.: 11/588,271

(22) Filed: Oct. 27, 2006

(65) Prior Publication Data

US 2007/0041024 A1 Feb. 22, 2007

Related U.S. Application Data

(63) Continuation of application No. PCT/JP2005/007481, filed on Apr. 19, 2005.

(30) Foreign Application Priority Data

| Apr. 27, 2004 | (JP) | ............................ 2004-131886 |
| Jun. 29, 2004 | (JP) | ............................ 2004-191828 |

(51) Int. Cl.
| *G01B 11/14* | (2006.01) |
| *G01B 11/02* | (2006.01) |
| *G01B 11/26* | (2006.01) |
| *G01C 1/00* | (2006.01) |
| *G01D 5/36* | (2006.01) |
| *G01N 21/86* | (2006.01) |
| *G01V 8/00* | (2006.01) |

(52) U.S. Cl. ...................... 356/614; 356/138; 356/616; 356/498; 250/237 G; 250/559.29; 250/559.37

(58) Field of Classification Search ...................... None
See application file for complete search history.

(56) References Cited

U.S. PATENT DOCUMENTS 4,621,926 A * 11/1986 Merry et al. ................. 356/508

(Continued)

FOREIGN PATENT DOCUMENTS

CN       1199459 A       11/1998

(Continued)

*Primary Examiner*—Gregory J Toatley, Jr.
*Assistant Examiner*—Gordon J Stock, Jr.
(74) *Attorney, Agent, or Firm*—Squire, Sanders & Dempsey L.L.P.

(57) ABSTRACT

According to one aspect of the invention, there is provided a sensor device which is capable of detecting a state of a movable stage using an easily manufacturable reference grating and capable of improving the accuracy of detection. The sensor device comprises a reference grating which has a configuration that is varied periodically in a two-dimensional direction. A light source emits light to the reference grating. A spectral unit has a plurality of openings to convert the light emitted by the light source into a plurality of light beams through the plurality of openings. A detector unit has a photodetector to receive collectively reflected light beams reflected by the reference grating. The detector unit is provided to detect a state of a movable body relative to the reference grating based on a change of the reflected light beams received by the photodetector.

9 Claims, 44 Drawing Sheets

U.S. PATENT DOCUMENTS

| | | | |
|---|---|---|---|
| 4,998,823 A * | 3/1991 | Kitajima | 356/499 |
| 5,264,915 A | 11/1993 | Huber et al. | |
| 5,424,833 A * | 6/1995 | Huber et al. | 356/499 |
| 5,666,196 A * | 9/1997 | Ishii et al. | 356/499 |
| 5,784,168 A | 7/1998 | Ophey et al. | |
| 6,262,802 B1 * | 7/2001 | Kiyono | 356/616 |
| 6,320,649 B1 | 11/2001 | Miyajima et al. | |
| 7,102,729 B2 * | 9/2006 | Renkens et al. | 355/53 |
| 7,183,537 B2 * | 2/2007 | Thorburn | 250/231.13 |
| 2003/0173833 A1 * | 9/2003 | Hazelton et al. | 310/12 |

FOREIGN PATENT DOCUMENTS

| | | |
|---|---|---|
| JP | 04-081612 | 3/1992 |
| JP | 04-259817 | 9/1992 |
| JP | 06-347291 | 12/1994 |
| JP | 10-038549 | 2/1998 |
| JP | 10-73424 | 3/1998 |
| JP | 11-223690 | 8/1999 |
| JP | 2003-22959 A | 1/2003 |
| JP | 2003-035570 | 2/2003 |

* cited by examiner

*Prior Art*

$\theta_z = -28800$ arcsec.

$\theta_z = -14400$ arcsec.

$\theta_z = 0$ arcsec.

$\theta_z = 14400$ arcsec.

US 7,502,127 B2

SENSOR DEVICE AND STAGE DEVICE

CROSS-REFERENCE TO RELATED APPLICATION

This application is a U.S. continuation application which is filed under 35 USC 111(a) and claims the benefit under 35 USC 120 and 365(c) of International Application No. PCT/JP2005/007481, filed on Apr. 19, 2005, the entire contents of which are hereby incorporated by reference.

BACKGROUND OF THE INVENTION

1. Field of the Invention

The present invention generally relates to a sensor device and a stage device, and more particularly to a sensor device which is adapted to detect the state of a stage which is moved with high accuracy, and a stage device in which the sensor device is provided.

2. Description of the Related Art

Concerning ultra-precision machining devices and semiconductor devices which are the basis of information processing technology, the demand for high-accuracy positioning and high-speed processing of stage devices, used for these devices, is increasing. For example, for the stage device which is a key component of a semiconductor exposure device, the positioning accuracy on the order of 10 nm and the movement range of several hundreds of millimeter are needed. For this reason, it is necessary to measure precisely the multiple degree of freedom position and attitude of the stage, to feed back the measurement results, and to perform positioning control of the stage.

Generally, as a position instrumentation system of a conventional positioning device, an optical linear encoder, a laser measuring machine, an autocollimator, etc. have been used. These devices fundamentally use as the basic principle one-dimensional length or attitude measurement, and perform instrumentation of the position or the attitude with the combinations of the one-dimensional length or attitude along each of a plurality of axes.

In a laser interferometer used for high precision instrumentation, in order to measure the position of the stage (positioning object) using a laser beam, there is a problem that the accuracy of a measurement value falls by a fluctuation of the air in the device in which the stage is placed.

In a laser interferometer, the optical components can be disposed only on the exterior of the stage, in order to prevent the fluctuation of the air, it is necessary to arrange the metallic pipe which serves as an optical path of a laser beam for every direction. For this reason, there is the problem in that the whole stage device is enlarged in size and the structure becomes complicated.

In rotating the stage around the Z-axis, there is a problem in that the reflected light from the stage separates from the light receiving unit of the interferometer and the X-Y direction position detection becomes impossible.

A sensor device which is adapted to solve such problems is known. In the known sensor device, a reference grating is irradiated by a laser beam, and the two-dimensional angles of the X and Y directions of the reflected light reflected by the reference grating (angle grating) are detected by a two-dimensional angle sensor.

FIG. 1 is a schematic diagram showing a sensor device which has a reference grating and a two-dimensional angle sensor.

As shown in FIG. 1, in this sensor device 300, the position in the X/Y direction is detected based on a change of the output signal of a two-dimensional angle sensor 290.

The two-dimensional angle sensor 290 is adapted to detect the inclination of the surface of a reference grating 320, and to detect a change of the direction of a line normal to the surface of the reference grating 320. Therefore, the inclination of the XY direction (two-dimensional) and the change of the normal line can be detected by using the two-dimensional angle sensor 290.

The reference grating 320 has a configuration, composed of crests and troughs collectively, which is varied periodically in accordance with a known function, in the two orthogonal directions (the X-direction and the Y-direction) on the flat surface. For example, a sinusoidal waveform is used for the configuration of the reference grating 320.

Next, the two-dimensional angle sensor 290 shown in FIG. 1 will be explained with reference to FIG. 2. FIG. 2 shows the composition of a two-dimensional angle sensor.

The two-dimensional angle sensor 290 is a geometrical-optics sensor based on the auto-collimation method. As shown in FIG. 2, a laser beam 310 emitted by a laser light source 301 passes through a polarization beam splitter 302 and a ¼ wavelength plate 303, and enters into the surface of the reference grating 320.

A laser beam 312 reflected on the surface of the reference grating 320 is reflected by the polarization beam splitter 302, and the resulting laser beam 312 enters into an autocollimator 305. The autocollimator 305 comprises an objective lens 306, and a photodetector 307 which detects the position of a spot formed by the incident laser beam.

In the above-mentioned auto-collimation method, an image of a target plate (which is usually a cross line) at the focal point of the objective lens 306 is formed at the infinitely distant point, and a parallel light reflected by a plane mirror at a subsequent position from the objective lens 306 is converged at the conjugate position of the target plate surface, and it is necessary to read out a minute angular displacement of the plane mirror from the displacement of the converged image of the cross line within the mirror surface.

For this reason, the auto-collimation method requires the use of an expensive and complicated component, such as the autocollimator 305, and there is a problem that the cost of sensor device 300 becomes high.

In addition, the position detection is performed with high resolution, and there is a possibility that the geometrical-optics principle may not be satisfied due to interference and diffraction of the light as the period of the reference grating 320 and the multi-spot becomes short. For this reason, there is a problem that it is difficult to detect with sufficient accuracy.

In order to detect the state of five degrees of freedom of a movable stage including two-dimensional displacements (X-direction and Y-direction displacements), and three attitude changes (rotation angle around the X-axis, rotation angle around the Y-axis, and rotation angle around the Z-axis), the auto-collimation method requires the use of three two-dimensional angle sensors 300. Therefore, there is a problem that the adjustment between these sensors is difficult to perform.

In the stage device, while the position detection is performed when moving the stage, the drive control of a pair of linear motors provided on both the sides of the stage is performed. In order to raise the position detecting accuracy at this time, it is necessary to make the above-mentioned sensor device 300 in a simple arrangement and detect accurately the movement amount and the inclination of the linear motor.

As another sensor device, a linear scale is known. In the known linear scale, a slit plate is formed to extend in the moving direction of the stage, and the number of slits in the slit plate is optically detected by using an optical sensor which is moved relative to the slit plate, so that the position of the stage is detected.

By using this linear scale, the amount of displacement of the stage in the moving direction can be detected. However, the amount of displacement of the stage in a different direction than the moving direction (for example, the up/down direction displacement and inclination angle around each axis of the stage) cannot be undetected by using the linear scale.

Therefore, in the conventional stage device, a pair of linear scales are further arranged on both sides of the stage, and the yawing angle of the stage is determined through the computation based on the difference between detection signals detected by the pair of linear scales. And movement of the stage is controlled, without detecting the inclination angles of the stage in the other directions than the moving direction.

In the conventional stage device, the drive control of the linear motors is performed based on the position (movement amount) of the stage in the moving direction acquired from the linear scales, and monitoring correctly the inclination state in the other directions cannot be performed when moving the stage.

For this reason, there is a problem in that, if the stage is inclined, it is difficult to detect correctly the amount of the inclination of the stage and it is difficult to check in which direction the stage is inclined.

SUMMARY OF THE INVENTION

According to one aspect of the invention, there is provided an improved sensor device and stage device in which the above-mentioned problems are eliminated.

According to one aspect of the invention, there is provided a sensor device which is capable of detecting the state of five degrees of freedom of a movable stage using an easily manufacturable reference grating, and capable of improving the accuracy of detection.

According to one aspect of the invention, there is provided a stage device which is capable of detecting the state of five degrees of freedom of a movable stage using a sensor device having an easily manufacturable reference grating, and capable of improving the accuracy of detection.

In an embodiment of the invention which solves or reduces one or more of the above-mentioned problems, there is provided a sensor device comprising: a reference grating having a configuration that is varied periodically in a two-dimensional direction; a light source emitting light to the reference grating; a spectral unit having a plurality of openings to convert the light emitted by the light source into a plurality of light beams through the plurality of openings; a detector unit having a photodetector to receive collectively reflected light beams reflected by the reference grating, wherein the detector unit is provided to detect a state of a movable body relative to the reference grating based on a change of the reflected light beams received by the photodetector.

In an embodiment of the invention which solves or reduces one or more of the above-mentioned problems, there is provided a sensor device comprising: a reference grating having a detecting surface on which concave curves and convex curves in a predetermined configuration are periodically formed in two-dimensional directions; a light emitting unit provided to be movable to the reference grating and emitting a plurality of parallel light beams to the detecting surface of the reference grating perpendicularly; and a light receiving unit provided to be movable integrally with the light emitting unit and having a plurality of photodetectors to receive the plurality of parallel light beams which are passed through the reference grating.

In an embodiment of the invention which solves or reduces one or more of the above-mentioned problems, there is provided a sensor device comprising: a reference grating having a detecting surface on which concave curves and convex curves in a predetermined configuration are periodically formed in two-dimensional directions; a reflection surface provided on a back surface of the reference grating; a light emitting unit provided to be movable to the reference grating and emitting a plurality of parallel light beams to the detecting surface of the reference grating perpendicularly; and a light receiving unit provided to be movable integrally with the light emitting unit and having a plurality of photodetectors to receive the plurality of parallel light beams which are reflected by the reflection surface.

In an embodiment of the invention which solves or reduces one or more of the above-mentioned problems, there is provided a sensor device comprising: a reference grating having a detecting surface on which concave curves and convex curves in a predetermined configuration are periodically formed in two-dimensional directions; a reflection surface provided on the detecting surface of the reference grating; a light emitting unit provided to be movable to the reference grating and emitting a plurality of parallel light beams to the detecting surface of the reference grating perpendicularly; and a light receiving unit provided to be movable integrally with the light emitting unit and having a plurality of photodetectors to receive the plurality of parallel light beams which are reflected by the reflection surface.

In an embodiment of the invention which solves or reduces one or more of the above-mentioned problems, there is provided a stage device stage device including a base, a stage which is moved on the base, a motor which drives movement of the stage, a raising unit which functions to raise the stage from the base, and a sensor device which detects a state of the stage, the sensor device comprising: a reference grating having a configuration that is varied periodically in a two-dimensional direction; a light source emitting light to the reference grating; a spectral unit having a plurality of openings to convert the light emitted by the light source into a plurality of light beams through the plurality of openings; and a detector unit having a photodetector to receive collectively reflected light beams reflected by the reference grating, wherein the detector unit is provided to detect a state of the stage relative to the reference grating based on a change of the reflected light beams received by the photodetector.

In an embodiment of the invention which solves or reduces one or more of the above-mentioned problems, there is provided a stage device including a base, a stage provided to be movable to the base, a driving unit provided to drive movement of the stage, a sensor device detecting movement of the stage, and a control unit controlling the driving unit so that the stage is moved at a predetermined speed according to a detection result of the sensor device, the sensor device comprising: a reference grating having a detecting surface on which concave curves and convex curves in a predetermined configuration are periodically formed in two-dimensional directions; a light emitting unit provided to be movable to the reference grating and emitting a plurality of parallel light beams to the detecting surface of the reference grating perpendicularly; and a light receiving unit provided to be movable integrally with the light emitting unit and having a plurality of photodetectors to receive the plurality of parallel light beams which are passed through the reference grating.

According to the invention, it is possible to provide a sensor device and a stage device which can easily detect the displacements and inclination angles of a movable stage to a base by using a reference grating formed in an easily manufacturable configuration, and can improve the accuracy of detection.

DETAILED DESCRIPTION OF PREFERRED EMBODIMENTS

A description will be given of embodiments of the invention with reference to the accompanying drawings.

First, the stage device 230 in an embodiment of the invention will be explained with reference to FIG. 3 and FIG. 4.

Figure 3:
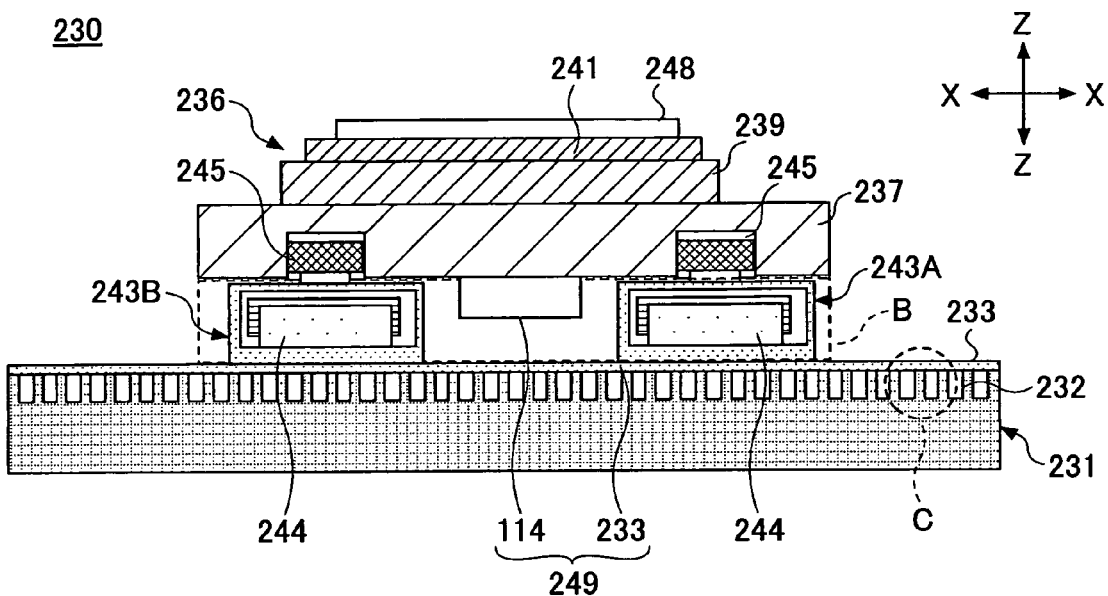
FIG. 3 is a cross-sectional diagram of a stage device provided with a sensor device in an embodiment of the invention.
Figure 4:
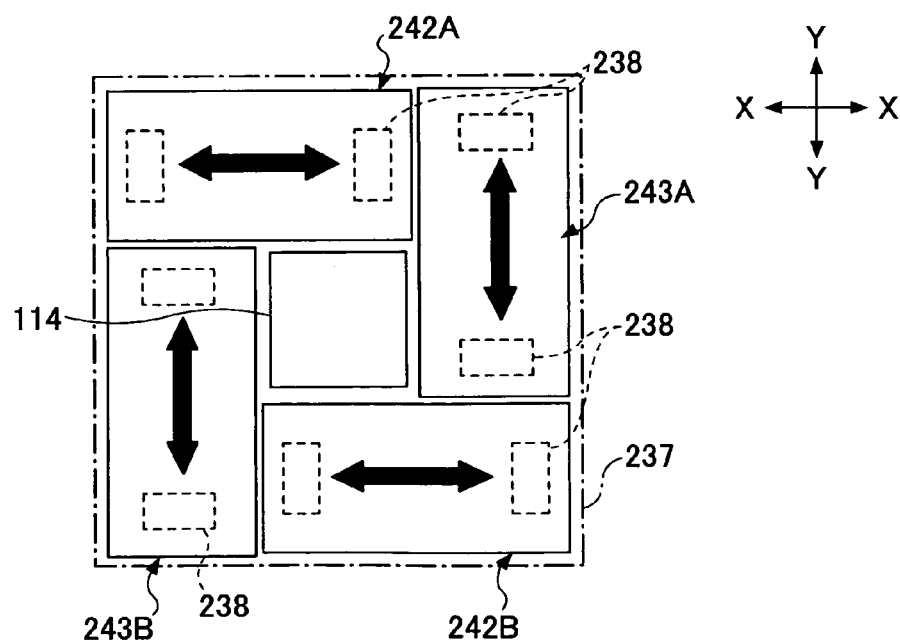
FIG. 4 is a plan view of the structure of the stage device corresponding to the portion B indicated in FIG. 3.

FIG. 3 is a cross-sectional diagram of the stage device of the first embodiment, and FIG. 4 is a plan view of the structure of the stage device corresponding to the area B indicated in FIG. 3.

The stage device 230 is a stage device having a SAWYER motor drive part. The stage device 230 comprises a base 231, a stage 236, and a sensor device 249 as shown in FIG. 3. A plurality of convex parts 232 are formed on the surface of the base 231 at a predetermined pitch. This predetermined pitch is equivalent to the minimum unit of length by which a movable stage part 237 can be moved. The base 231 is made of a metal, such as iron. The stage 236 comprises a movable stage part 237, a fixed stage part 239, a chuck 241, X-direction actuators 242A and 242B, Y-direction actuators 243A and 243B, and tilt actuators 245.

The movable stage part 237 is a base part which is driven by the X-direction actuators 242A and 242B and the Y-direction actuators 243A and 243B.

As shown in FIG. 4, under the movable stage part 237, the X-direction actuators 242A and 242B and the Y-direction actuators 243A and 243B are disposed, and a certain space is provided in the center portion.

Each of the X-direction actuators 242A and 242B and the Y-direction actuators 243A and 243B comprises two or more coil parts 244 and two or more air bearings 238, respectively. By supplying the current to the coil part 244, a magnetic force is generated in the coil part 244, so that the actuating force is exerted to actuate the movable stage part 237.

The air bearings 238 are provided for lifting the X-direction actuators 242A and 242B and the Y-direction actuators 243A and 243B relative to the base 231 according to the force of air. By providing the air bearings 238, when the movable stage part 237 is actuated in the X-direction, the Y-direction, or the direction of θ, the movement can be performed freely in any direction.

The tilt actuator 245 is provided respectively between the movable stage part 237 and each of the X-direction actuators 242A and 242B and the Y-direction actuators 243A and 243B. These tilt actuators 245 are provided for performing horizontal positioning of the movable stage part 237.

The fixed stage part 239 is arranged integrally on the movable stage part 237. The fixed stage part 239 is moved to a desired position by driving the movable stage part 237 using the X-direction actuators 242A and 242B and the Y-direction actuators 243A and 243B. On the fixed stage part 239, the chuck 241 is disposed for mounting a work piece 248 (movable body).

Next, a description will be given of the method of driving the movable stage part 237 with reference to FIG. 5A to FIG. 5D.

FIGS. 5A-5D are diagrams for explaining the relationship between the driving direction of the movable stage and the actuating force of the X-direction and the Y-direction actuators.

Figure 5A:
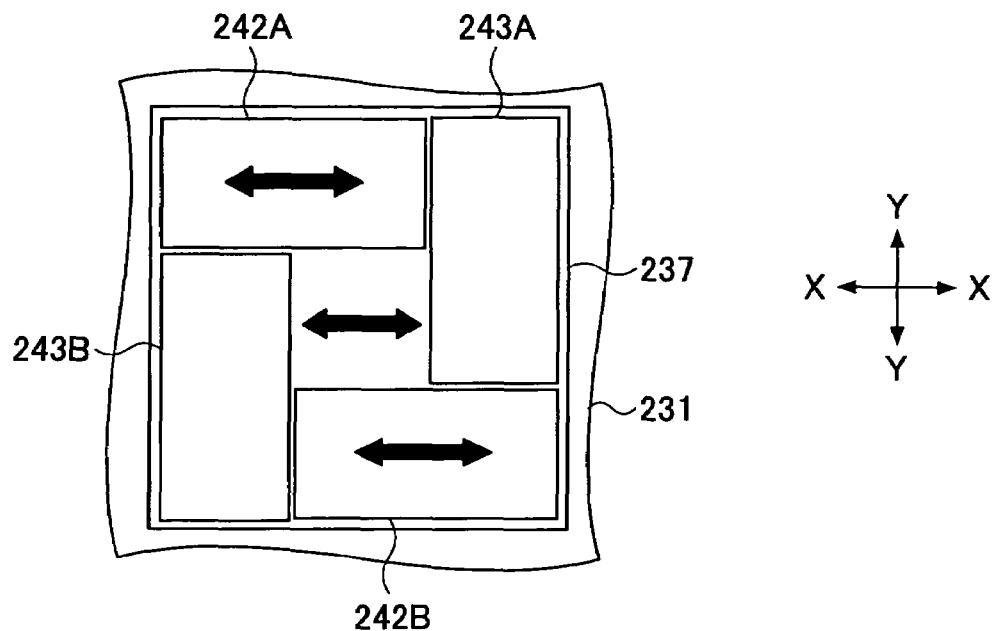
FIG. 5A is a diagram for explaining the relationship between the driving direction of the movable stage and the actuating force of the X-direction and Y-direction actuators.

When moving the movable stage part 237 in the X-X direction, as shown in FIG. 5A, the current is supplied to the coil parts 244 provided in the X-direction actuators 242A and 242B, so that the actuating force of the X-direction actuators 242A and 242B is generated in the X-X direction in which the movable stage part 237 is moved to a desired position.

Figure 5B:
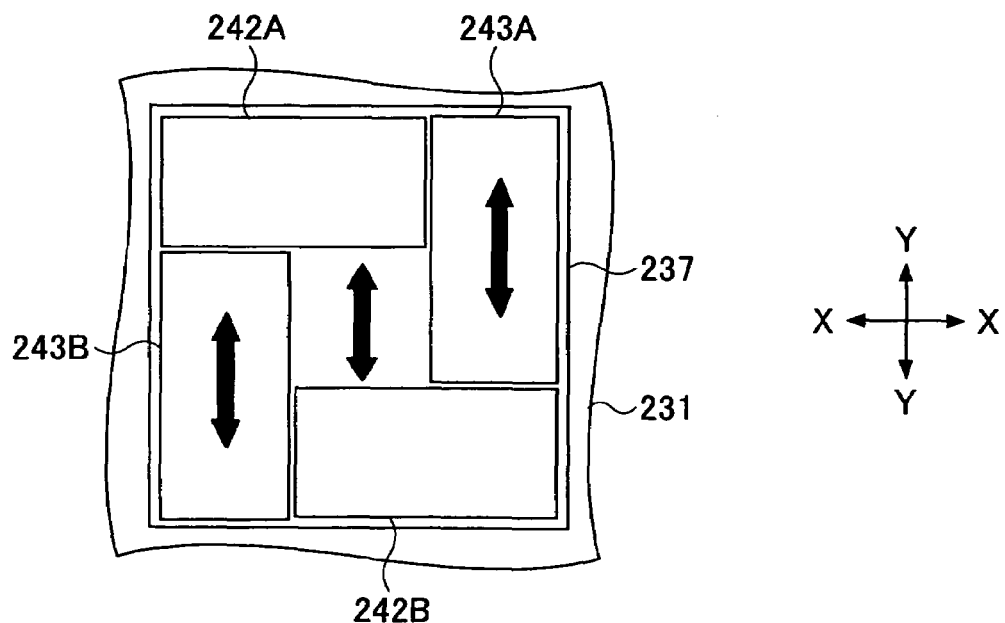
FIG. 5B is a diagram for explaining the relationship between the driving direction of the movable stage and the actuating force of the X-direction and Y-direction actuators.

When moving the movable stage part 237 in the Y-direction, as shown in FIG. 5B, the current is supplied to the coil parts 244 provided in the Y-direction actuators 243A and 243B, so that the actuating force of the Y-direction actuators 243A and 243B is generated in the Y-direction in which the movable stage part 237 is moved to a desired position.

Figure 5C:
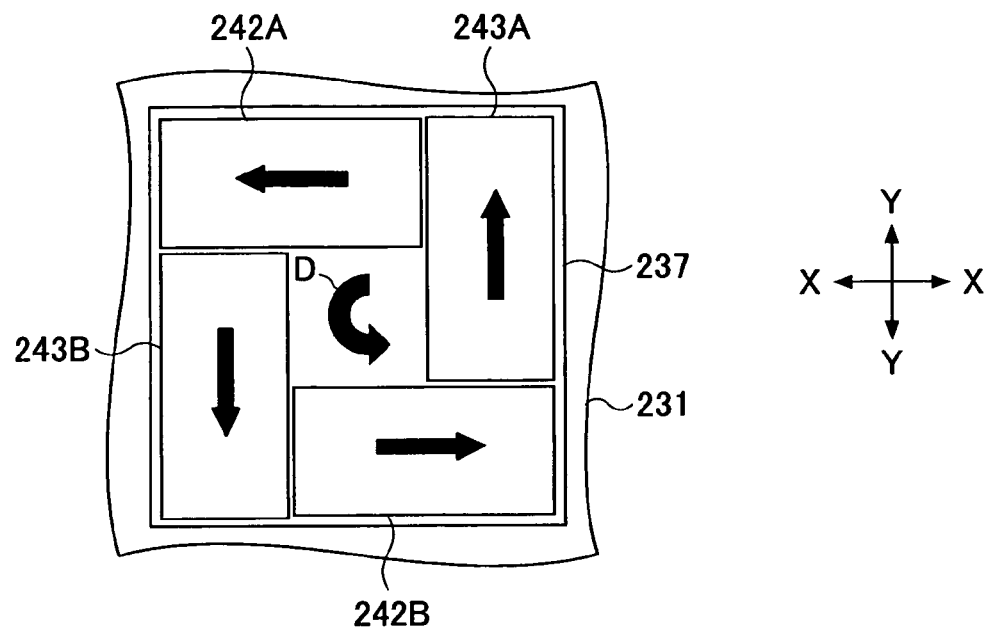
FIG. 5C is a diagram for explaining the relationship between the driving direction of the movable stage and the actuating force of the X-direction and Y-direction actuators.
Figure 5D:
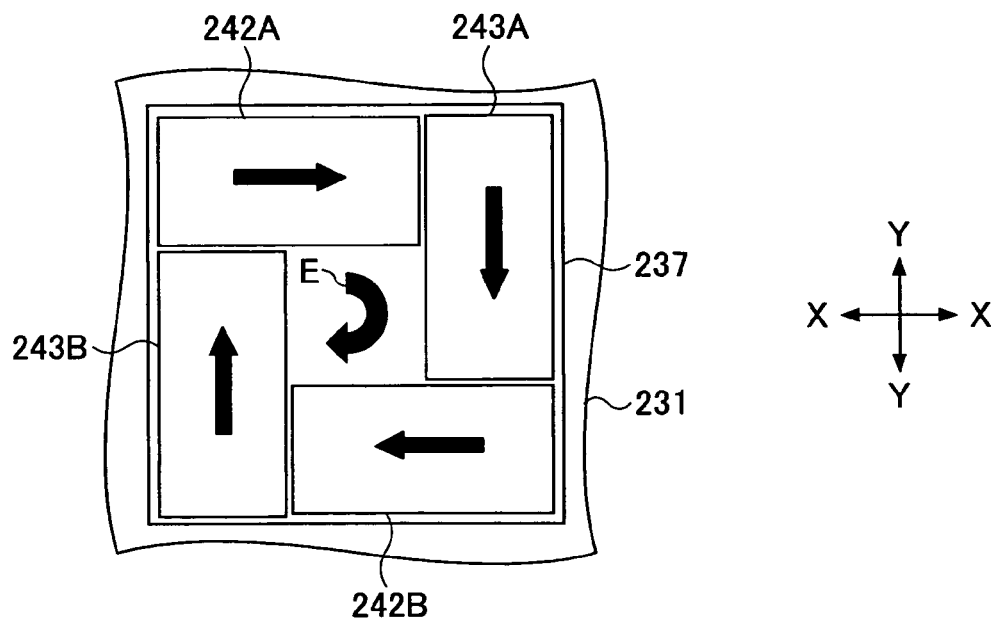
FIG. 5D is a diagram for explaining the relationship between the driving direction of the movable stage and the actuating force of the X-direction and Y-direction actuators.

When moving the movable stage part 237 in the direction of θ, as shown in FIG. 5C or FIG. 5D, the current is supplied to the coil parts 244 provided in the X-direction actuators 242A and 242B and the Y-direction actuators 243A and 243B, so that the actuating force of the X-direction actuators 242A and 242B and the Y-direction actuators 243A and 243B is generated in the direction indicated by the arrow D or the arrow E.

And when the fixed stage part 239 is moved to the desired position on the base 231, the supply of the current to the coil part 244s is stopped and the position of the fixed stage part 239 is fixed. As described previously, the pitch of the convex parts 232 provided in the surface of the base 231 is equivalent to the minimum unit of length by which the movable stage 237 can be moved.

Next, the sensor device 249 will be explained with reference to FIG. 3 and FIG. 4. The sensor device 249 is providing for performing position measurement of the movable stage 237. The sensor device 249 comprises a scale unit 233 and a sensor unit 114.

Figure 6:
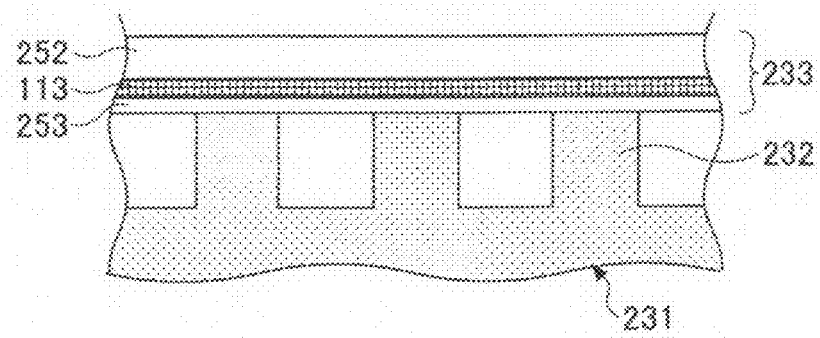
FIG. 6 is an enlarged view of the part of the stage device corresponding to the portion C indicated in FIG. 3.

Next, the scale unit 233 will be explained with reference to FIG. 6. FIG. 6 is an enlarged view of the part of the stage device corresponding to the area C indicated in FIG. 3. FIG. 6 is a diagram showing a scale part and a detector unit. The scale unit 233 is disposed on the convex parts 232 provided in the base 231. The scale unit 233 comprises a scale part 113, an upper resin 252, and a lower resin 253.

Figure 7:
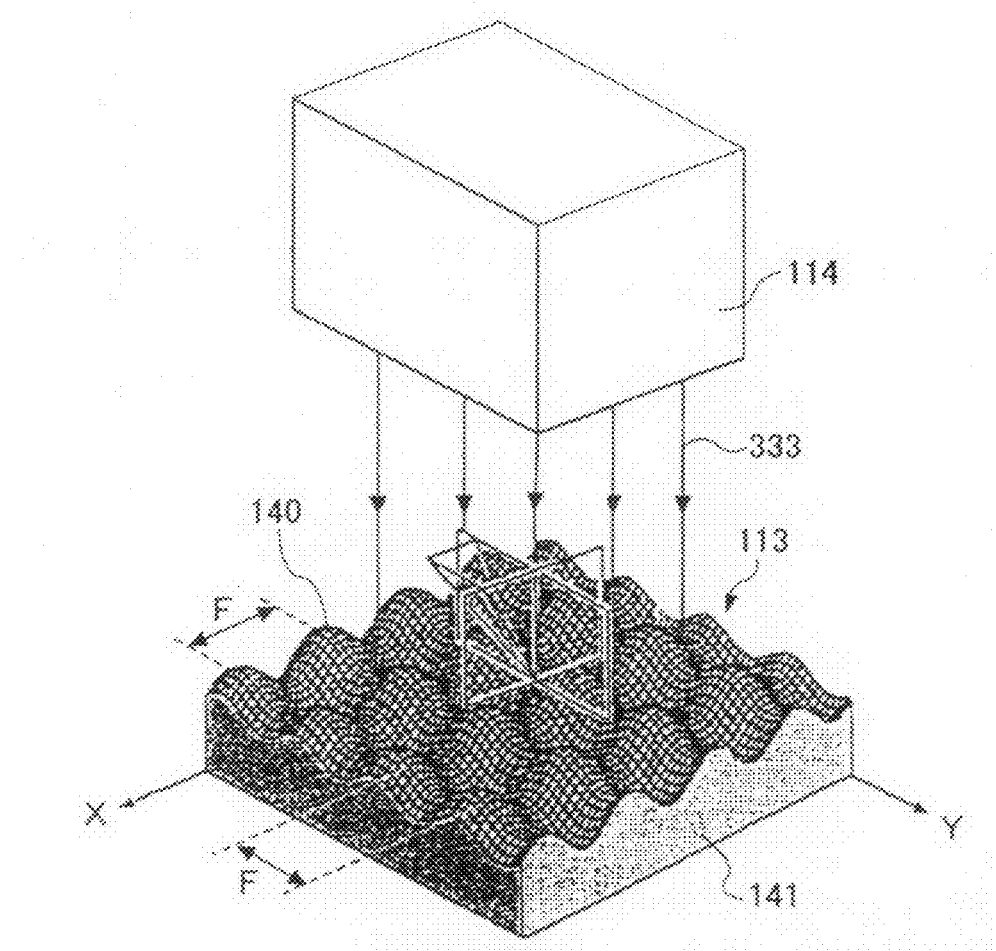
FIG. 7 is an enlarged perspective view of a scale part and a detector unit.

As shown in FIG. 7, the scale part 113 is provided with a number of angle gratings 140 in which the angle-related characteristic is varied at a predetermined pitch F (indicated by the arrow F in FIG. 7) in the two-dimensional directions of X and Y in accordance with a known function (which is, in this embodiment, the set of crests and troughs of a sinusoidal wave).

The upper resin 252 is provided on the top surface of the scale part 113, and the lower resin 253 is provided on the bottom surface of the scale part 113. The upper and lower resins 252 and 253 are provided for protecting the scale part 113 from being damaged by an external force. The upper resin 252 is made of a transparent material that has a good transmission coefficient for a light beam to pass through.

As shown in FIG. 3 and FIG. 4, the sensor unit 114 is disposed on the bottom part of the movable stage part 237 which is surrounded by the X-direction actuators 242A and 242B and the Y-direction actuators 243A and 243B.

Thus, the sensor unit 114 in this embodiment is provided on the bottom part of the movable stage part 237 which is located adjacent to the scale part 113, and it is hardly influenced by the effect of disturbance, such as fluctuation of air, as in the conventional laser interferometer. And it is possible for the detector unit 114 to detect the exact position of the fixed stage 239.

The combination of the detector unit 114 and the scale part including the two-dimensional angle gratings 140 allows the detection of the two-dimensional coordinate position, the pitching angle, the rolling angle, and the yawing angle of the moving body by the relative movement between the scale part and the angle sensors. And the distance between the scale part and the detector unit can also be detected by giving a predetermined angle change to the detector unit.

Figure 8:
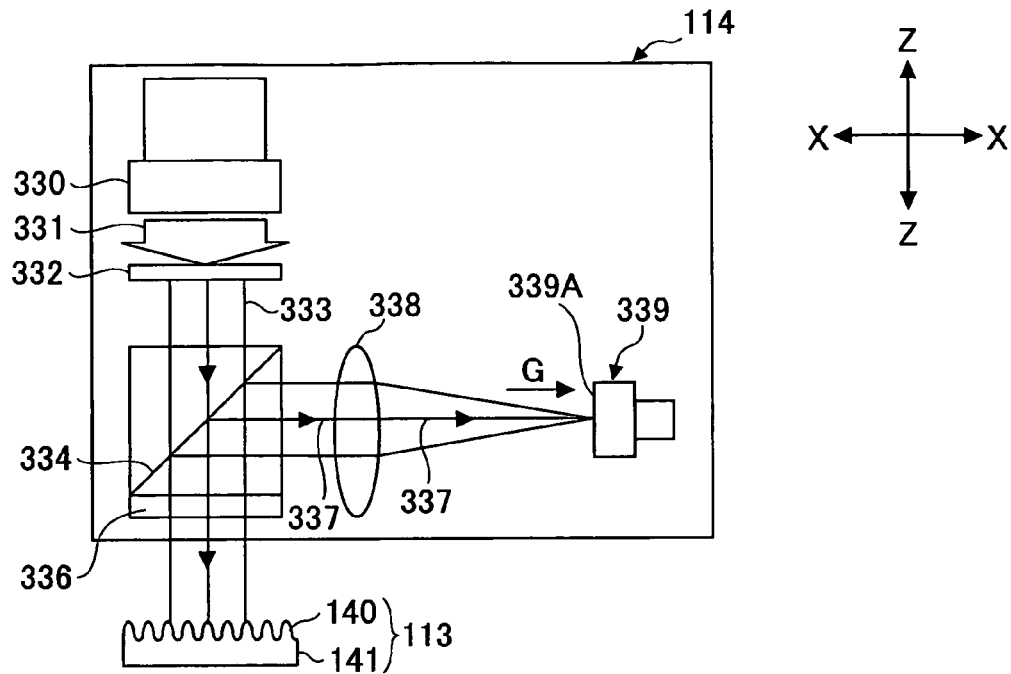
FIG. 8 is a diagram showing the composition of the detector unit, and the scale part.

FIG. 8 shows the composition of the detector unit, and the scale part. The detector unit 114 generally includes a light source part 330, a spectrum plate 332, a polarization beam splitter 334, a ¼ wavelength plate 336, a focusing lens 338, and a photodetector 339. The light source part 330 is provided to emit light 331 which has a width. The spectrum plate 332 is disposed on the side of the direction of movement (the lower part in FIG. 8) of the light 331 emitted by the light source part 330.

As shown in FIG. 7 and FIG. 8, the scale part 113 is provided on or within the surface of the base 141. And the scale part 113 comprises the angle gratings 140 in which the angle-related characteristic changes in the two dimensions of the X-direction and the Y-direction in accordance with the known function (which is in this embodiment the set of crests and troughs of a sinusoidal wave).

As shown in FIG. 8, reflected laser beams reflected from the angle gratings 140 are measured using the detector unit 114 which is adapted for detecting angle changes in the two directions of X and Y. The angle output in each of the respective directions changes with a change in the position of the sloping face of the crests even if the height from the crests of the angle gratings is the same. Therefore, a two-dimensional coordinate position can be determined based on a change of the angle output.

Accordingly, the scale part 113 is attached to the base 231 and the two-dimensional angle sensor 14 is attached to the movable stage part 237, and the two-dimensional coordinates of the movable stage part 237 (or the movable body) can be detected with the relative movement of the scale part and the two-dimensional angle sensor.

The angle gratings 140 in this embodiment are produced by a known processing (press die forming) of a cylindrical-shape material made of aluminum. The height configuration of the angle gratings 140 can be expressed by the superposition of a sinusoidal wave with the amplitude of 0.3 micrometers and the period of 300 micrometers. The angle amplitude of the angle gratings 140 in this embodiment is ±21.6 minutes.

In the sensor device 249 having the above-mentioned structure, the configuration of the angle gratings 140 serves as the criteria of position detection. And, if an error is contained in the configuration, position detection accuracy will be affected by the error. If the number of the laser beams which are the probes of the detector unit 114 is one, the output of the laser beam will be greatly affected by a change of the pitch of the gratings of the angle gratings 140 and an error of the configuration of the angle gratings 140. The influences of such errors can be eliminated by emitting a plurality of laser beams to the equal-phase portions of the angle gratings 140 so that a plurality of crests in the angle gratings 140 can be always observed.

Therefore, in this embodiment, the detector unit 114 is provided on the movable stage part 237, and this allows a plurality of laser beams to be emitted to the equal-phase portions of the angle gratings 140. By this composition, the high frequency components of variations in the configuration of the angle gratings 140 (grating pitch) and the influences of the errors of the configuration of the angle gratings 140 are averaged. Thus, it is possible to attain improvement in measurement accuracy.

Moreover, in this embodiment, the detector unit 114 is combined with the angle gratings 140, and it is possible to detect two-dimensional coordinate positions, a pitching angle, a rolling angle, and a yawing angle of the moving body with the relative movement between the scale part 113 and the detector unit 114. Further, it is possible to detect a distance between the scale part 113 and the detector unit 114, by giving a predetermined angle change to the detector unit 114.

Moreover, the detector unit 114 has a dead pass which is very small when compared with the conventional laser interferometer, and the detector unit 114 cannot be easily influenced by an instrumentation error due to thermal expansion, fluctuation of air, etc. Thus, it is possible to perform a high-accuracy position and attitude measurement.

As described previously, in this embodiment, an angle change of the laser beam reflected from the angle gratings 140 is measured using the detector unit 114 which is adapted for detecting angle changes in the two directions of X and Y. The angle output in each of the respective directions changes with a change in the position of the sloping face of the crests even if the height from the crests of the angle gratings is the same. A two-dimensional coordinate position can be determined based on a change of the angle output.

Accordingly, the scale part 113 is attached to the base 231 while the detector unit 114 is attached to the movable stage part 237, which makes it possible to detect a two-dimensional coordinate position of the movable stage part 237 (or the fixed stage 239).

As described in the foregoing, the sensor device 249 is provided in the stage device 230 provided with the motor drive part, and it is possible to attain the miniaturization of the stage device. With the movable stage part 237 which can be actuated to the base 231 in any of the X direction, the Y direction and the θ direction, the measurement of a position of the fixed stage part 239 (or the movable stage part 237) to the base 231 can be performed with high accuracy.

In the case of the conventional stage device, position detection of the stage is performed with the laser beam from the laser measuring instrument, and if a plurality of stages are provided on the single base, the laser beam may be intercepted by the stages. However, in the case of the stage device 230 of the present embodiment, position detection of the stage 236 can be performed with the stage 236 by itself, and even if a plurality of stages 236 are provided on the single base 231, position detection of each of the plurality of stages 236 can be performed with sufficient accuracy.

Figure 9:
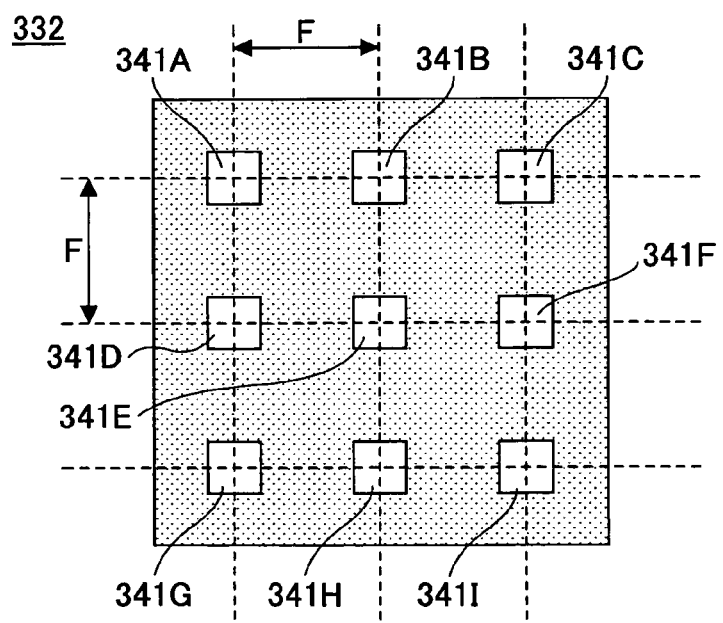
FIG. 9 is a diagram showing a spectrum plate.

FIG. 9 shows the composition of the spectrum plate which is provided in the stage device in this embodiment. As shown in FIG. 9, the spectrum plate 332 in this embodiment includes nine openings 341A-341I which are arranged in a grating formation and this spectrum plate 332 is provided to convert the light 331 emitted by the light source part 330 into nine light beams 333 through the openings 341A-341I.

The openings 341A-341I are formed on or within the surface of the base 141 so that they arrayed at a predetermined pitch F which is the same as the pitch F of the reference grating 140. The nine light beams 333 diffracted by the openings 341A-341I of the spectrum plate 332 interfere with each other, and multiple spots are formed on the reference grating 140 which are arrayed at intervals which are equal to or an integral multiple of the arrangement pitch of the reference grating 140.

The polarization beam splitter 334 is disposed between the spectrum plate 332 and the scale part 113. The polarization beam splitter 334 is provided for making the reflected light beams 337 reflected by the surface of the reference grating 140 directed to the focusing lens 338. The focusing lens 338 is disposed between the polarization beam splitter 334 and the photodetector 339, and it is provided to make the reflected light beams 337 focused on the photodetector 339.

Figure 10:
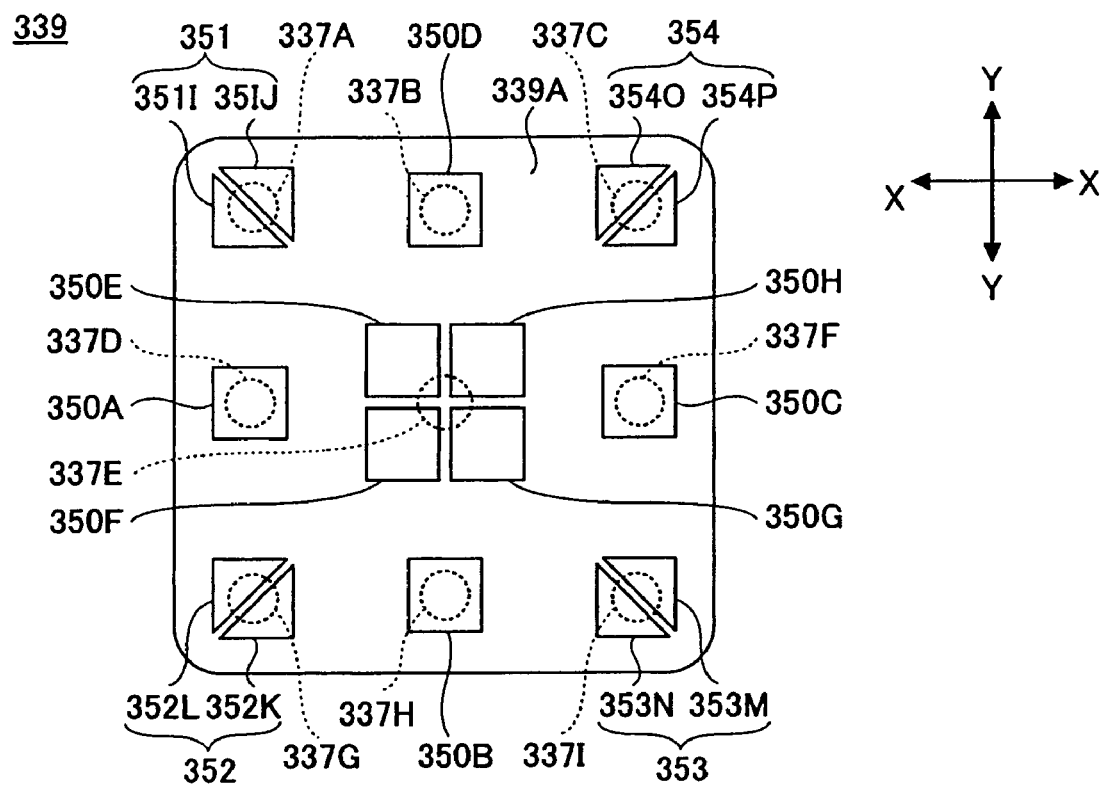
FIG. 10 is a diagram showing the detector unit when viewed from the direction indicated by the arrow G in FIG. 8.

Next, the photodetector 339 will be explained with reference to FIG. 10. FIG. 10 shows the detector unit when viewed from the direction indicated by the arrow G in FIG. 8. In FIG. 10, the circles which are indicated by the dotted lines in FIG. 10 show the reflected light beams 337A-337I which have reached respective photodiodes.

The photodetector 339 is provided with the structure in which photodiodes 350A-350H and photodiodes 351-354 are disposed on the light-receiving surface 339A. The photodiodes 350A-350H and the photodiodes 351-354 are provided to receive the reflected light beams 337A-337I collectively.

The photodetector 339 is provided to detect a state of the fixed stage 239 to the reference grating 140 based on a change of the reflected light beams 337A-337I received collectively by the photodetector 339. Specifically, the state of the fixed stage 239 to the reference grating 140 is detected based on the intensities of the reflected light beams 337A-337I and the positions on the photodiodes 350A-350H and the photodiodes 351-354 where the reflected light beams 337A-337I irradiate.

The light receiving surface 339A is a surface of the receiving side which receives the reflected light beams 337A-337I. The light receiving surface 339A is configured in a generally square shape, and the four photodiodes 350E-350H are disposed in the central part of the light receiving surface 339A.

The photodiodes 351-354 are disposed near the four corner parts of the light-receiving surface 339A. Specifically, the photodiode 351 is disposed at the upper left corner part of the light-receiving surface 339A shown in FIG. 10, the photodiode 352 is disposed at the lower left corner part of the light-receiving surface 339A, the photodiode 353 is disposed at the lower right corner part of the light-receiving surface 339A, and the photodiode 354 is disposed at the upper right corner part of the light-receiving surface 339A, respectively.

The photodiode 351 is constituted by combining a pair of photodiodes 351I and 351J which are formed in the shape of a triangle, and the photodiode 352 is constituted by combining a pair of photodiodes 352L and 352K which are formed in the shape of a triangle. The photo diode 353 is constituted by combining a pair of photodiodes 353M and 353N which are formed in the shape of a triangle, and photodiode 354 is constituted by combining photodiodes 354O and 354P which are formed in the shape of a triangle.

The photo diode 350A is disposed at the intermediate position on the line linking the photodiode 351 and the photodiode 352, and the photodiode 350B is disposed at the intermediate position on the line linking the photodiode 352 and the photodiode 353. The photodiode 350C is disposed at the intermediate position on the line linking the photodiode 353 and the photodiode 354, and the photodiode 350D is disposed at the intermediate position on the line linking the photodiode 351 and the photodiode 354.

As shown in FIG. 10, either the reflected light beams 337A-337D or the reflected light beams 337F-337I irradiate each photodiode of the photodiodes 351-354 and the photodiodes 350A-350D. In this embodiment, based on a change of the position of the reflected light beams 337A-337I received by the photodetector 339, the state of the fixed stage part 239 is detected. A concrete method of detecting the state will be described later.

Figure 11:
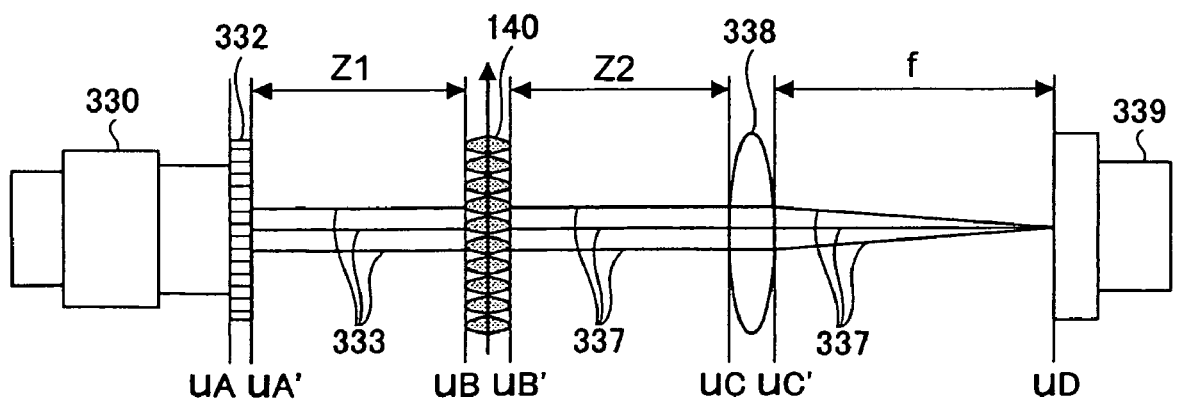
FIG. 11 is a diagram showing the model of a detector unit used for simulation.

Next, the result of a simulation which is performed using the reference grating 140 in order to check whether the detection of the state of five degrees of freedom of a movable body using the photodetector 339 is possible will be explained. FIG. 11 shows the model of the detector unit used for the simulation.

The internal structure of the detector unit 114 is arranged in a rectilinear direction, which is typically illustrated in FIG. 11. In FIG. 11, the elements which are the same as corresponding elements of the detector unit shown in FIG. 8 are designated by the same reference numerals.

The spot intensity distribution of the reflected light beams 337 which are detected by the photodetector 339 is determined from the formula. The computation is carried out by dividing the detector unit 114 into component parts and connecting the functions of the respective component parts. Specifically, as shown in FIG. 11, the detector unit 114 is divided into the spectrum plate 332, the reference grating 140, the focusing lens 338, the photodetector 339, and the space between them. The waveform function g(x, y) of the spectrum plate 332 is equal to 1 when the position is at the openings 341A-341I, and is equal to 0 when the position is in the portions other than the opening 341A-341I. The waveform function g(x, y) is represented by the following formula (1).

$$g(x, y) = \begin{cases} 1 \\ 0 \end{cases} \quad (1)$$

Next, the phase function G(x, y) of the reference grating 140 will be explained. Light 333 which enters into the reference grating 140 turns into the reflected light beams 337, and they are returned to the original optical path. Then, as shown in FIG. 12, the phase function G(x, y) of reference grating 140 can be considered by making the optical paths of the nine light beams 333 and the reflected light beams 337 into one direction.

Figure 12:
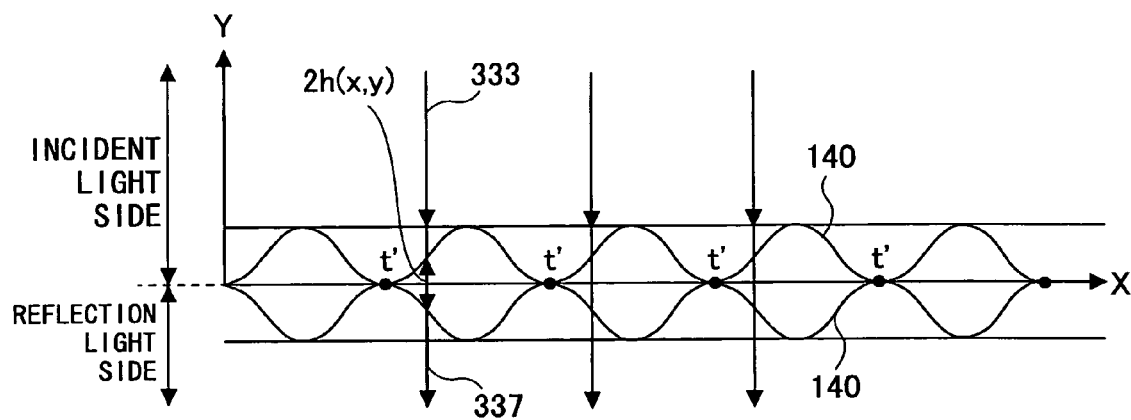
FIG. 12 is a diagram for explaining the phase function of a reference grating.

FIG. 12 is a diagram for explaining the phase function of a reference grating. Suppose that the configuration of the reference grating 140 is set to h(x, y). The optical path of light 333 entering at the point (x, y) is shorter than the light entering at point t' on the base of the reference grating 140 by 2h(x, y). Therefore, the phase function G of the reference grating 140 (x, y) is represented by the following formulas (2).

$$h(x, y) = A\cos\left(\frac{2\pi x}{P}\right) + A\cos\left(\frac{2\pi y}{P}\right) \quad (2)$$

$$G(x, y) = \exp[i2kh(x, y)]$$

In the above formulas (2), k denotes the wave number of light, A denotes the amplitude of the reference grating 140, and P denotes the wavelength of the reference grating 140, respectively.

Next, the phase function L(x, y) of the focusing lens 338 is represented by the following formula (3).

$$L(x, y) = \exp[ik(\sqrt{f^2+x^2+y^2}-f)] \quad (3)$$

In the above formula (3), f denotes the focal distance of the focusing lens 338. The focusing lens 338 has a function which changes the phase angle and focuses the light according to the incidence position.

Propagation of light in the space will be explained. Propagation of light in the space is modeled by the Fresnel diffraction. Supposing that u0(x, y) denotes the light wave of a propagation initiation face, u(x, y) denotes the light wave on the observation face, and z denotes a distance from the initiation face to the observation face, the function u(x, y) which indicates the light wave on the observation face is represented by the following formula (4).

$$u(x, y) = F^{-1}\left[\frac{i}{\lambda} \cdot F[u_0(x, y)] \cdot F\left[\frac{e^{-ik\sqrt{z^2+x^2+y^2}}}{\sqrt{z^2+x^2+y^2}}\right]\right] \quad (4)$$

In the above formula (4), F[v(x, y)] is the two-dimensional Fourier transform of v(x, y), and λ denotes the wavelength of light.

As shown in FIG. 11, the components of the optical system are arranged on a straight line. Suppose that the complex amplitude of the light which enters into the spectrum plate 332 is denoted by UA(x, y), the complex amplitude on photodetector 339 (on photodiodes 350A-350H, and photodiodes 351-354) is denoted by UD(x, y), the distance between the spectrum plate 332 and the reference grating 140 is denoted by Z1, and the distance between the reference grating 140 and the focusing lens 338 is denoted by Z2. The distance between the focusing lens 338 and the photodetector 339 is denoted by f.

At this time, the spot intensity distribution I (x, y) can be determined in accordance with the following formulas (5).

$$u'_A(x, y) = u_A(x, y) \cdot g(x, y), \quad (5)$$

$$u_B(x, y) = F^{-1}\left[\frac{i}{\lambda} \cdot F[u'_A(x, y)] \cdot F\left[\frac{e^{-ik\sqrt{z_0^2+x^2+y^2}}}{\sqrt{z_0^2+x^2+y^2}}\right]\right]$$

$$u'_B(x, y) = u_B(x, y) \cdot G(x, y)$$

$$u_C(x, y) = F^{-1}\left[\frac{i}{\lambda} \cdot F[u'_B(x, y)] \cdot F\left[\frac{e^{-ik\sqrt{z_1^2+x^2+y^2}}}{\sqrt{z_1^2+x^2+y^2}}\right]\right]$$

$$u'_C(x, y) = u_C(x, y) \cdot L(x, y)$$

$$u_D(x, y) = F^{-1}\left[\frac{i}{\lambda} \cdot F[u'_C(x, y)] \cdot F\left[\frac{e^{-ik\sqrt{z_2^2+x^2+y^2}}}{\sqrt{z_2^2+x^2+y^2}}\right]\right]$$

$$I(x, y) = |u_D(x, y)|^2$$

Next, change of spot intensity distribution I(x, y) at the time of movement of five degrees of freedom arising to the reference grating 140 will be explained.

The amounts of displacement in the X direction and Y direction are set to Δx and Δy, respectively. Suppose that the degree of rotation angle at the time of setting the degree of rotation angle at the time of setting the degree of rotation angle at the time of setting a rotating axis as the Z-axis and carrying out rotational movement to θz (yawing angle), and carrying out rotational movement by setting a rotating axis as the X-axis to θx (rolling angle), and carrying out rotational movement by setting a rotating axis as the Y-axis is set to θy (pitching angle). The following formula (6) will be obtained.

$$G(x, y) = \exp[i2k\{h(x' + \Delta x, y' + \Delta y) + \theta_y \cdot x + \theta_x \cdot y\}] \quad (6)$$

$$\begin{bmatrix} x' \\ y' \end{bmatrix} = \begin{bmatrix} \cos\theta_z & -\sin\theta_z \\ \sin\theta_z & \cos\theta_z \end{bmatrix} \cdot \begin{bmatrix} x \\ y \end{bmatrix}$$

A change of I(x, y) when the movement of five degrees of freedom arises to the reference grating 140 can be determined by substituting the formula (6) for the formulas (5) and performing the computations. Change of I (x, y) when the movement of five degrees of freedom arises to the reference grating 140 is represented by the following formula (7).

$$I_A(x, y) = \sqrt{r_y^2 - y^2} \cdot \exp\left[-\frac{x^2}{2\sigma_x^2} - \frac{y^2}{2\sigma_y^2}\right] \quad (7)$$

Figure 13:
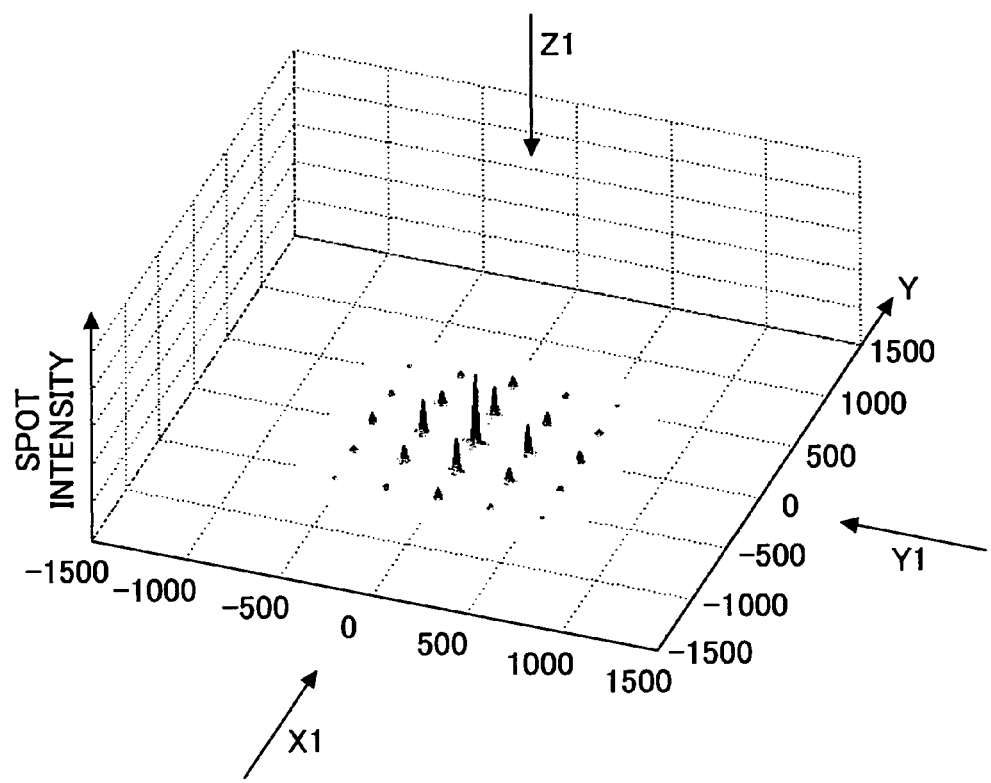
FIG. 13 is a diagram showing the simulation result when simulation of the change of spot intensity distribution I (x, y) is performed.
Figure 14A:
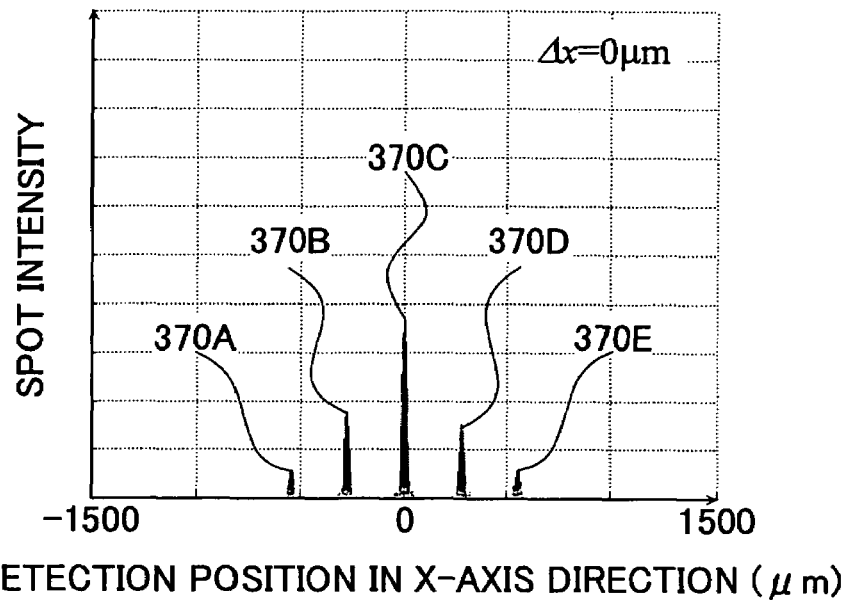
FIG. 14A is a diagram for explaining the spot intensity distribution, viewed from the X1 direction, when the movable body is displaced in the X-direction to the reference grating.
Figure 14B:
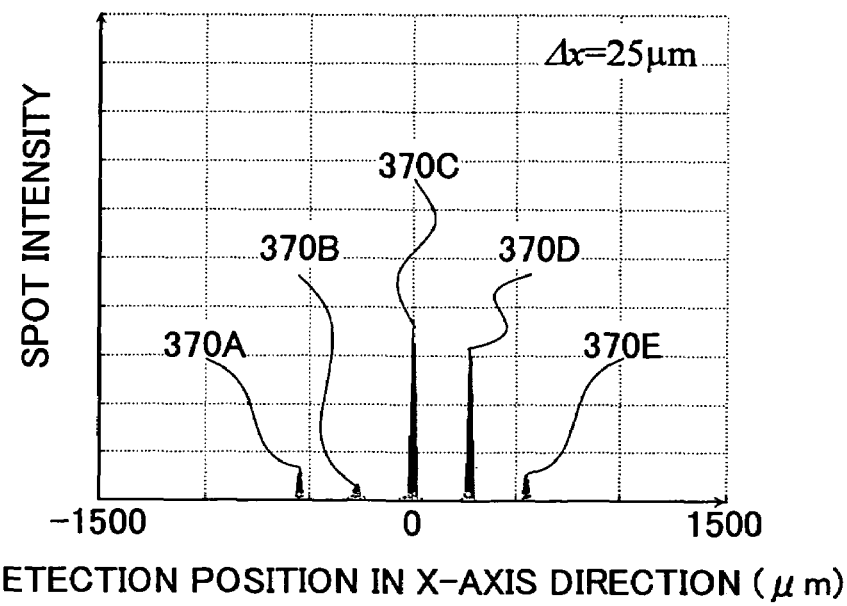
FIG. 14B is a diagram for explaining the spot intensity distribution, viewed from the X1 direction, when the movable body is displaced in the X-direction to the reference grating.
Figure 14C:
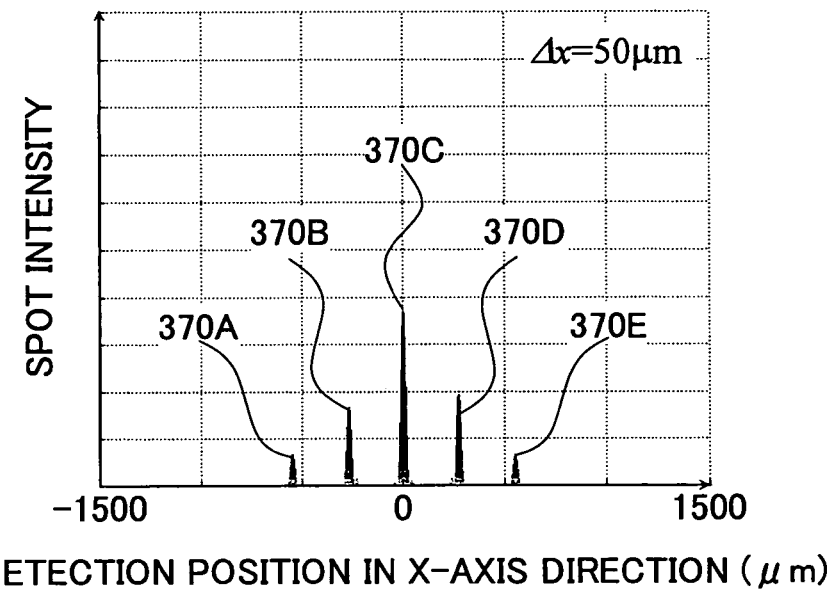
FIG. 14C is a diagram for explaining the spot intensity distribution, viewed from the X1 direction, when the movable body is displaced in the X-direction to the reference grating.
Figure 14D:
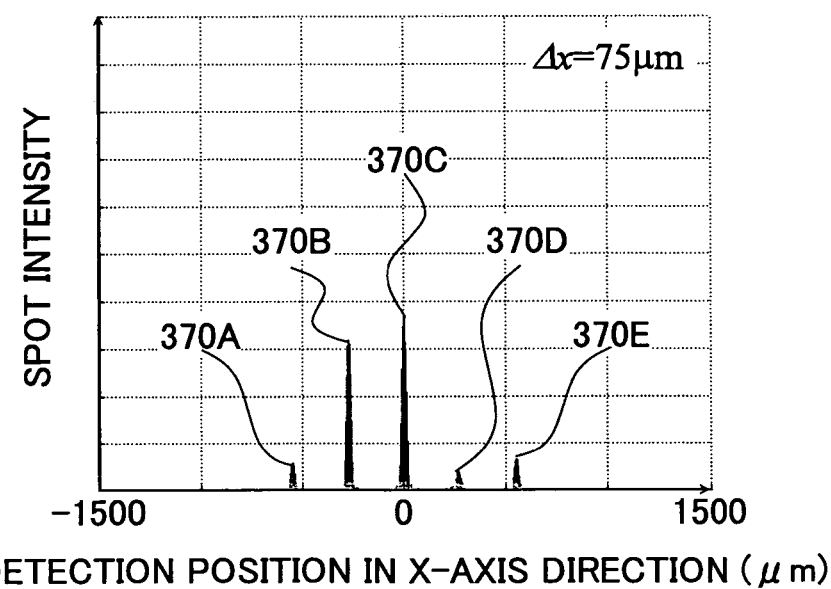
FIG. 14D is a diagram for explaining the spot intensity distribution, viewed from the X1 direction, when the movable body is displaced in the X-direction to the reference grating.
Figure 14E:
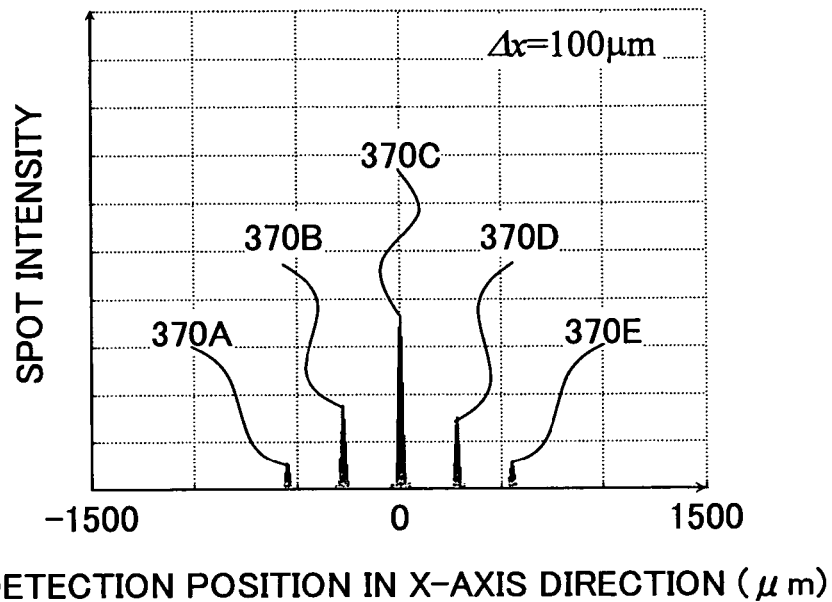
FIG. 14E is a diagram for explaining the spot intensity distribution, viewed from the X1 direction, when the movable body is displaced in the X-direction to the reference grating.
Figure 15A:
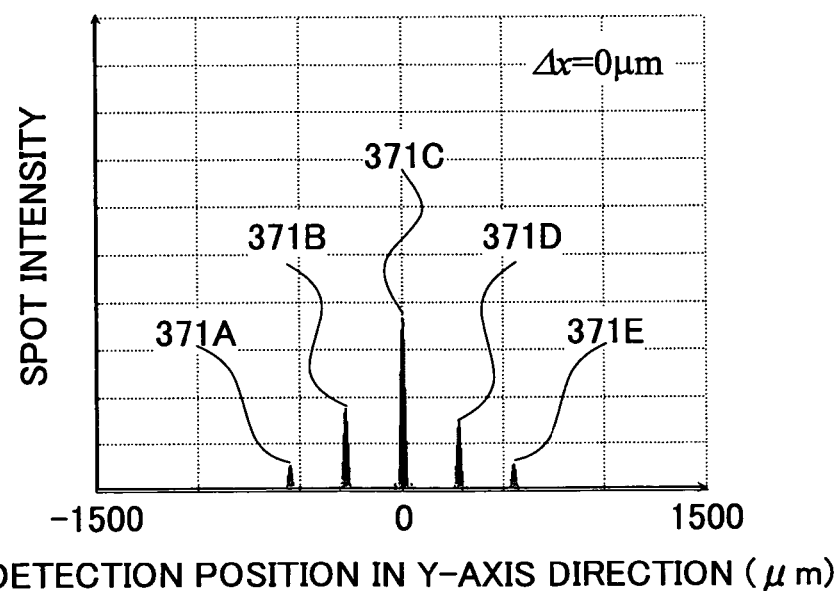
FIG. 15A is a diagram for explaining the spot intensity distribution, viewed from the Y1 direction, when the movable body is displaced in the X-direction to the reference grating.
Figure 15B:
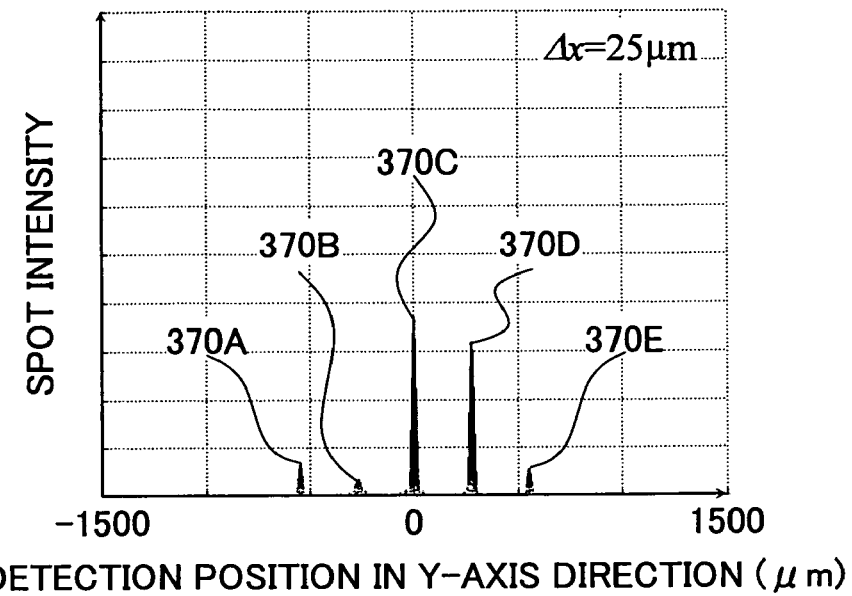
FIG. 15B is a diagram for explaining the spot intensity distribution, viewed from the Y1 direction, when the movable body is displaced in the X-direction to the reference grating.
Figure 15C:
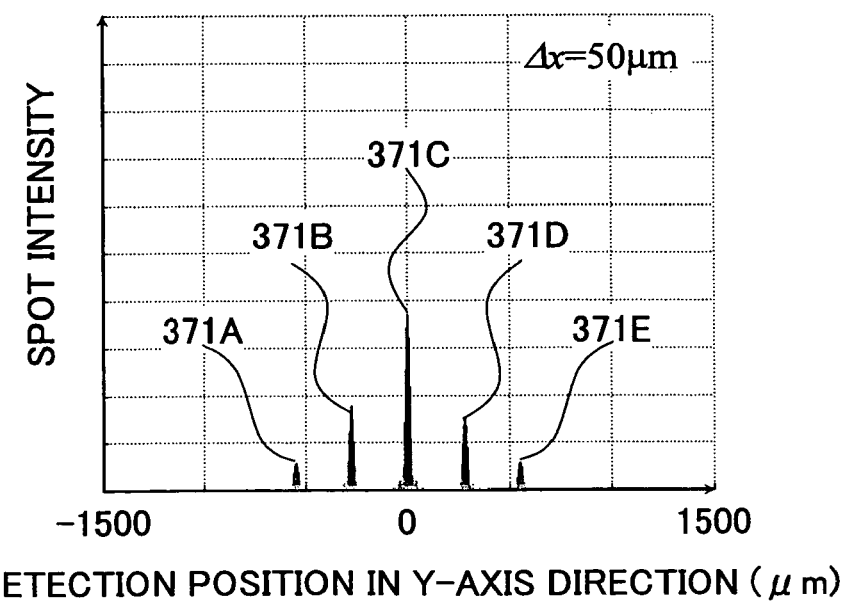
FIG. 15C is a diagram for explaining the spot intensity distribution, viewed from the Y1 direction, when the movable body is displaced in the X-direction to the reference grating.
Figure 15D:
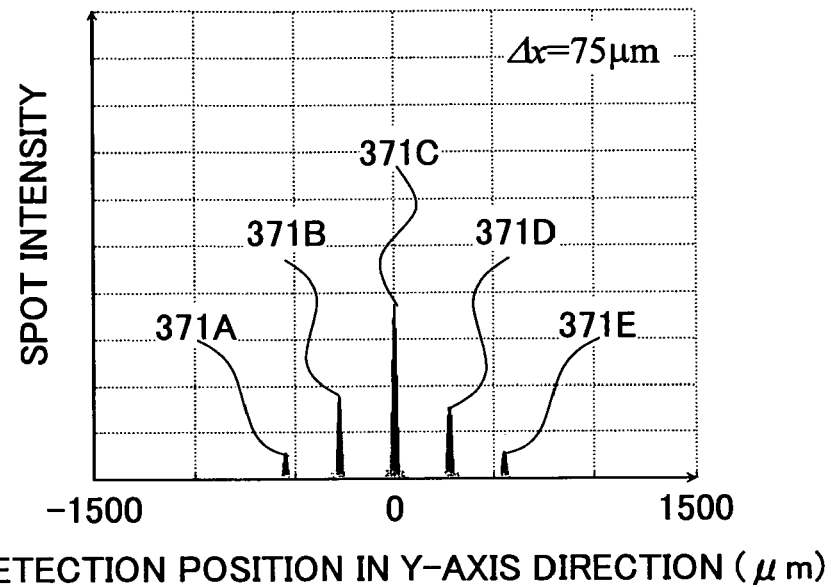
FIG. 15D is a diagram for explaining the spot intensity distribution, viewed from the Y1 direction, when the movable body is displaced in the X-direction to the reference grating.
Figure 15E:
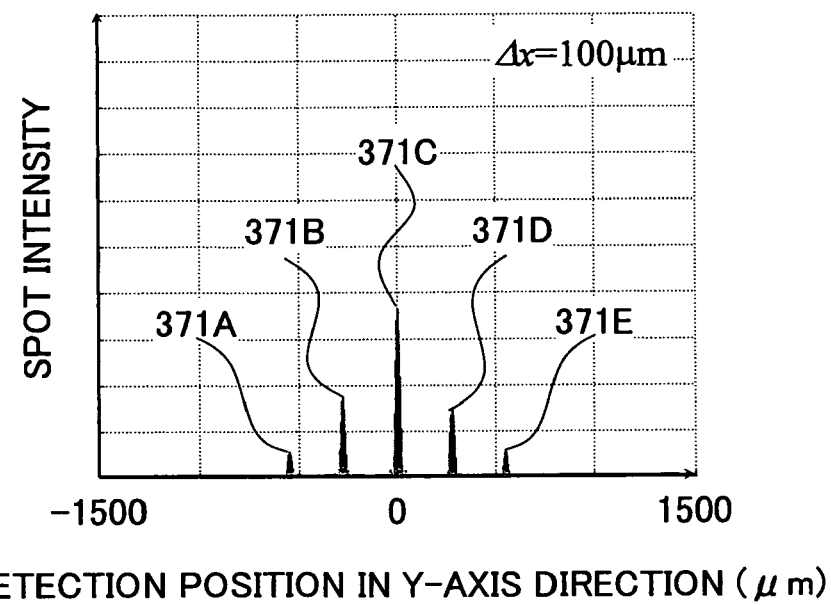
FIG. 15E is a diagram for explaining the spot intensity distribution, viewed from the Y1 direction, when the movable body is displaced in the X-direction to the reference grating.

FIG. 13 shows the result of simulation when simulation of the change of spot intensity distribution I(x, y) is performed. In FIG. 13, X1 direction is the direction perpendicular to the X-axis, Y1 direction is the direction perpendicular to the Y-axis, and Z1 direction is the direction perpendicular to both the X1 and Y1 directions.

Next, a change of the spot intensity distribution when the movable body is displaced in the X direction to the reference grating 140 will be explained with reference to FIGS. 14A through 15E.

FIGS. 14A through 14E are diagrams for explaining the spot intensity distribution, viewed from the X1 direction (refer to FIG. 13), when the movable body (movable stage part 237) is displaced in the X direction to the reference grating. FIGS. 15A through 15E are diagrams for explaining the spot intensity distribution, viewed from the Y1 direction (refer to FIG. 13), when the movable body is displaced in the X direction to the reference grating.

As shown in FIGS. 14A through 14E, when the movable body is displaced in the X direction, each magnitude of spot intensity distributions 370A, 370B, 370D, and 370E on both the sides of the spot intensity distribution 370C located in the center of the spot intensity distributions 370A-370E viewed from the X1 direction changes.

On the other hand, as shown in FIGS. 15A through 15E, the spot intensity distributions 371A-371E viewed from the Y1 direction have no change in each magnitude of five spot intensity distributions 371A-371E, even if the value of Δx (displacement in the X direction) changes.

From the above-mentioned simulation result, it is conceivable that, when the movable body is displaced in the X direction, the detection of the moving distance and position (coordinates) in the X direction of the movable body is possible by monitoring the spot intensity distributions 370A, 370B, 370D, and 370E from the X1 direction.

Specifically, it is turned out that, when the movable body is displaced in the X direction, the moving distance and position (coordinates) in the X direction of the movable body can be detected by monitoring the spot intensity distribution which is the reflected light beams 337D and 337F which are received by the two photodiodes 350A and 350C (refer to FIG. 10) disposed on the light-receiving surface 339A.

Although not illustrated, when the movable body is displaced in the Y direction, the magnitude of two spot intensity distribution (a total of four) in the both sides of spot intensity distribution located in the center of the five spot intensity distribution from the Y1 direction changes from the simulation result.

Therefore, when the movable body is displaced in the Y direction, it is turned out that the moving distance and position (coordinates) in the Y direction of the movable body can be detected by acting as a monitor of the spot intensity of the reflected light beams 337B and 337D with two photodiodes 350B and 350D (refer to FIG. 10) disposed on the light-receiving surface 339A.

Next, change of the spot intensity distribution at the time of a movable body being displaced to the hand of cut which sets a rotating axis as the Z-axis with reference to the simulation result shown in FIGS. 16A through 16E (rotational movement) will be explained.

FIGS. 16A through 16E show the spot intensity distribution at the time of a movable body being displaced to the hand of cut which sets a rotating axis as the Z-axis from Z1 direction (refer to FIG. 13).

Figure 16A:
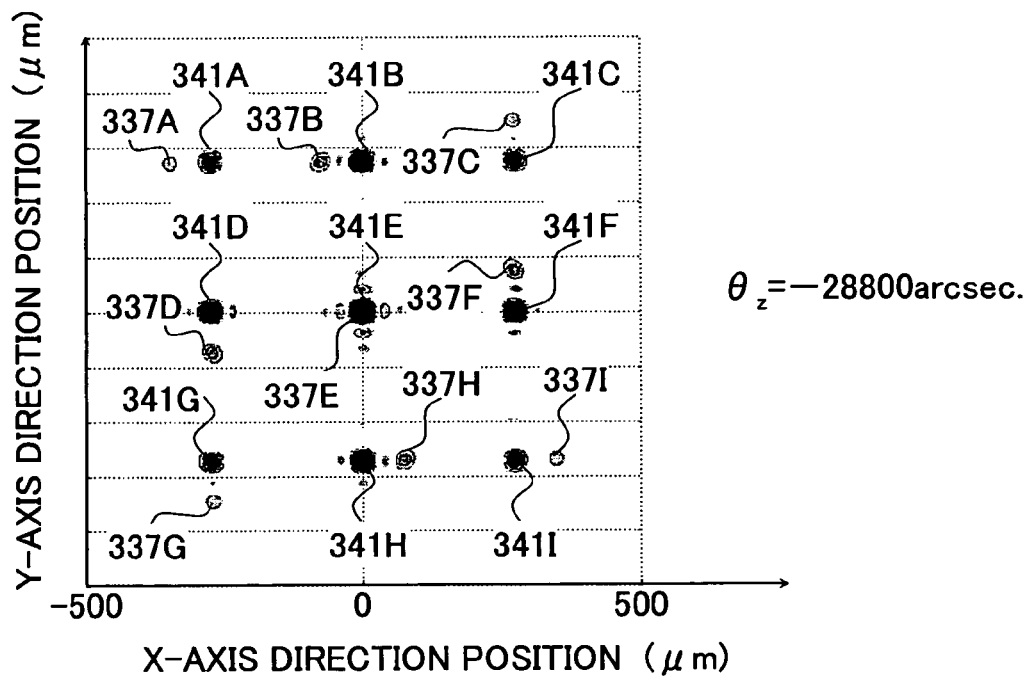
FIG. 16A is a diagram for explaining the spot intensity distribution, viewed from the Z1 direction, when the movable body is rotated around the Z axis as a rotating axis.
Figure 16B:
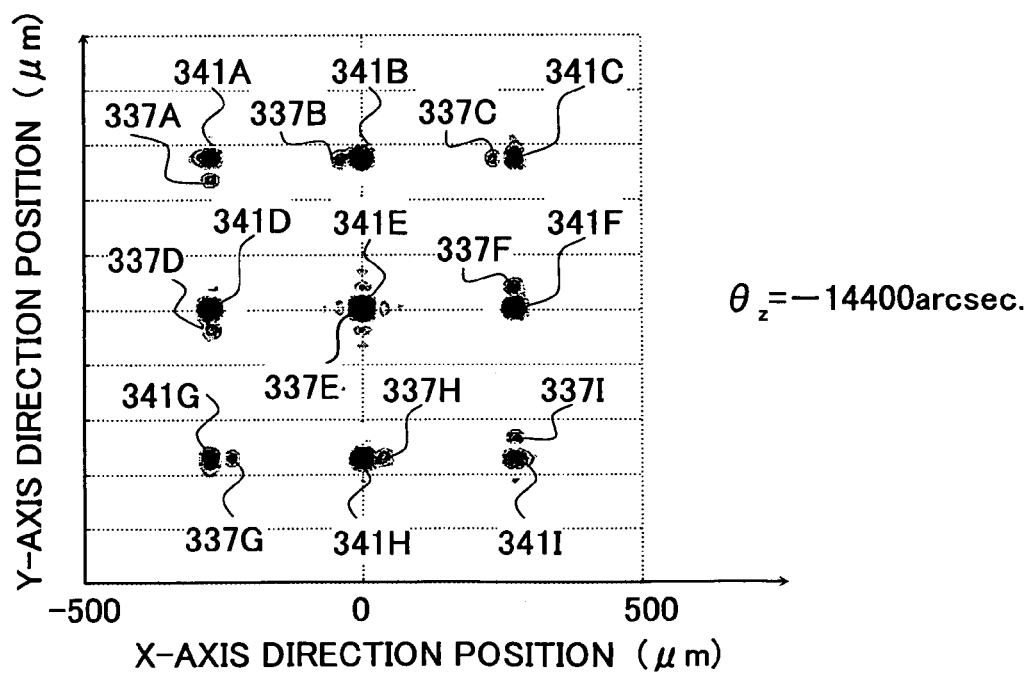
FIG. 16B is a diagram for explaining the spot intensity distribution, viewed from the Z1 direction, when the movable body is rotated around the Z axis as a rotating axis.
Figure 16C:
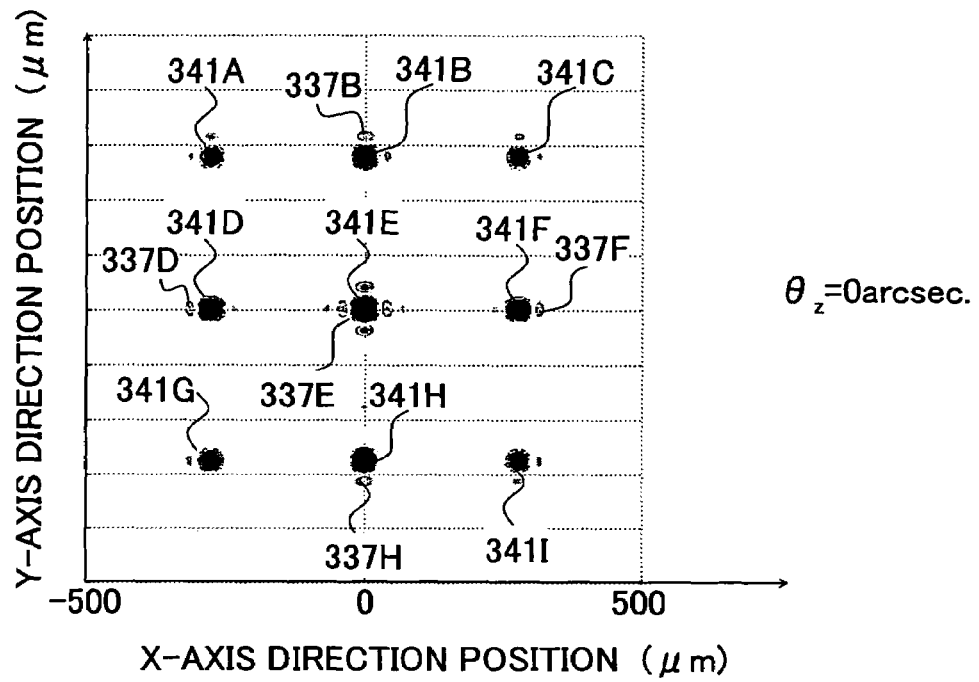
FIG. 16C is a diagram for explaining the spot intensity distribution, viewed from the Z1 direction, when the movable body is rotated around the Z axis as a rotating axis.

In FIGS. 16A through 16E, θz denotes the yawing angle (angle which sets a rotating axis as the Z-axis). As shown in FIG. 16C, in θz=0 arcsec, the position of the reflected light beams 337A, 337C, 337G, and 337I reflected in four corners centers on the position of the central reflected light beam 337E, in the clockwise rotation and the counter-clockwise rotation, it is rotating to neither.

As shown in FIG. 16A and FIG. 16B, when the movable body carries out rotational movement in the minus direction (counter clockwise) by setting a rotating axis as the Z-axis, as for the position of the reflected light beams 337A, 337C, 337G, and 337I reflected in four corners, it turns out that the central peak 337E is rotated counter clockwise.

Figure 16D:
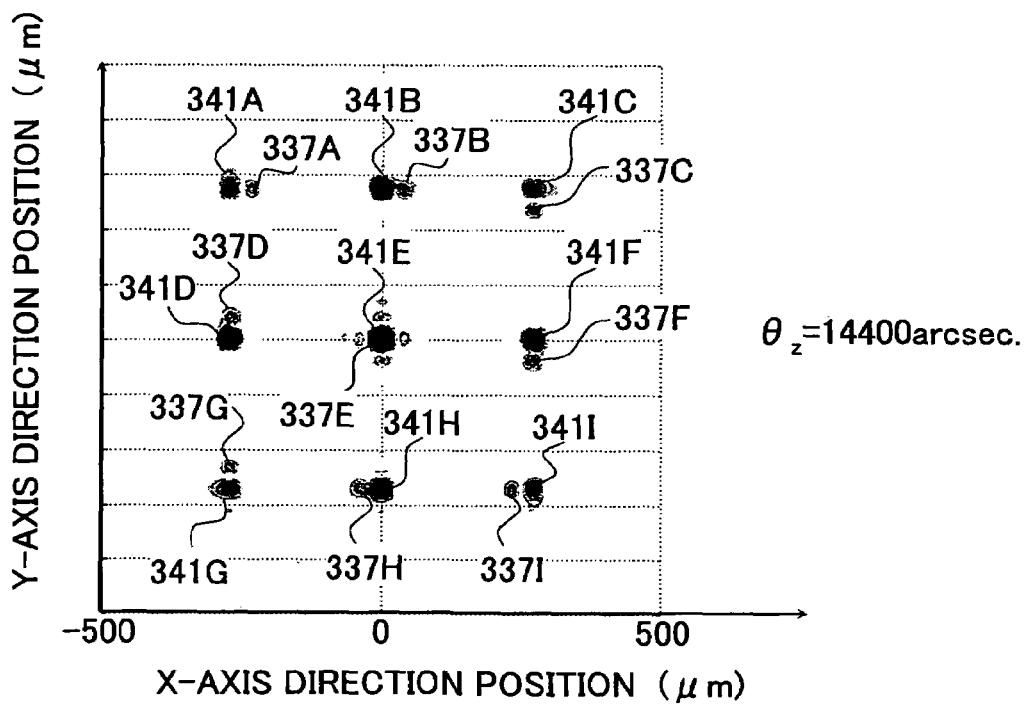
FIG. 16D is a diagram for explaining the spot intensity distribution, viewed from the Z1 direction, when the movable body is rotated around the Z axis as a rotating axis.
Figure 16E:
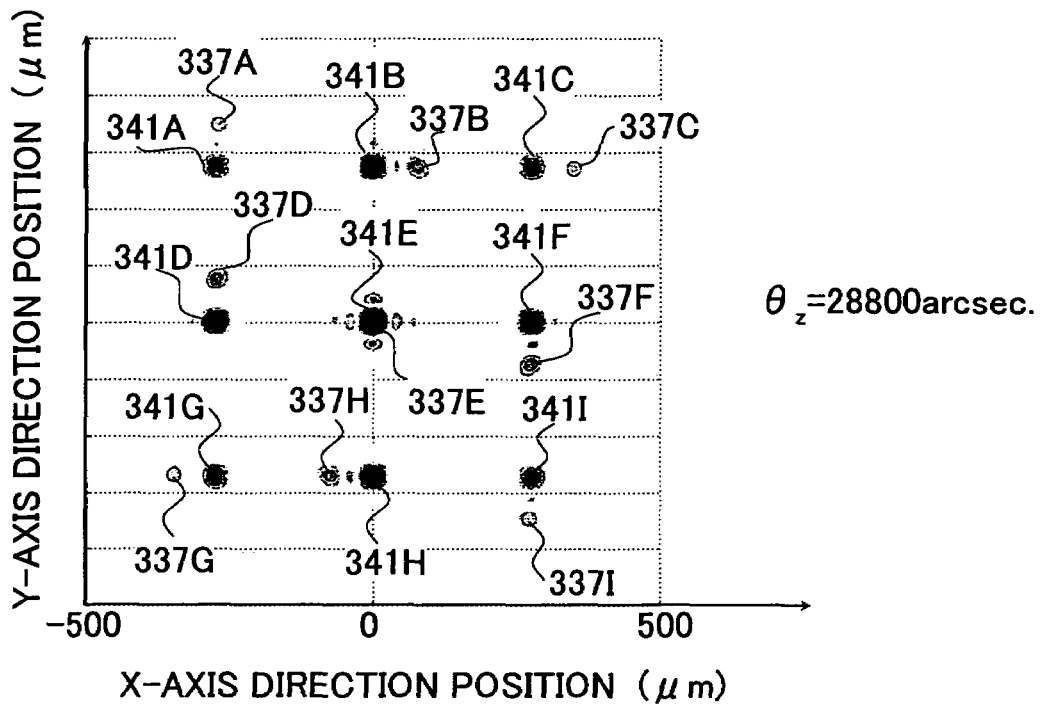
FIG. 16E is a diagram for explaining the spot intensity distribution, viewed from the Z1 direction, when the movable body is rotated around the Z axis as a rotating axis.

As shown in FIG. 16D and FIG. 16E, when the movable body carries out rotational movement to a plus direction (clockwise rotation) by setting a rotating axis as the Z-axis, it is tuned out that the position of the reflected light beams 337A, 337C, 337G, and 337I reflected in four corners rotates clockwise centering on the position of the central reflected light beam 337E.

With photodiodes 351-354 (refer to FIG. 10) disposed at the four corners of the light-receiving surface 339A since each positions of the reflected light beams 337A, 337C, 337G, and 337I shown in FIGS. 16A through 16E differed, the hand of cut which sets a rotating axis as the Z-axis understands that detection of the position of the movable body at the time of a movable body being displaced, movement magnitude, the degree of rotation angle, etc. is possible by acting as a monitor of the position of the reflected light beams 337A, 337C, 337G, and 337I from Z1 direction.

Next, change of the spot intensity distribution at the time of a movable body being displaced to the hand of cut which sets a rotating axis as the Y-axis with reference to the simulation results shown in FIGS. 17A through 20C (rotational movement) will be explained.

Figure 17A:
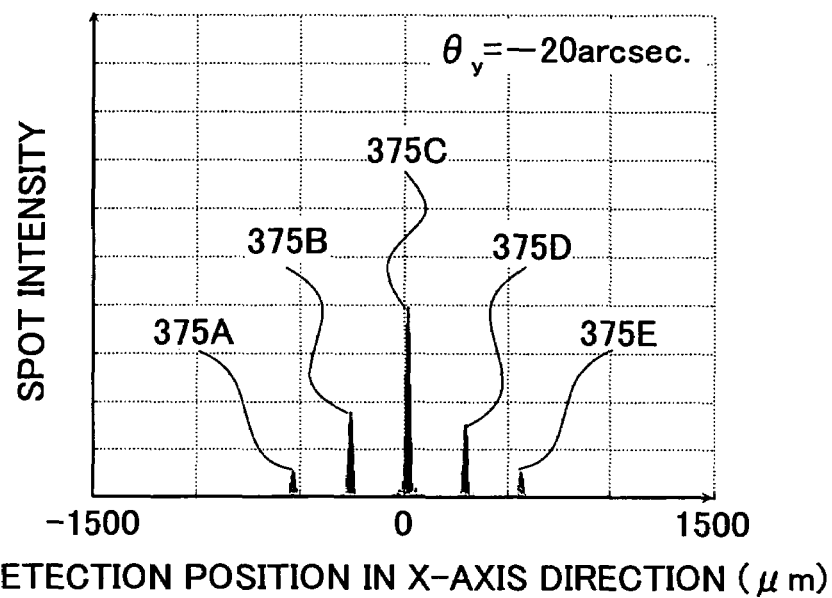
FIG. 17A is a diagram for explaining the spot intensity distribution, viewed from the X1 direction, when the movable body is rotated around the Y axis as a rotating axis.
Figure 17B:
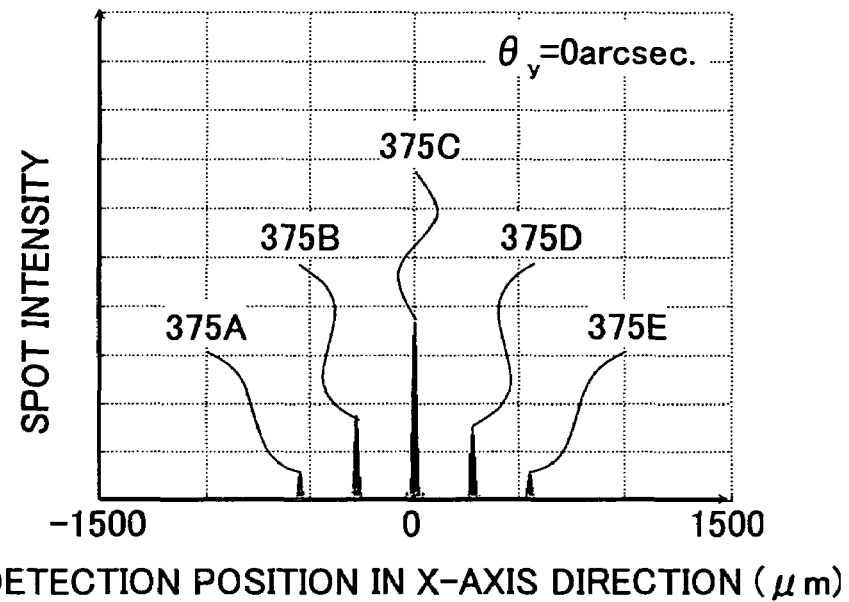
FIG. 17B is a diagram for explaining the spot intensity distribution, viewed from the X1 direction, when the movable body is rotated around the Y axis as a rotating axis.
Figure 17C:
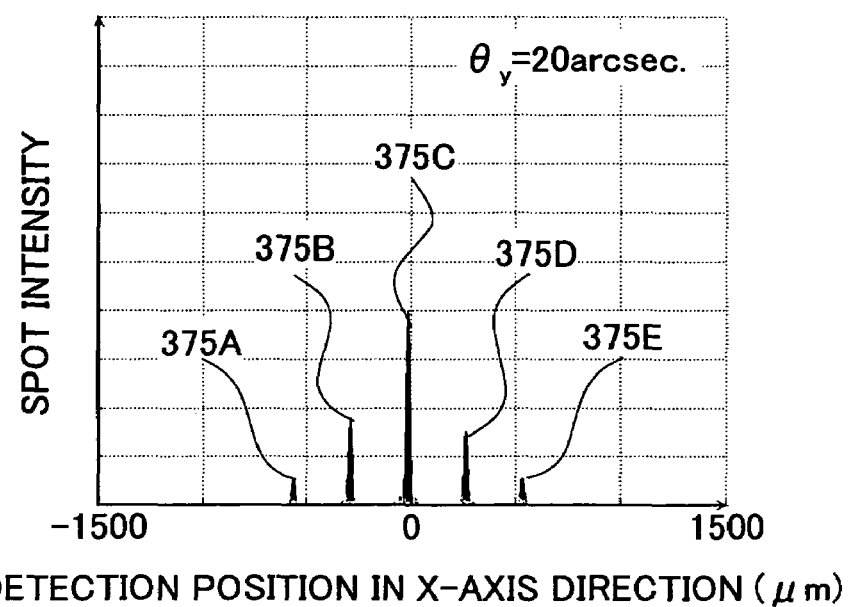
FIG. 17C is a diagram for explaining the spot intensity distribution, viewed from the X1 direction, when the movable body is rotated around the Y axis as a rotating axis.

FIGS. 17A through 17C show the spot intensity distribution at the time of a movable body being displaced to the hand of cut which sets a rotating axis as the Y-axis from X1 direction (refer to FIG. 13).

Figure 18A:
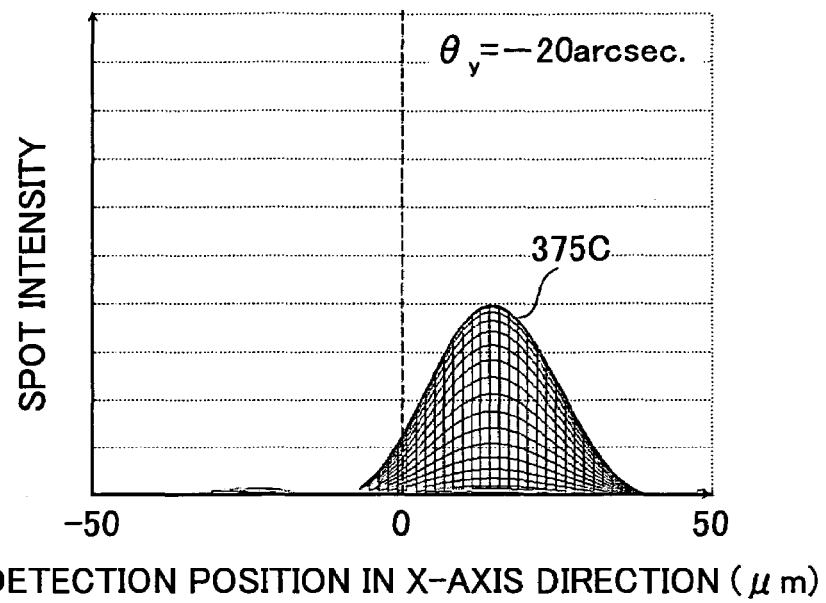
FIG. 18A is an enlarged diagram showing the intensity distribution of the spot located in the center of the intensity distribution of FIG. 17A.
Figure 18B:
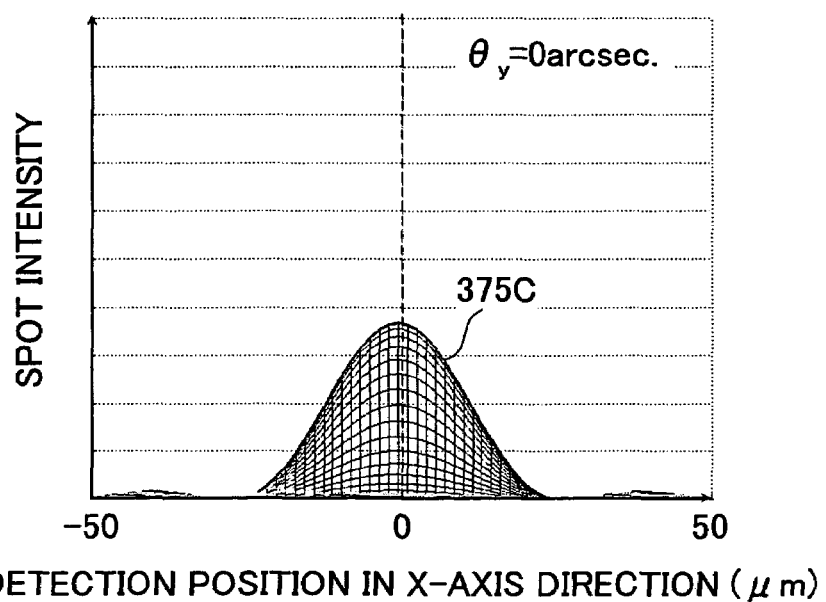
FIG. 18B is an enlarged diagram showing the intensity distribution of the spot located in the center of the intensity distribution of FIG. 17B.
Figure 18C:
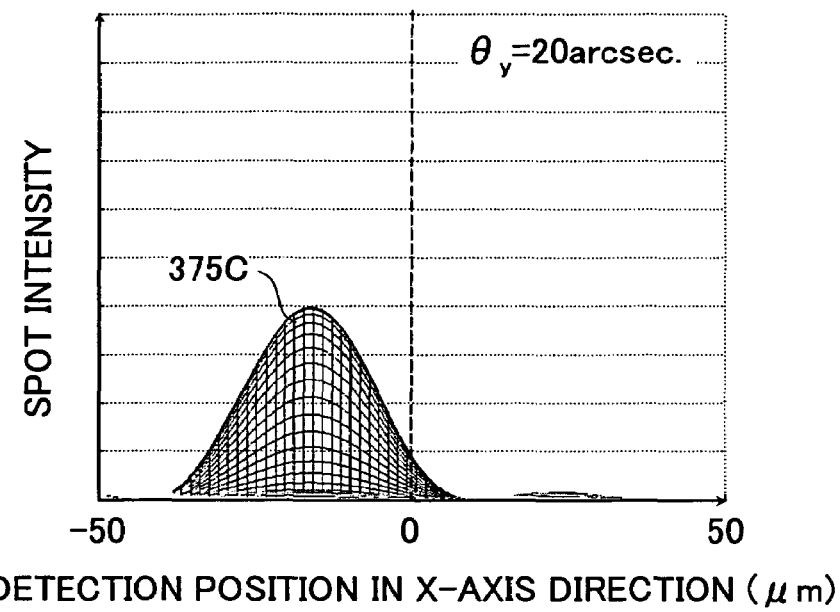
FIG. 18C is an enlarged diagram showing the intensity distribution of the spot located in the center of the intensity distribution of FIG. 17C.
Figure 19A:
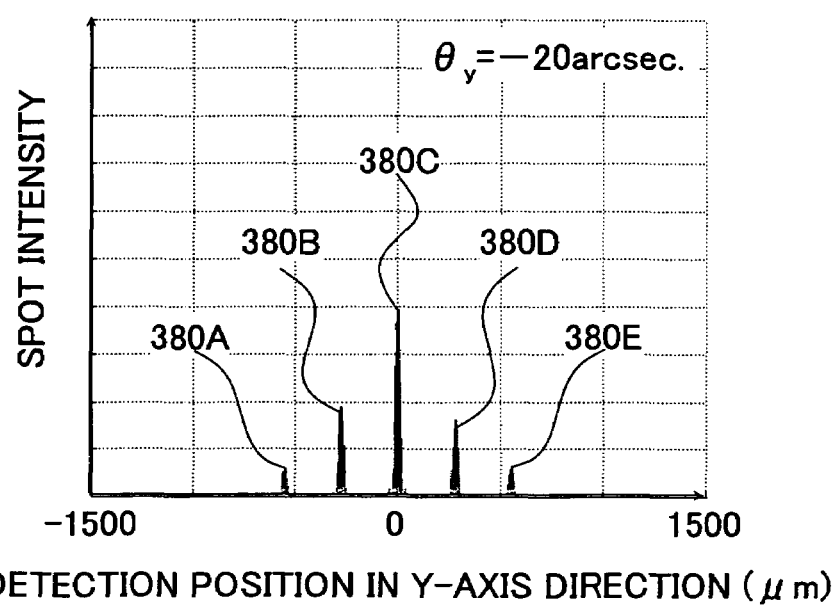
FIG. 19A is a diagram for explaining the spot intensity distribution, viewed from the Y1 direction, when the movable body is rotated around the Y axis as a rotating axis.
Figure 19B:
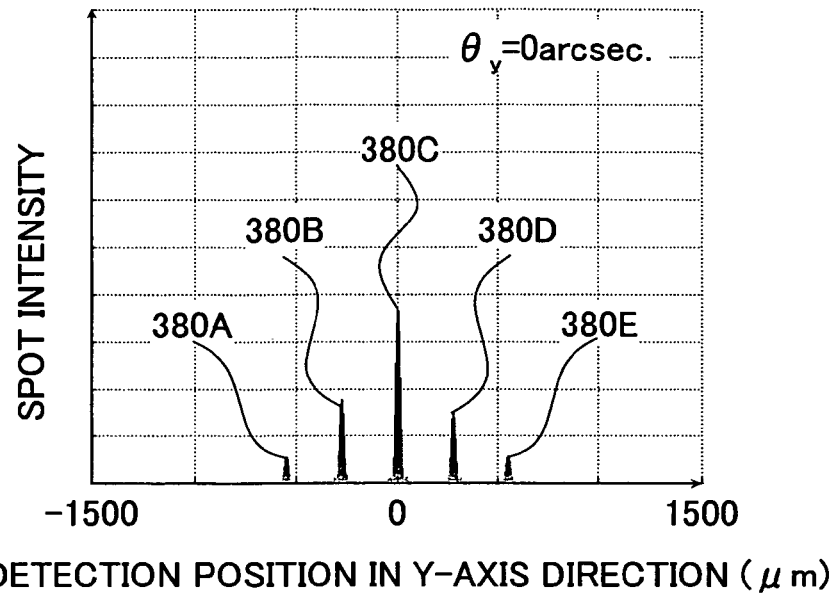
FIG. 19B is a diagram for explaining the spot intensity distribution, viewed from the Y1 direction, when the movable body is rotated around the Y axis as a rotating axis.
Figure 19C:
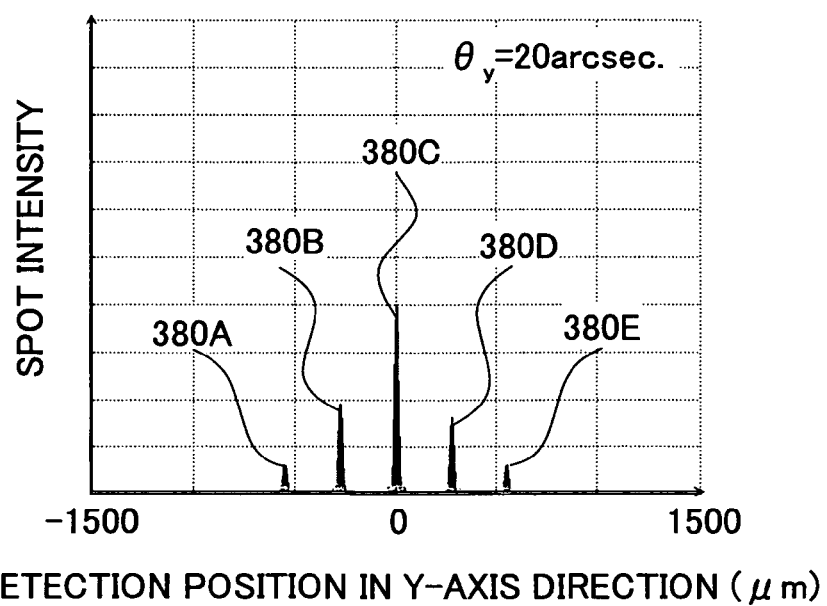
FIG. 19C is a diagram for explaining the spot intensity distribution, viewed from the Y1 direction, when the movable body is rotated around the Y axis as a rotating axis.
Figure 20A:
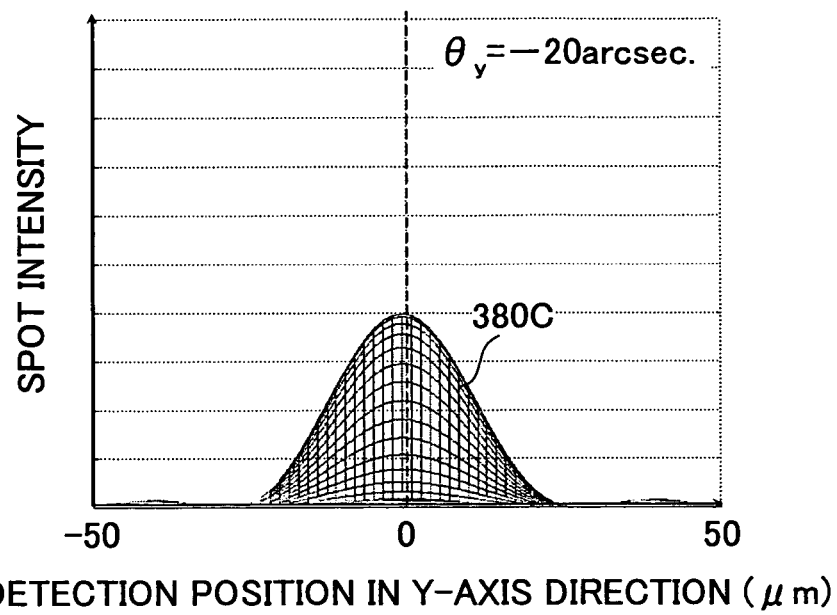
FIG. 20A is an enlarged diagram showing the intensity distribution of the spot located in the center of the intensity distribution of FIG. 19A.
Figure 20B:
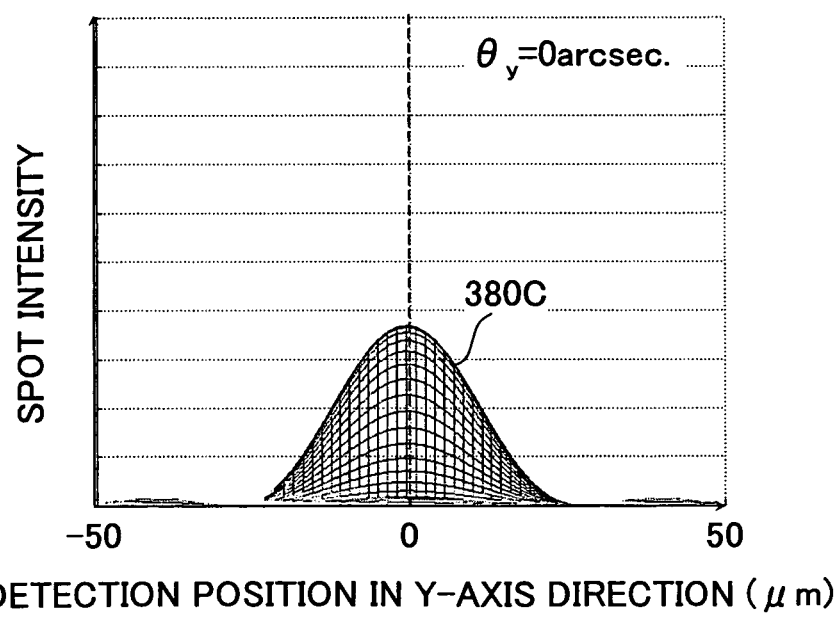
FIG. 20B is an enlarged diagram showing the intensity distribution of the spot located in the center of the intensity distribution of FIG. 19B.
Figure 20C:
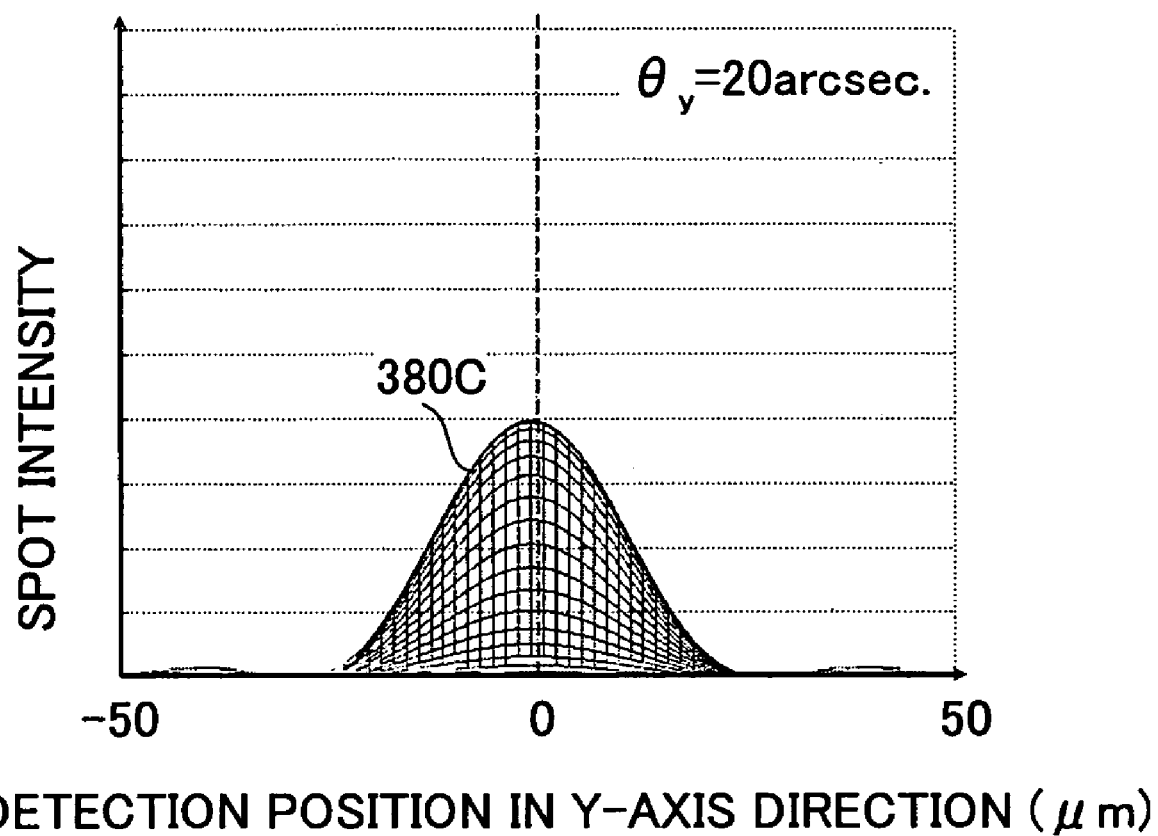
FIG. 20C is an enlarged diagram showing the intensity distribution of the spot located in the center of the intensity distribution of FIG. 19C.

FIGS. 18A through 18C show the spot intensity distribution located in the center of FIGS. 17A through 17C. FIGS. 19A through 19C are diagrams showing the spot intensity distribution at the time of a movable body being displaced to the hand of cut which sets a rotating axis as the Y-axis from Y1 direction (refer to FIG. 13). FIGS. 20A through 20C are diagrams showing expanded the spot intensity distribution located in the center of FIGS. 19A through 19C. In FIGS. 17A through 20C, θy denotes the pitching angle (angle which sets-a rotating axis as the Y-axis).

As shown in FIGS. 18A through 18C, when the movable body is displaced to a plus direction (clockwise rotation) by setting a rotating axis as the Y-axis (rotational movement), it is moved to the position of X direction of spot intensity distribution 375C seen from one direction to the left-hand side of FIG. 18A. When the movable body is displaced in the minus direction (counter clockwise) by setting a rotating axis as the Y-axis (rotation angle), it is moved to the position of X direction of spot intensity distribution 375C seen from X1 direction to the right-hand side of FIG. 18C. On the other hand, as shown in FIGS. 20A through 20C, when the movable body is displaced by setting a rotating axis as the Y-axis (rotation angle of a plus direction and the minus direction), the position of the Y direction of spot intensity distributions 380A, 380B, 380C, 380D, and 380E viewed from the Y1 direction are not changing at all.

When the spot distribution intensity distribution 375C moves to X direction, the spot distribution intensity distribution 375A, 375B, 375C, and 375D also moves integrally. When the movable body is displaced from this to the hand of cut which sets a rotating axis as the Y-axis, with four photodiodes 350E-350H (refer to FIG. 10) disposed in the center of the light-receiving surface 339A the position (position of the reflected light beam 337E) of X direction of spot intensity distribution 375C seen from X1 direction acting as a monitor. It is turned out that the degree of rotation angle around the Y-axis of a movable body can be detected.

Also when the movable body is displaced from the simulation result which is not illustrated to the hand of cut which sets a rotating axis as the X-axis, by acting as a monitor of the position of the Y direction of the reflected light 337E (spot intensity distribution 375C) received by the four photodiodes 350E-350H disposed in the center of the light-receiving surface 339A, it is turned out that the detection of degree of the rotation angle θx (rolling angle) around the X-axis of a movable body is possible.

Next, with reference to FIGS. 21 through 23, the method of detecting the state of a movable body will be explained based on the above-mentioned simulation result.

Figure 21:
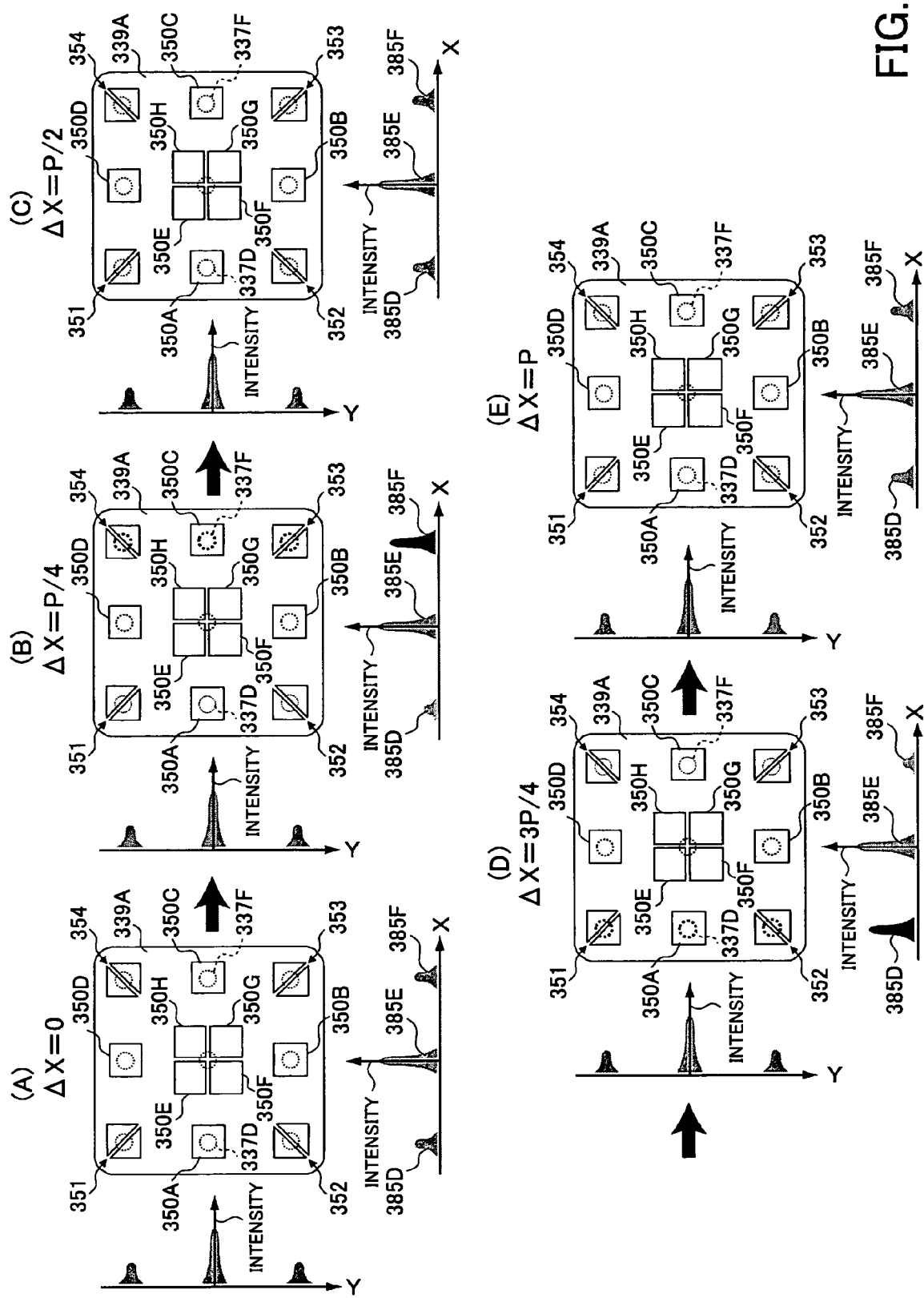
FIG. 21 is a diagram for explaining the method of detection when the movable body is displaced in the X direction to a reference grating.

FIG. 21 is a diagram for explaining the detecting method when the movable body is displaced in the X direction to the reference grating.

In FIG. 21, the spot intensity distribution 385D shows the spot intensity distribution corresponding to the reflected light 337D, and the spot intensity distribution 385F shows the spot intensity distribution corresponding to the reflected light 337F.

If the movable body is moved in the X direction to the reference grating 140 as shown in FIG. 21, the magnitude of the spot intensity distribution 385D and 385F given by the reflected light beams 337D and 337F received by the photodiodes 350A and 350C will change.

If the outputs of the photodiode 350C are set to I350A and I350C, the amount of displacement delta X of the X direction of the movable body to the reference grating 140 can be determined from the outputs of the photodiode 350A based on the formula: $SX=(I350C-I350A)/(I350C+I350A)$.

When the movable body is moved in the Y direction to the reference grating 140 and the outputs of the photodiode 350D are set to I350B and I350D, the amount of displacement deltaY of the Y direction of the movable body to the reference grating 140 can be determined from the outputs of the photodiode 350B based on the formula: $SY=(I350D-I350B)/(I350D+I350B)$.

Figure 22:
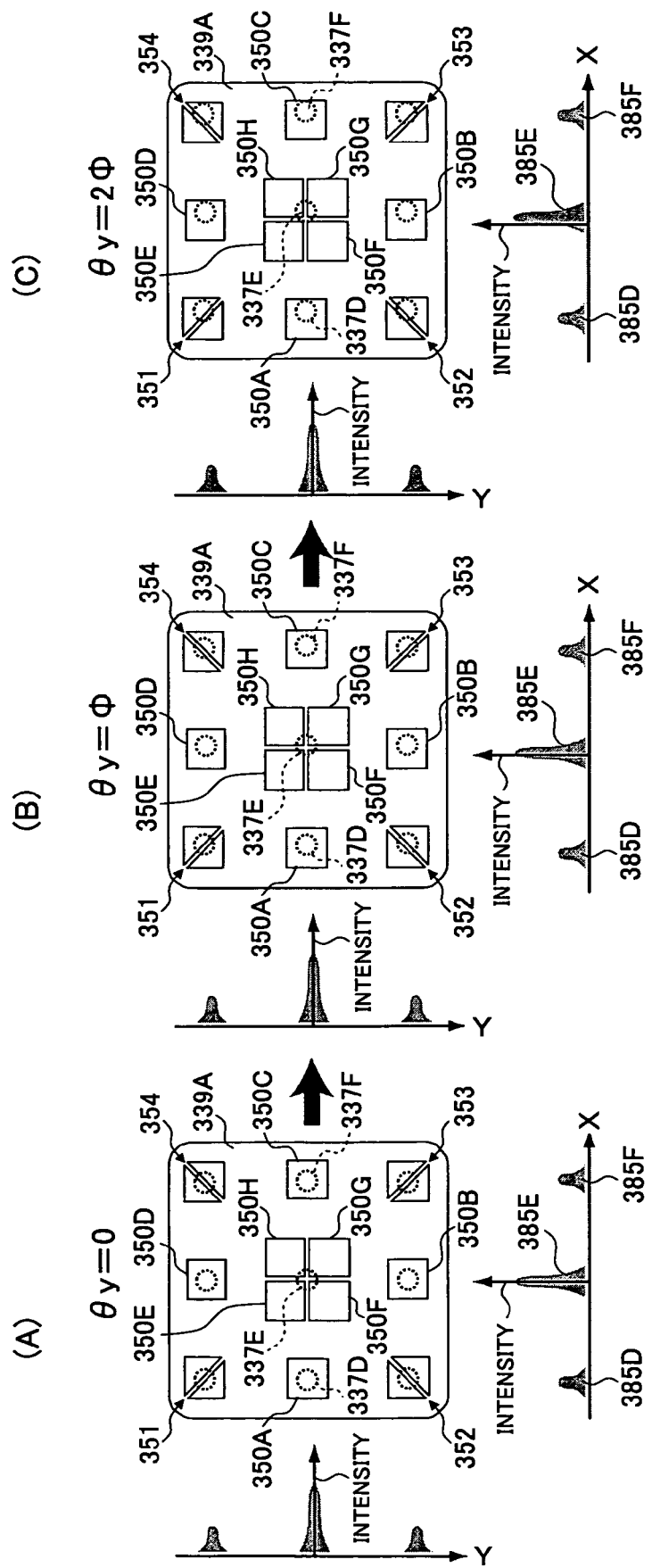
FIG. 22 is a diagram for explaining the method of detection when the movable body is rotated around the Y-axis to a reference grating.

FIG. 22 is a diagram for explaining the detecting method at the time of a movable body rotating the Y-axis as a rotating axis to a reference grating.

In FIG. 22, the spot intensity distribution 385E shows the spot intensity distribution corresponding to the reflected light 337E. If the movable body is rotated around the Y-axis as a rotating axis to the reference grating 140 as shown in FIG. 22, the position of spot intensity distribution 385D-385E corresponding to the reflected light beams 337D-337F will move in the X direction. The movement magnitude in this case follows the auto-collimation method. This movement magnitude is detectable with the four photodiodes 350E-350H disposed in the center of the light-receiving surface 339A.

If the output of photodiode 350E, the output of photodiode 350F, the output of photodiode 350G, and the output of photodiode 350H are set to I350E, I350F, I350G, and I350H, the movement magnitude of the X direction can be calculated from the formula: $S?Y=(I350G+I350H-I350E-I350F)/(I350E+I350F+I350G+I350H)$, and θy (pitching angle) can be calculated from the movement magnitude of the X direction determined.

Similarly, the movement magnitude of the Y direction can be determined from the formula: $S?X=(I350F+I350G-I350E-I350H)/(I350E+I350F+I350G+I350H)$, and θx (rolling angle) can be calculated from the movement magnitude of the Y direction determined.

Figure 23:
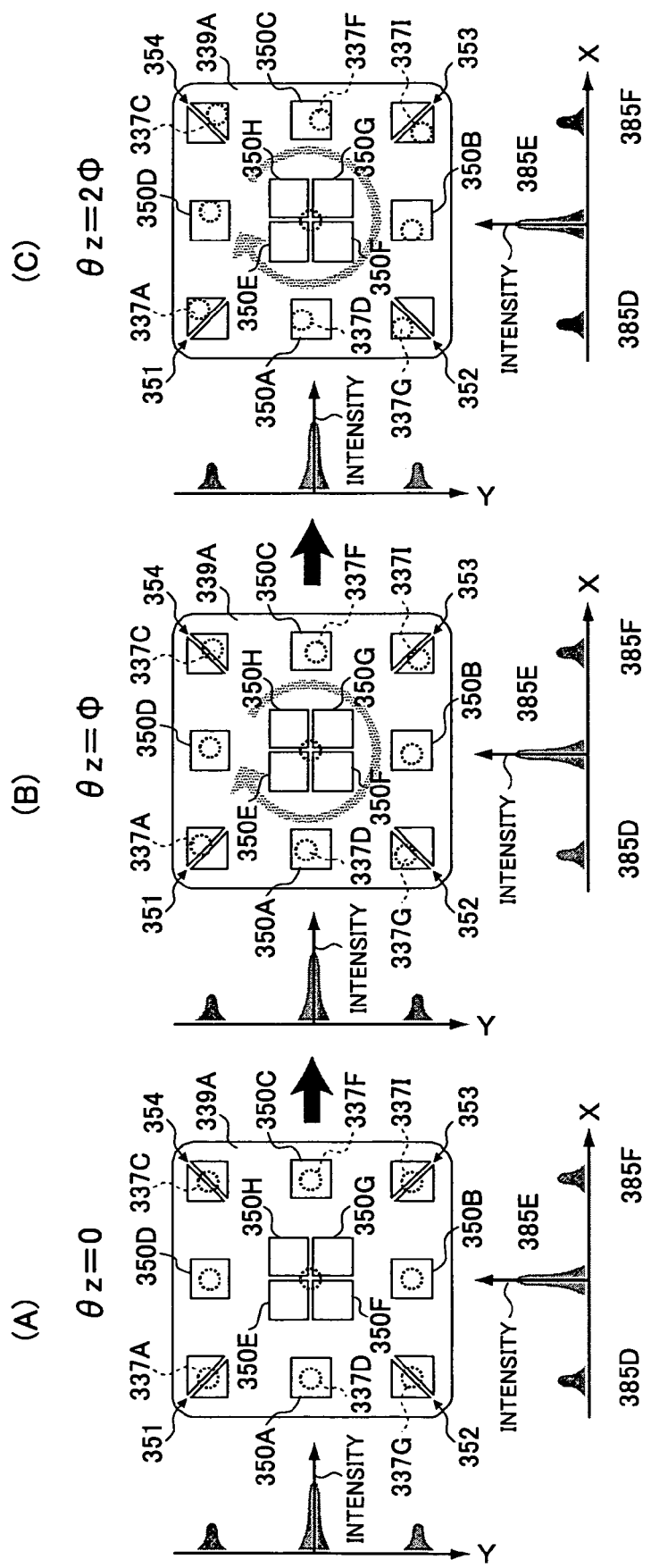
FIG. 23 is a diagram for explaining the method of detection when the movable body is rotated around the Z-axis to a reference grating.

FIG. 23 is a diagram for explaining the detecting method at the time of a movable body rotating the Z-axis as a rotating axis to a reference grating.

If the movable body is rotated around the Z-axis as a rotating axis to the reference grating 140, as shown in FIGS. 16A through 16E, the positions of four reflected light beams 337A, 337C, 337G, and 337I are rotated around the position of the central reflected light beam 337E.

If the output of photodiode 351I is set to I351I, the output of photodiode 351J is set to I351J, the output of photodiode 351K is set to I351K, the output of photodiode 351L is set to I351L, the output of photodiode 351M is set to I351M, the output of photodiode 351N is set to I351N, the output of photodiode 351O is set to I351O, and the output of photodiode 351P is set to I351P, then the rotation can be determined based on the formula: $S?Z=\{(I351J+I351L+I351N+I351P)-(I351I+I351k+I351M+I351O)\}/(I351I+I351J+I351k+I351L+I351M+I351N+I351O+I351P)$, and the θz (yawing angle) can be calculated from the value of the rotation determined.

The light emitted by the light source part 330 is converted into the plurality of light beams 333 by the spectrum plate 332, the reference grating is irradiated by the light beams 333, and the state of five degrees of freedom of the movable body can be detected by the plurality of reflected light beams 337 which are collectively received by the multiple-element type photodiode 350.

In order to detect the state of a movable body based on change of the plurality of reflected light beams 337, even when one of the reference gratings 140 the plurality of light beams 337 are irradiated has a defect, the state can be detected based on a change of the plurality of reflected light beams 337 reflected from the reference grating 140 without a defect.

For this reason, the reference grating is irradiated and the state can be detected with sufficient accuracy as compared with the case where the state is detected based on the reflected light.

In the detector unit 114 of this embodiment, since detection using the auto-collimation method like the conventional technology is omitted, the structure of photodetector 339 can be simplified and abatement of the cost of detector unit 114 can be aimed at.

Although the photodetector 339 having photodiodes 351-354 and photodiodes 350A-350D has been used in this embodiment, CCD (charge-coupled devices) may be used instead of photodiodes 351-354 and photodiodes 350A-350D. When CCD are used instead, the same effectiveness as in this embodiment can also be acquired.

Figure 24:
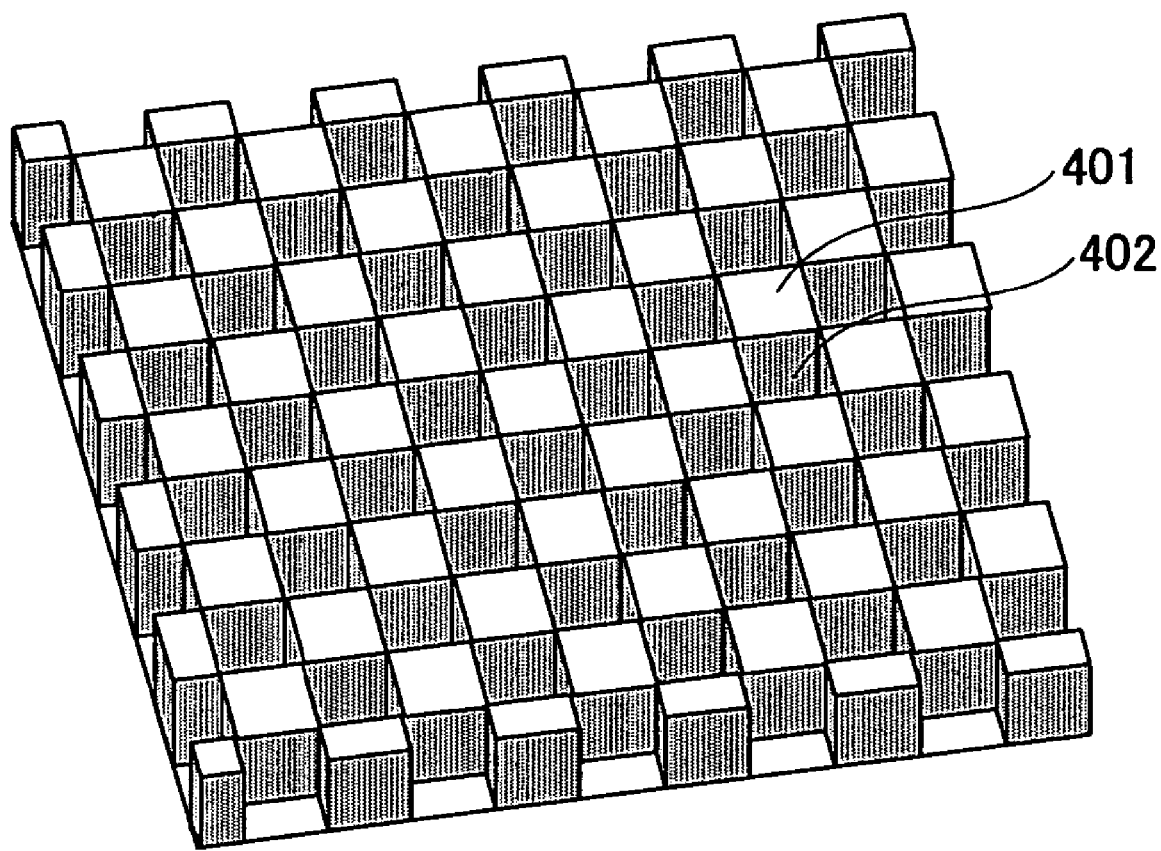
FIG. 24 is a perspective view showing an example of modification of the reference grating in an embodiment of the invention.

Next, an example of modification of the reference grating of this embodiment will be explained with reference to FIG. 24. FIG. 24 is a perspective view showing the modification of the reference grating of this embodiment.

As shown in FIG. 24, the reference grating 400 is provided in a generally square columnar part 401 and female 402 in the same square configuration as columnar part 401 periodically to in two axial directions within the surface is formed. As a reference grating of this embodiment, reference grating 400 in the shape of a generally square as shown in FIG. 24 may be used. The PV value of reference grating 400 is 0.08 micrometer.

Figure 25:
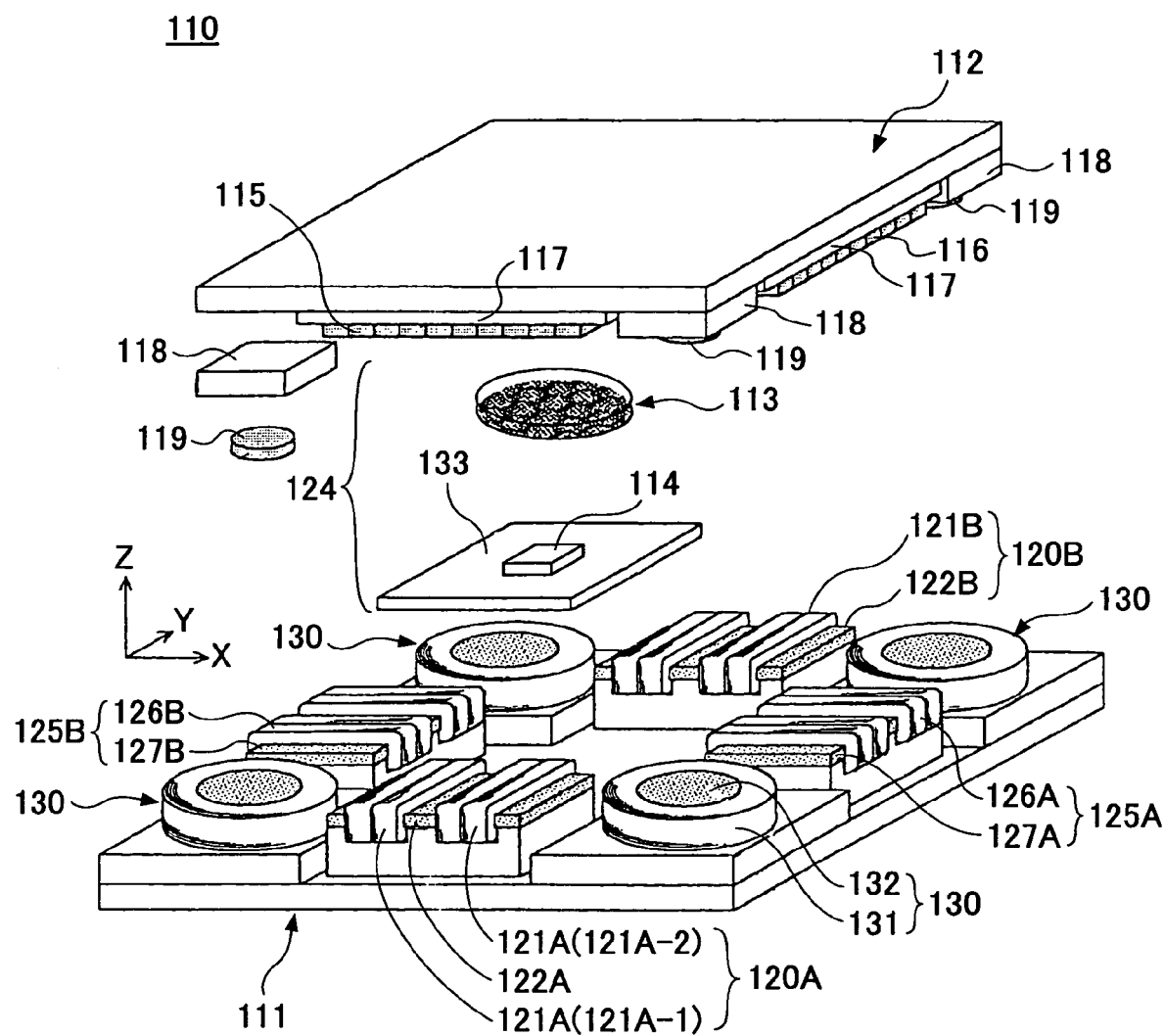
FIG. 25 is an exploded perspective view showing the composition of a stage device in an embodiment of the invention.
Figure 26:
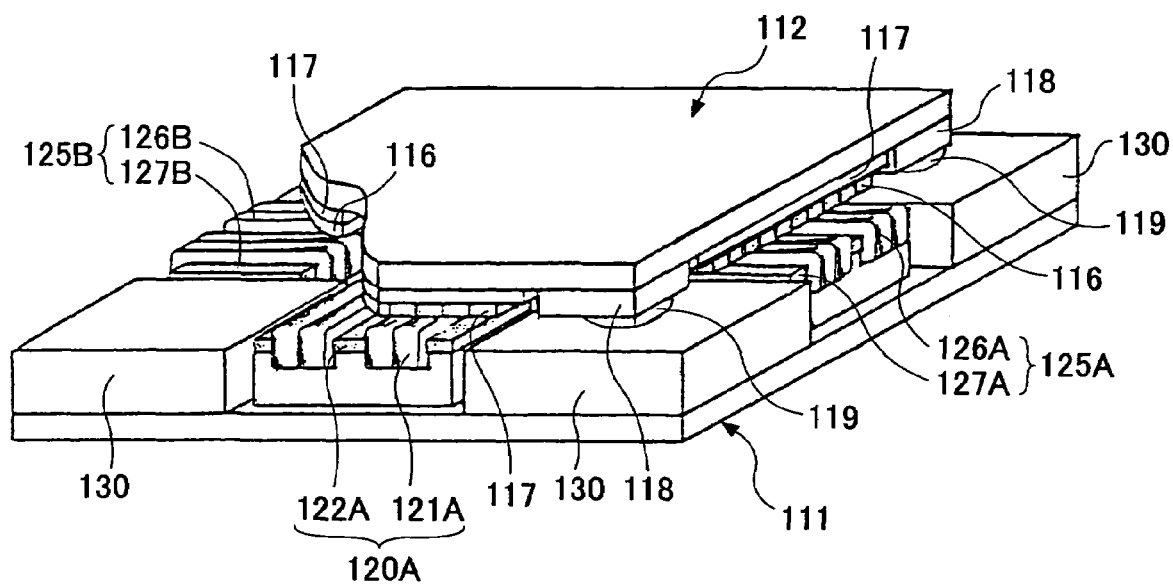
FIG. 26 is a partially cut-away, perspective view of the stage device in the assembled condition.

Next, with reference to FIGS. 25 and 26, stage device 110 in an embodiment of the invention will be explained. FIG. 25 is an exploded perspective view showing the stage device in an embodiment of the invention, and FIG. 26 is a perspective view showing the stage device in the condition of having cut selectively, and having been lacked and assembled.

This stage device 110 is an apparatus used for moving the wafer which serves as a movable body, for example in the stepper for semi-conductor manufacture etc. to a predetermined position.

This stage device 110 is constituted by the base 111, the stage 112, the sensor device 124, the drive unit, etc. The base 111 serves as the supporting base of the stage device 110, and the linear motor structure parts 120A and 125A and the Z-direction electromagnet 130 which are mentioned later, and the detector unit 114 are disposed on the base 111.

The structure of the detector unit 114 of this embodiment is the same as that of the detector unit 114 shown in FIG. 3. The wafer and the chuck from which stage 112 serves as a movable body are disposed in the upper part, and the magnet 119 for the direction of Z is disposed by the lower part via the magnets 115,116, the yoke 117, and the spacer 118.

This stage 112 is considered as the structure in which the illustrated X axial movement, Y axial movement, and the rotational movement centering on the Z-axis are possible to base 111.

As shown in FIG. 25, the scale part 113 is fixed to the central part of the back surface (the surface which faces the base 111) of the stage 112. On the other hand, the detector unit 114 is disposed on the base 111. Specifically, the detector unit 114 is disposed on the mounting substrate 133 on the base 111.

Next, the drive unit will be explained. The drive unit is provided for the stage 112 to perform the X axial movement, the Y axial movement, and the rotational movement around the Z-axis to the base 111. The direction linear motor structure parts 120A and 120B of X by which this drive unit was disposed in base 111, the direction linear motor structure parts 125A and 125B of Y, and the direction electromagnet 130 of Z, it is constituted by magnet 115 for the direction of X disposed in stage 112, magnet 116 for the Y-direction, and the magnet 119 grade for the direction of Z.

The X-direction linear motor structure part 120A is disposed on the base 111, and is constituted by a pair of coils 121A-1, 121A-2 for the direction of X (which may collectively be called X-direction coils 121A) and a pair of cores 122A for the direction of X.

The pair of coils 121A-1,121A-2 for the direction of X is installed by the illustrated X direction side by side, and it is considered as the structure which can supply the current independently, respectively.

The X-direction linear motor structure part 120B is considered as the same structure as the X-direction linear motor structure part 120A, and is constituted by a pair of coil 121B for the direction of X and core 122B for the direction of X. The X direction linear motor structure part 120A and the X direction linear motor structure part 120B are disposed to face across the arranging position of the sensor device 114, and are separated from each other in the illustrated Y direction.

On the other hand, each of the Y direction linear motor structure part 125A and the Y direction linear motor structure part 125B has the same structure as the X direction linear motor structure part 120A. That is, the Y direction linear motor structure part 125A constituted by a pair of coil 126A for the Y-direction and core 127A for the Y-direction, and the Y direction linear motor structure part 125B is constituted by a pair of coil 126B for the Y-direction and core 127B for the Y-direction.

The Y direction linear motor structure part 125A and the Y direction linear motor structure part 125B are disposed to face across the arranging position of detector unit 114, and are separated from each other in the illustrated X direction.

The Z direction electromagnet 130 functions to raise the stage 112 from the base 111 to form a gap between magnet 115A for the direction of X and each magnet 115,116 provided in the stage 112. The direction electromagnet 130 of Z is constituted by coil 131 for the direction of Z, and core 132 for the direction of Z.

In order to stabilize floatation, it is disposed in the four-corner positions of the base 111 made into the shape of a rectangle, respectively. The unit to surface stage 112 to base 111 can consider how to use a compressed air other than the magnetic unit currently used by this embodiment, a unit to support base 111 with the plurality of balls, etc. On the other hand, the magnet 115 for the direction of X and the magnet 116 for the Y-direction are disposed in stage 112 like.

Although not illustrated in the figure, as for each magnet 115,116, a total of four per every pair are disposed, respectively. Therefore, in the condition of the stage 112 when viewed from the base side, each magnet 115,116 is arranged so that it may collaborate and a generally square may be made.

The X-direction magnet 115 is constituted by the plurality of magnet rows (aggregate of small magnets) in which the plurality of equivalent permanent magnets are arranged in the shape of a straight line so that a polarity might appear periodically.

Similarly, the Y-direction magnet 116 is also constituted by the plurality of magnet rows in which the plurality of equivalent permanent magnets are arranged in the shape of a straight line so that a polarity might appear periodically.

The yoke 117 is disposed in the upper part of each magnet 115,116, and this yoke 117 does so the function which combines magnetically the plurality of magnets of each which constitute each magnet 115,116.

In the condition of having equipped with stage 112 to base 111 in the above-mentioned structure, it is constituted so that one side of a pair of magnets 115 for the direction of X may be located on the direction linear motor structure part 120A of X and magnet 115 for the direction of X of another side may be located on the direction linear motor structure part 120B of X.

In the condition of having equipped with stage 112 to base 111, it is constituted so that one side of a pair of magnets 116 for the Y-direction may be located on the direction linear motor structure part 125A of Y and magnet 116 for the Y-direction of another side may be located on the direction linear motor structure part 125B of Y.

In the condition that stage 112 was equipped with base 111, and it sets in the condition that stage 112 surfaced to the base 111 with the direction electromagnet 130 of Z. It is constituted so that it may engage with linear motor structure parts 120A, 120B, 125A, and 125B which face the surface formed by the magnets 115,116.

In the above-mentioned wearing condition, each magnet 115,116 is arranged so that it may intersect perpendicularly to the winding direction of each coils 121A, 121B, 126A, and 126B established in each linear motor structure parts 120A, 120B, 125A, and 125B.

By considering a drive unit as the above-mentioned structure, the direction linear motor structure parts 120A and 120B of X and magnet 115 for the direction of X collaborate, and function as a linear motor which drives stage 112 to the illustrated X direction.

Similarly, the direction linear motor structure parts 125A and 125B of Y and magnet 116 for the Y-direction collaborate, and function as a linear motor which drives stage 112 to the illustrated Y direction. That is, in this embodiment, it becomes the structure which arranges 2 sets of linear motors in X and each Y both directions, respectively. By this structure, since comparatively big space is securable for an apparatus center portion, sensor device 124 can be installed in this position.

In this embodiment, it has the structure which disposed scale part 113 in stage 112, and disposed detector unit 114 in base 111. This is because it is not necessary to connect wiring to scale part 113. However, it is also possible to have structure which disposes scale part 113 in base 111, and forms detector unit 114 in stage 112. In the drive unit having the above-mentioned structure, if only the direction linear motor structure part 120A of X and the direction linear motor structure part 120B of X are made to drive in this direction simultaneously, the translation of the stage 112 is performed in the illustrated X direction.

Similarly, if only the direction linear motor structure part 125A of Y and the direction linear motor structure part 125B of Y are made to drive in this direction simultaneously, the translation of the stage 112 is performed in the illustrated Y direction.

The stage 112 is rotated by θz around the illustrated Z-axis by performing a reverse direction drive of the linear motor structure parts 120A, 120B, 125A and 125B, respectively.

Thus, the state of five degrees of freedom of stage 112 is detectable with detector unit 114 by forming sensor device 124 which consists of detector unit 114 and scale part 113 in stage device 110.

The above-mentioned embodiment explained by mentioning as an example the structure using scale part 113 provided with reference grating 140 which has a configuration of a sinusoidal wave to the direction of two dimensions. Alternatively, the reference grating 400 constituted instead of reference grating 140 by the configuration which becomes symmetrical to the main axis of reference grating 400 may be used.

The above-mentioned embodiment can be widely applied to the surface which will need a micro fabrication from now on, such as not only a semiconductor manufacturing device but a micromachine, an optical communication part article for IT. That is, many of present micromachine manufacturing technology uses semi-conductor manufacturing technology, and they become possible manufacturing more detailed and various micromachines by using the invention. In the surface of laser beam machining, the stage moved by submicron accuracy to ultra high-speed is demanded.

Figure 27:
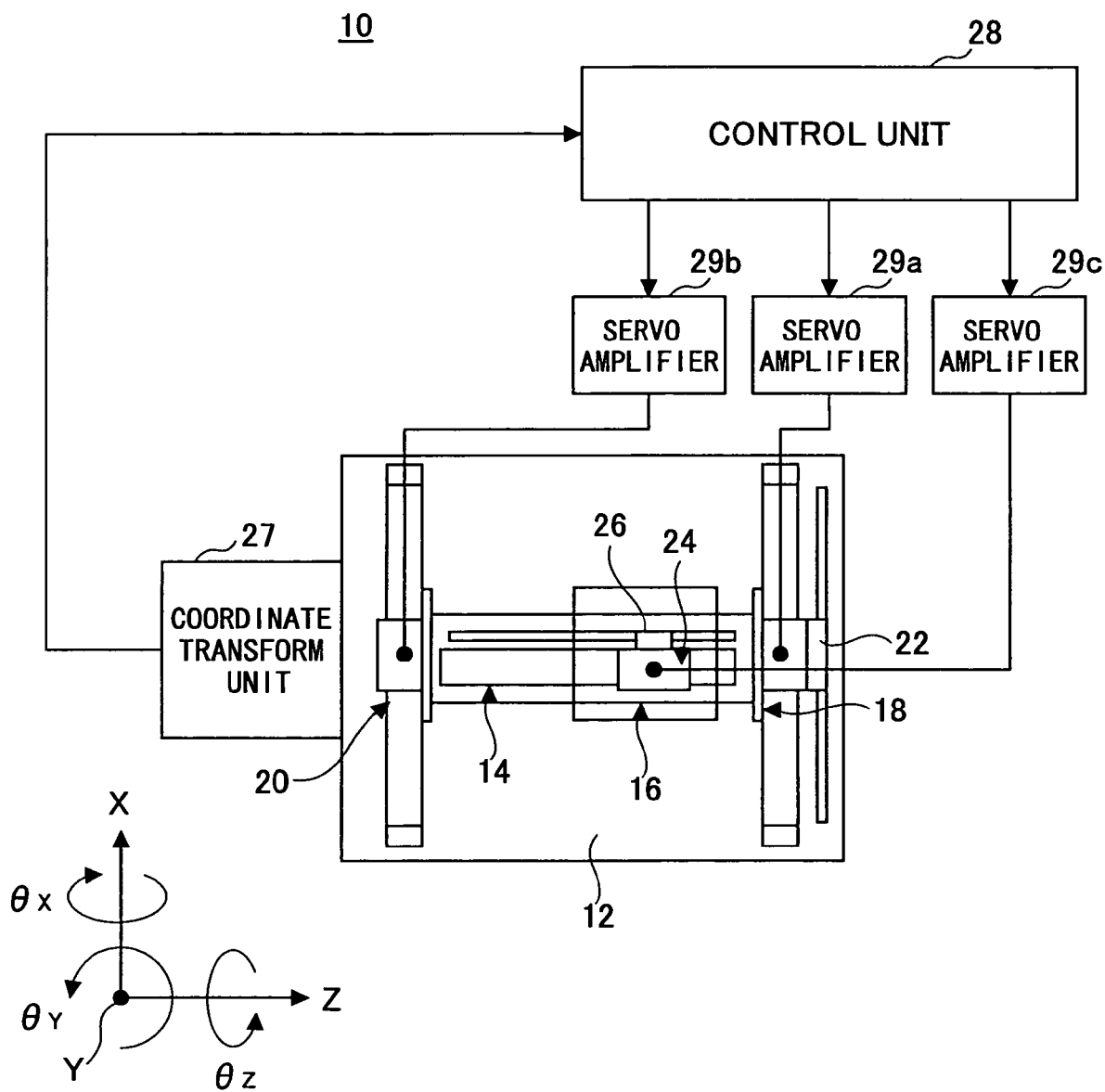
FIG. 27 is a diagram showing the outline composition of a stage device to which the sensor device in an embodiment of the invention is applied.

Next, FIG. 27 shows the outline composition of the stage device which applies the sensor device in an embodiment of the invention.

In the following description, the direction in which light irradiates the transparent-body angle grating 30 when explaining the structure and the actuation principle of the transmission type sensor device 22 which are mentioned later is made into the direction of Z, and the longitudinal direction will be explained as the direction of Z in FIG. 27.

As shown in FIG. 27, the stage device 10 is provided with the following. The base 12, the 1st stage 14 provided movable to base 12, the 2nd stage 16 disposed in the 1st stage 14 and established in the longitudinal direction movable, the linear scale 26 arranged in parallel with a pair of linear motors (driving unit) 18 and 20 which carry out translation actuation of the ends of the 1st stage 14, the transmission type sensor device 22 arranged near the linear motor 18, the linear motor 24 which drives the 2nd stage 16, and the linear motor 24.

The transmission type sensor device 22 constitutes the principal part of the stage device, and the movement zone of the 1st stage 14 is made applicable to the main detection, which will be described later. It is constituted to also detect simultaneously the sliding direction (the Y-direction) leading to a motion error in the direction other than the moving direction (the X-direction), and the rotation angles θx, θy, and θz around the respective axes.

Coordinate transform of the detection signal detected by the transmission type sensor device 22 and the X linear scale 26 is carried out with the coordinate transform unit 27, and it is inputted into the control unit 28. The control unit 28 has the arithmetic operation unit (control program) which calculates the controlled variables which are set up beforehand and supplied to the linear motors 18, 20, and 24 based on the computing equations, and outputs the control signal acquired by the operation to each servo amplifier 29a-29c.

And the driving signals amplified with the servo amplifiers 29a-29c are supplied to the linear motors 18, 20, and 24, so that the linear motors 18, 20, and 24 are driven. In the transmission type sensor device 22, the X-direction and Y-direction displacements of the 1st stage 14 and the inclination angle in the direction of θz are detectable, which will be mentioned later.

Therefore, it is possible for the control unit 28 to carry out translation actuation of the linear motors 18 and 20 with high precision so that the 1st stage 14 may not incline based on the detection data for all directions detected by the transmission type sensor device 22.

Next, the structure of transmission type sensor device 22 used as a transmission type surface encoder will be explained with reference to FIG. 28.

Figure 28:
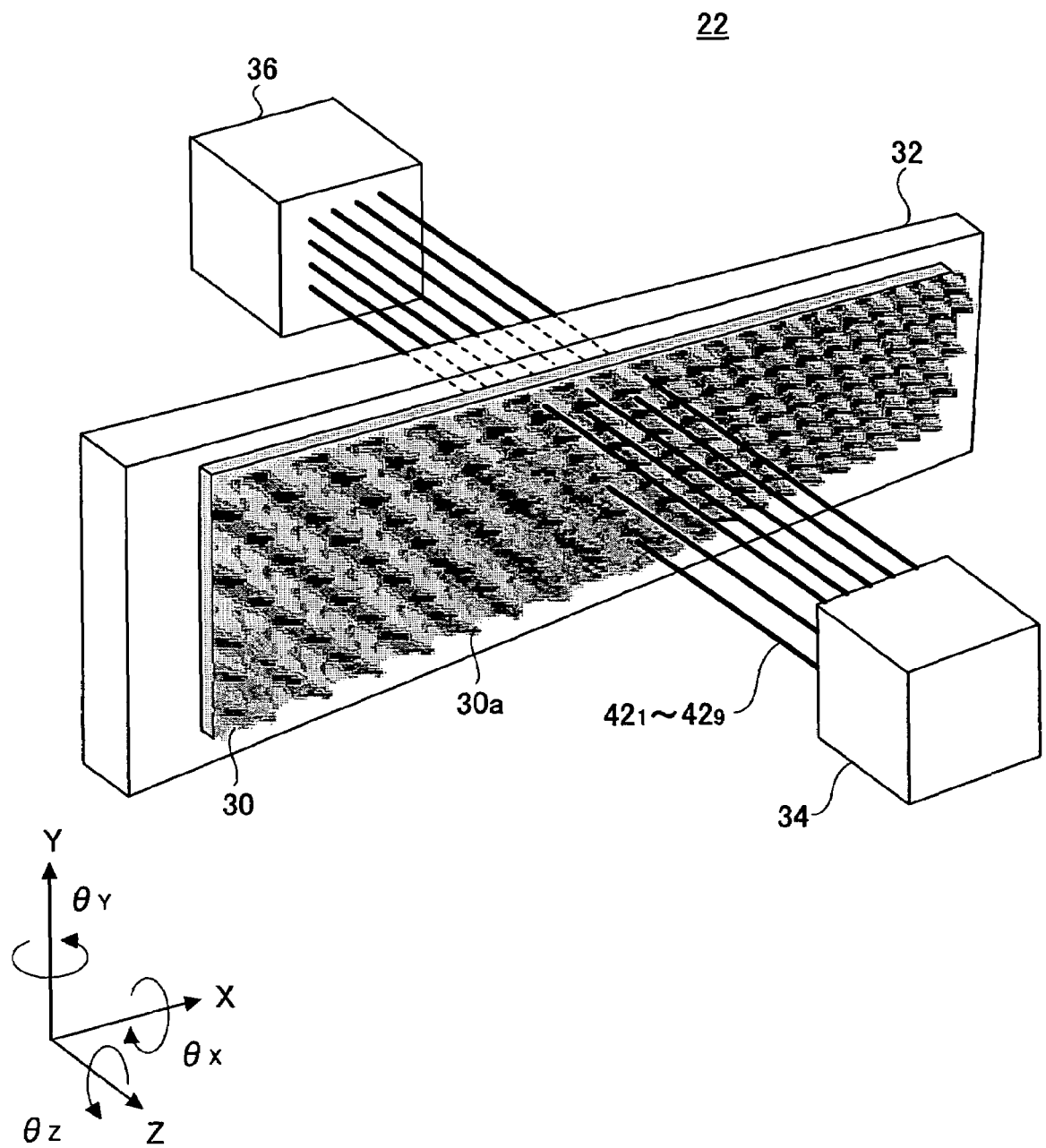
FIG. 28 is a perspective view showing the structure of a transmission type sensor device in an embodiment of the invention.

As shown in FIG. 28, the transmission type sensor device 22 is provided with the following. The transparent-body angle grating (reference grating) 30 by which extension formation is carried out in the moving direction of the 1st stage 14, the transparent substrate 32 which holds transparent-body angle grating 30 to a perpendicular state, the light source part 34 which emits light in the plurality of parallel light beams towards transparent-body angle grating 30, the light receiving part 36 which receives the plurality of parallel light beams which penetrated transparent-body angle grating 30, the transparent substrate 32 which is made of a transparent glass plate, fixed to the base 12 and becomes the anchoring side by the perpendicular state, and the transparent-body angle grating 30 which adheres to the surface of the transparent substrate 32.

Since the transparent-body angle grating 30 and transparent substrate 32 are formed of transparence material, they have a characteristic which the light emitted by the light emitting unit 34 penetrates.

Figure 29:
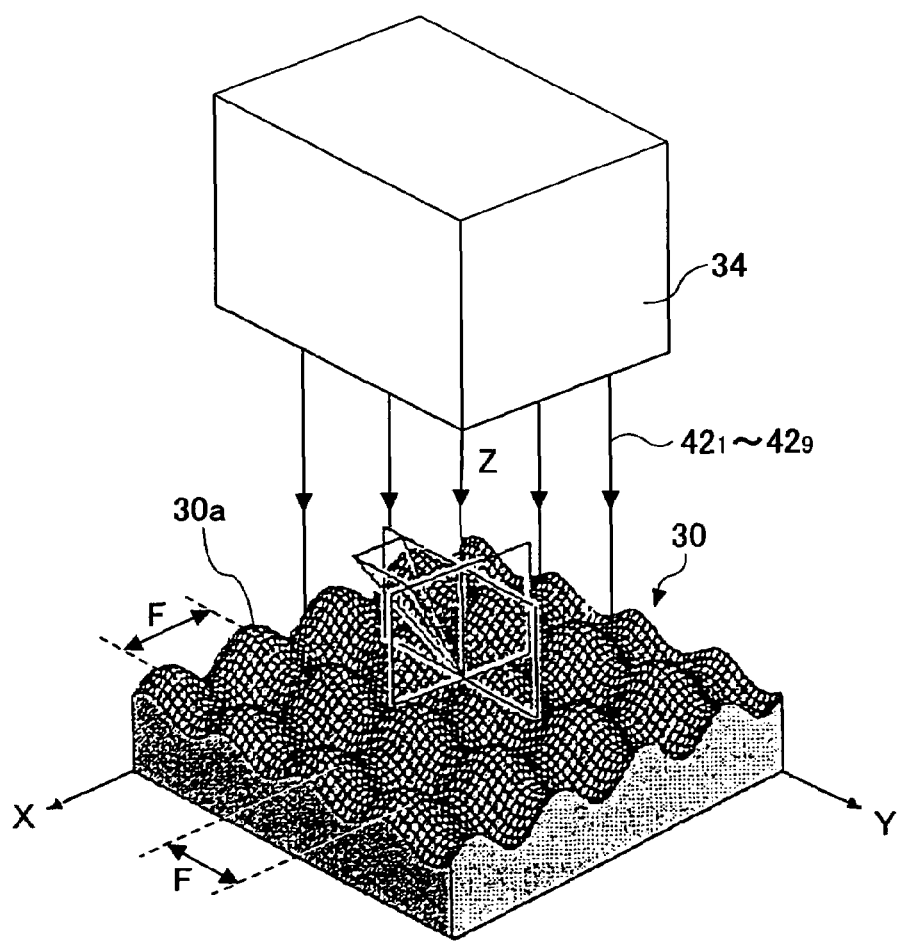
FIG. 29 is an enlarged perspective view showing the detecting surface of a transparent-body angle grating which is irradiated by a plurality of light beams.

FIG. 29 shows the detecting surface 30a of the transparent-body angle grating 30. As shown in FIG. 29, in the detecting surface 30a, the three-dimensional concave curves having a profile of a predetermined sinusoidal-wave configuration, are formed in the surface and the convex curves are formed in the two-dimensional manner periodically.

As for the concavo-convex configuration of this detecting surface 30a, it is possible to form the minute concave curves and convex curves uniformly and with high precision through die press forming, for example. The light emitting unit 34 is disposed so that it may face the surface of the transparent-body angle grating 30 perpendicularly.

The light receiving part 36 is disposed so that it may face the back surface of the transparent-body angle grating 30 perpendicularly. And the light emitting unit 34 and the light receiving unit 36 are held so that they may be supported integrally with the bracket (not shown) fixed to the 1st stage 14 that is the movable side and the right opposite may be formed through the transparent-body angle grating 30 and the transparent substrate 32.

Therefore, when the light emitting unit 34 and the light receiving unit 36 are driven in the Y-direction with the 1st stage 14, they will move to transparent-body angle grating 30 and transparent substrate 32. In that case, the plurality of parallel light beams which are emitted by the light emitting unit 34 are refracted by the concave curves and convex curves of the detecting surface 30a, penetrate, and are received by the light receiving unit 36.

The plurality of photodetectors which receive the plurality of parallel light beams from the light emitting unit 34 are provided to the light receiving unit 36 with the predetermined interval. And it is possible for an index of refraction to change with the positions where the light from the light emitting unit 34 penetrates the concave curves and convex curves of the detecting surface 30a, and to calculate the movement magnitude of light emitting unit 34 to the transparent-body angle grating 30, and the light receiving unit 36 from change of the intensity distribution of each light in the light receiving unit 36.

Figure 30:
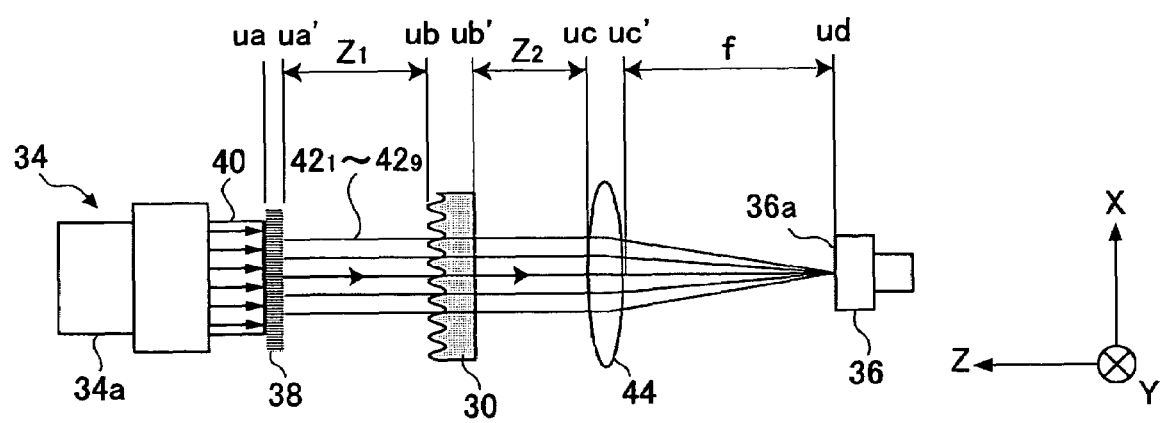
FIG. 30 is a diagram showing the structure of the transmission type sensor device of FIG. 28 when viewed from the X direction.

FIG. 30 is a diagram showing the structure of transmission type sensor device 22 of in FIG. 28 when viewed from the X direction.

The spectrum plate 38 of the square which light emitting unit 34 is carrying out the spectrum of the light from illuminant 34a which consists of a laser diode to the plurality of parallel light beams (for example, n=9), for example, and has a grid pattern as a spectral unit in the emission face of illuminant 34a as shown in FIG. 30 is attached.

Figure 31:
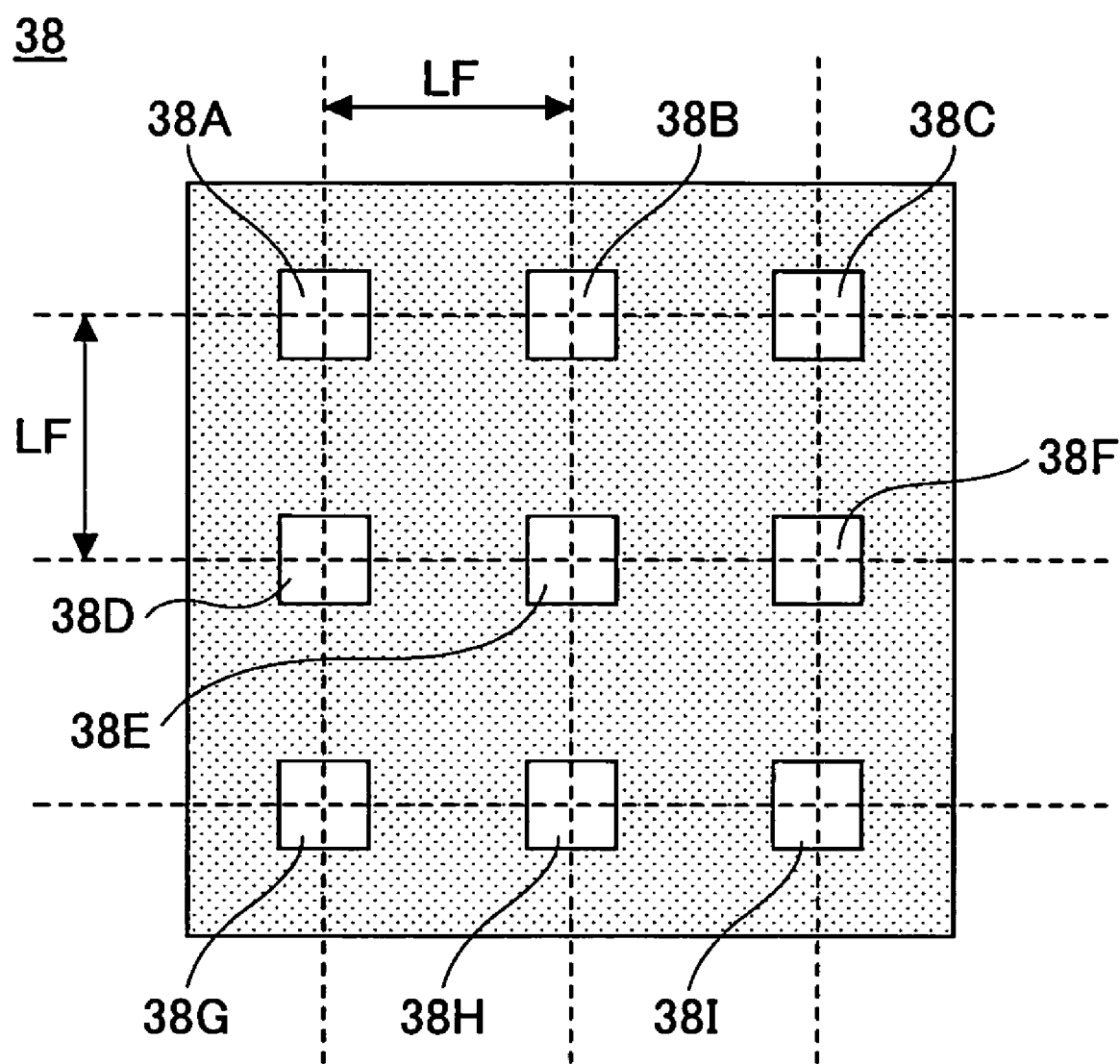
FIG. 31 is an enlarged diagram showing an example of the grid pattern of a spectrum plate.

FIG. 31 is an enlarged diagram showing an example of the grid pattern of the spectrum plate 38. As shown in FIG. 31, in the spectrum plate 38, nine minute openings 38A-38I are formed in the two-dimensional flat surface of the X-direction, and the Y-direction in the shape of a grating at predetermined intervals LF.

The spectrum plate 38 is provided to convert the light 40 emitted by the light source 34a into nine light beams 421-429 through the plurality of minute openings 38A-38I.

Although the structure which formed nine minute openings 38A-38I in the spectrum plate 38 was explained with reference to FIG. 31, the number of minute openings and the arrangement of the spacing may be set up arbitrarily. For example, 10×10 minute openings may be arranged in the X-direction and the Y-direction.

Therefore, the number of the light beams by which the spectrum plate 38 is disposed with plate 38 (the number of spots which will be irradiated by light receiving unit 36 if it puts in another way) can be set as arbitrary numbers by choosing the number of arrangement of a minute opening. The minute openings 38A-38I are formed so that it may become the same dimension as the arrangement pitch F of concave curves and convex curves formed in the detecting surface 30a.

The nine light beams 421-429 which passed the minute openings 38A-38I of the spectrum plate 38 are converted into parallel light, and the detecting surface 30a of the transparent-body angle grating 30 is irradiated by the parallel light, so that multiple spots are generated by the arrangement pitch F of the transparent-body angle grating 30, and regular intervals (or diffraction at the time of passing openings 38A-38I spacing of the integral multiple of the arrangement pitch F).

The nine light beams 421-429 which penetrated the transparent-body angle grating 30 are focused on the light-receiving surface 36a of light receiving unit 36 by the objective lens 44 which is arranged just before the light receiving unit 36.

Figure 32:
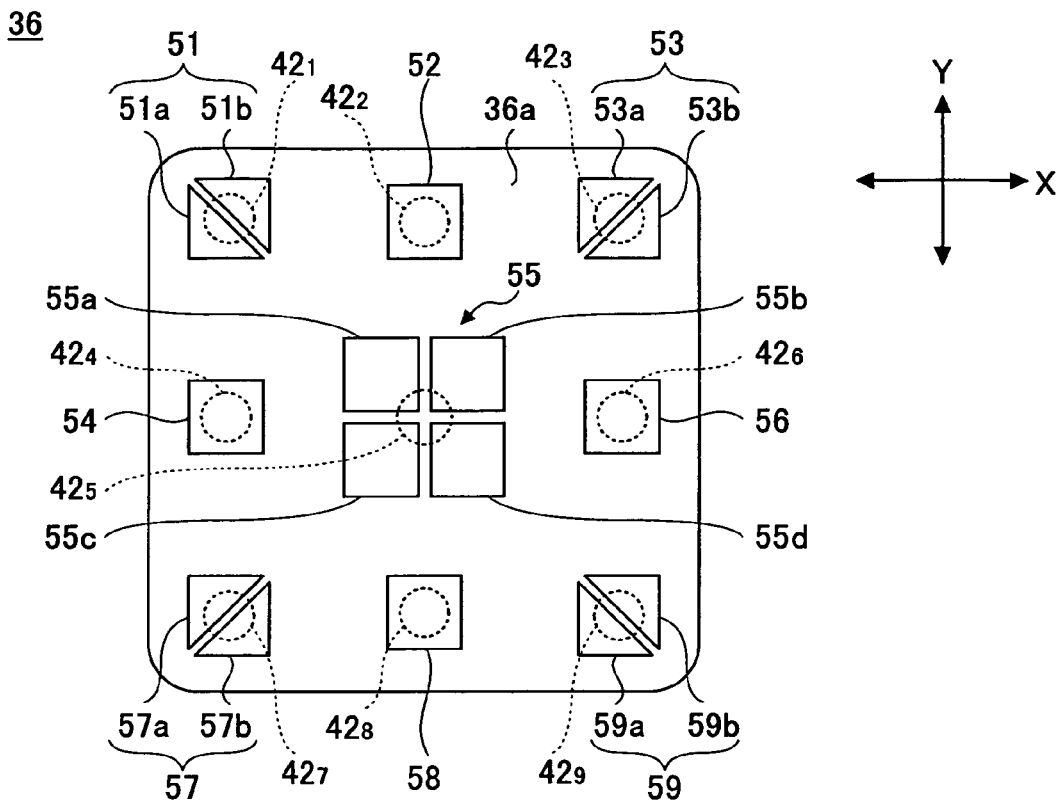
FIG. 32 is an enlarged diagram showing the light-receiving surface on which a plurality of photodiodes are arranged.

As shown in FIG. 32, the photodiodes 51-59 which receive nine light beams 421-429 which penetrated transparent-body angle grating 30 are disposed on the light-receiving surface 36a of light receiving unit 36.

Next, the light receiving unit 36 will be explained with reference to FIG. 32. The circles indicated the dotted lines in FIG. 32 show the multi-spots of light beams 421-429 which reach respective photodiodes 51-59. The photodiodes 51-59 disposed on the light-receiving surface 36a of light receiving unit 36 output the detection signals according to the light receiving intensities of the light beams 421-429. The photodiodes 51, 53, 57, and 59 among the photodiodes 51-59 are arranged in the four corners of the light-receiving surface 36a. It consists of 2 division PD which combined a pair of photodetectors, and photodiode 55 arranged in the center of light-receiving surface 36a including the 4-division photodetector (PD) which is divided into four photodetectors.

The 2-division PD 51 is arranged at the upper left of light-receiving surface 36a. The photodetector (51a, 51b) formed in the shape of a triangle becomes 1 set, and the optical intensity of light 421 is detected. The photodetector (53a, 53b) formed in the shape of a triangle becomes 1 set, and the 2 division PD 53 arranged at the upper right corner part detects the optical intensity of light 423.

The photodetector (57a, 57b) formed in the shape of a triangle becomes 1 set, and the 2 division PD 57 arranged at the lower left corner part detects the optical intensity of light 427. The photodetector (59a, 59b) formed in the shape of a triangle becomes 1 set, and the 2 division PD 59 arranged at the lower right corner part detects the optical intensity of light 429.

The four photodetectors 55a-55d are installed in the X-direction, and the Y-direction side by side so that it may become two rows at a time, and the 4-division PD 55 arranged in the center of light-receiving surface 36a detects the optical intensity of light 425 irradiated in the center with four photodetectors 55a-55d.

The photodiodes 52, 54, 56, and 58 arranged in the medium of four sides of light-receiving surface 36a detect the optical intensity of light 422,424,426,428, respectively.

In this embodiment, change of the intensity distribution of light beams 421-429 detected by the light receiving unit 36 which has the nine photodiodes 51-59 performs the position of the 1st stage 14, and detection of an inclination angle.

The simulation result of the transmission type sensor device 22 will be explained. In the model using the transparent-body angle grating 30, the surface configuration of the detecting surface 30a of the transparent-body angle grating 30 is two-dimensional with the concave curves and convex curves which form the sinusoidal wave, as represented by the following formula (8).

$$h(x, y) = -A_x \cos\left(2\pi \frac{x}{P_x}\right) - A_y \cos\left(2\pi \frac{y}{P_y}\right) \quad (8)$$

The transparent-body angle grating type-like pitches Px and Py are on the order of several 100 micrometers or less, and the amplitudes Ax and Ay are on the order of several 100 nm or less, and if light is entered into the gratings, they act as a diffraction grating.

Then, in standing the model of sensor device 22 here, light was treated as a wave, and it analyzed by calculating the amplitude and a phase angle. That is, it is not the model of geometrical optics but a model of wave optics which is used.

Figure 33:
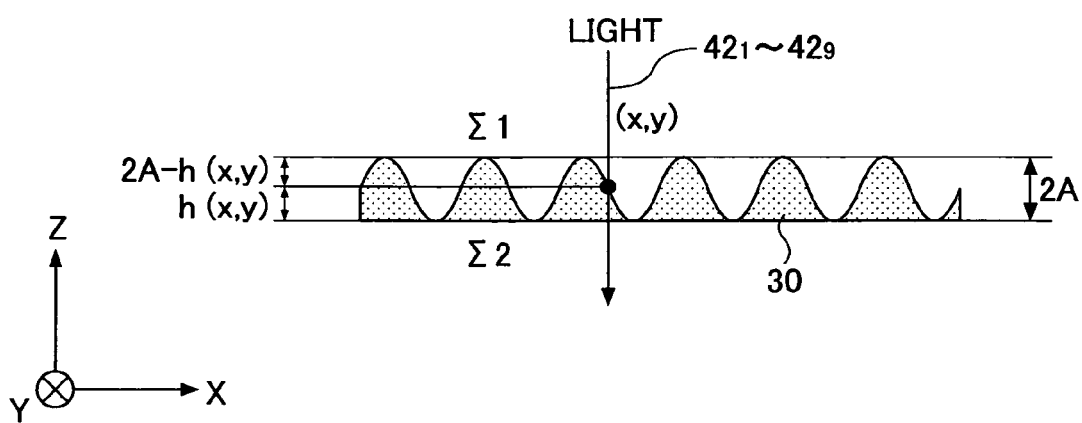
FIG. 33 is a diagram showing the model in which light enters a transparent-body angle grating at a position (x, y).

As shown in FIG. 33, the light enters into a position (x, y) of the transparent-body angle grating 30 in the almost vertical direction. If it goes from surface sigma 1 to surface sigma 2 at this time, only distance h (x, y) will progress the inside of transparent-body angle grating 30, and light will penetrate transparent-body angle grating 30, after only distance 2 A-h (x, y) progresses.

In the index of refraction of transparent-body angle grating 30, when the index of refraction besides n and transparent-body angle grating 30 is set to 1, the optical path length L when this light goes from surface sigma 1 to surface sigma 2 is expressed by the following formula (9).

$$L = 2A - h(x, y) + n \cdot h(x, y) \quad (9)$$

Since there is the optical path length L when it goes from surface sigma 1 to surface sigma 2, the phase angle is delayed by kL which is the product of the wave number k (=2π/λ, λ: the wavelength of light) and the optical path length L. Therefore, the phase function G(x, y) which the transparent-body angle grating 30 has can be expressed by the following formula (10).

$$\begin{aligned} G(x, y) &= e^{-ikL} \\ &= e^{-ik\{2A - h(x,y) + n \cdot h(x,y)\}} \\ &= e^{-ik(n-1)h(x,y)} \cdot e^{-i2kA} \end{aligned} \quad (10)$$

$$G(x, y) = e^{-ik(n-1)h(x,y)} \quad (11)$$

Since the constant term $e^{-i2kA}$ is negligible, the above phase function G(x, y) can be expressed by the above formula (11).

When the displacements of the X-direction and the Y-direction and the rotation angle around the Z-axis arise in the transparent-body angle grating 30, the above formula (11) can be expressed as being the following formula (12).

$$G(x, y) = e^{-ik(n-1)h(x' + \Delta x, y' + \Delta y)} \quad (12)$$
$$\begin{bmatrix} x' \\ y' \end{bmatrix} = \begin{bmatrix} \cos\theta_Z & -\sin\theta_Z \\ \sin\theta_Z & \cos\theta_Z \end{bmatrix} \begin{bmatrix} x \\ y \end{bmatrix}$$

The above is the simulation result of the model of the transparent-body angle grating 30.

Next, the optical system of the transmission type sensor device 22 using the transparent-body angle grating 30 will be explained.

As shown in FIG. 30, the parallel light beams 421-429 coming from the laser light source (LD) 34a in the optical system of the transmission type sensor device 22 enter into the grating-like spectrum plate 38 having the minute openings 38A-38I. The light beams diffracted by the minute openings 38A-38I of the spectrum plate 38 interfere with each other, and parallel light beams 421-429 (the multiple beams) are generated on the transparent-body angle grating 30, the peaks of which appear at the spacing that is the same as the opening spacing of the grid pattern. After the parallel light beams 421-429 penetrate the transparent-body angle grating 30, they are focused on the light-receiving surface 36a of the light receiving unit 36 by the objective lens 44.

In order to determine the intensity distribution on the light-receiving surface 36a of the light receiving unit 36 of this optical system, the optical system is divided into components, and the function which affects the amplitude term and phase-angle term of the light wave which each component has is used. Based on such functions, the approach which calculates the functions ua, ua', . . . , ud in this order is adopted. This optical system comprises the light emitting unit 34, the spectrum plate 38, the transparent-body angle grating 30, the objective lens 44, and the light wave propagation space between the components.

These functions will be explained in this order. Suppose that the light emitting unit 34 emits the parallel light ua the intensity distribution of which is in conformity with Gaussian distribution. That is, the parallel light ua is the light wave in which the phase angle is the same on the same plane. The phase-angle term is disregarded and the root of the Gaussian distribution formula is taken for the amplitude term. The function of the light emitting unit 34 is defined as being the following formula (13).

$$ua(x, y) = \sqrt{e^{-\frac{x^2 + y^2}{2\sigma^2}}} \quad (\sigma = 1200 \,\mu\text{m}) \quad (13)$$

Although the light entering into the minute openings 38A-38I of the grid pattern penetrates the spectrum plate 38, the other light interrupts it. The transmission function g(x, y) of the spectrum plate 38 can be expressed as being the following formula (14).

$$g(x, y) = \begin{cases} 1 \\ 0 \end{cases} \quad (14)$$

The phase function of the transparent-body angle grating 30 is as mentioned above. The objective lens 44 has the function to convert a plane wave into a spherical wave when the plane wave is entered. The phase function L(x, y) of the objective lens 44 is expressed as being the following formula (15).

$$L(x, y) = e^{ik\left(\sqrt{f^2 + x^2 + y^2} - f\right)} \quad (15)$$

The propagation of the space of light is considered by the formula of the Fresnel diffraction. The light coming out from surface sigma 1 is spread to surface sigma 2 which only distance z left. At this time, the formula of the Fresnel diffraction is expressed as being the following formula (16).

$$u(x, y) = \int\int u_0(x_0, y_0) \frac{ie^{-ik\sqrt{z^2+(x-x_0)^2+(y-y_0)^2}}}{\lambda\sqrt{z^2+(x-x_0)^2+(y-y_0)^2}} dx_0 dy_0 \quad (16)$$

In the above formula (16), u0(x0, y0) denotes the wave front in surface sigma 1, u(x, y) denotes the wave front in surface sigma 2, i denotes the square root of −1, and λ denotes the wavelength of light, respectively.

The formula (16) is convolution and it can be changed to the form using the Fourier transform like the following formula (17). F[v(x, y)] denotes the Fourier transform of v(x, y), and $F^{-1}[\omega(x, y)]$ denotes the inverse Fourier transform of ω(x, y).

$$u(x, y) = u_0(x, y) * \frac{ie^{-ik\sqrt{z^2+x^2+y^2}}}{\lambda\sqrt{z^2+x^2+y^2}} \quad (17)$$

$$= F^{-1}\left[F[u_0(x, y)] \cdot F\left[\frac{ie^{-ik\sqrt{z^2+x^2+y^2}}}{\lambda\sqrt{z^2+x^2+y^2}}\right]\right]$$

As mentioned above, the model of the transmission type sensor device 22 is summarized, and the intensity distribution I(x, y) of the light-receiving surface 36a of the light receiving unit 36 is determined.

The intensity distribution I(x, y) of the light-receiving surface 36a is represented by the following formulas (18).

$$ua'(x, y) = ua(x, y) \cdot g(x, y), \quad (18)$$

$$ub(x, y) = F^{-1}\left[F[ua'(x, y)] \cdot F\left[\frac{ie^{-ik\sqrt{z_0^2+x^2+y^2}}}{\lambda\sqrt{z_0^2+x^2+y^2}}\right]\right],$$

$$ub'(x, y) = ub(x, y) \cdot G(x, y)$$

$$uc(x, y) = F^{-1}\left[F[ub'(x, y)] \cdot F\left[\frac{ie^{-ik\sqrt{z_1^2+x^2+y^2}}}{\lambda\sqrt{z_1^2+x^2+y^2}}\right]\right],$$

$$uc'(x, y) = uc(x, y) \cdot L(x, y)$$

$$ud(x, y) = F^{-1}\left[F[uc'(x, y)] \cdot F\left[\frac{ie^{-ik\sqrt{z_2^2+x^2+y^2}}}{\lambda\sqrt{z_2^2+x^2+y^2}}\right]\right],$$

$$I(x, y) = |ud(x, y)|^2$$

Figure 34:
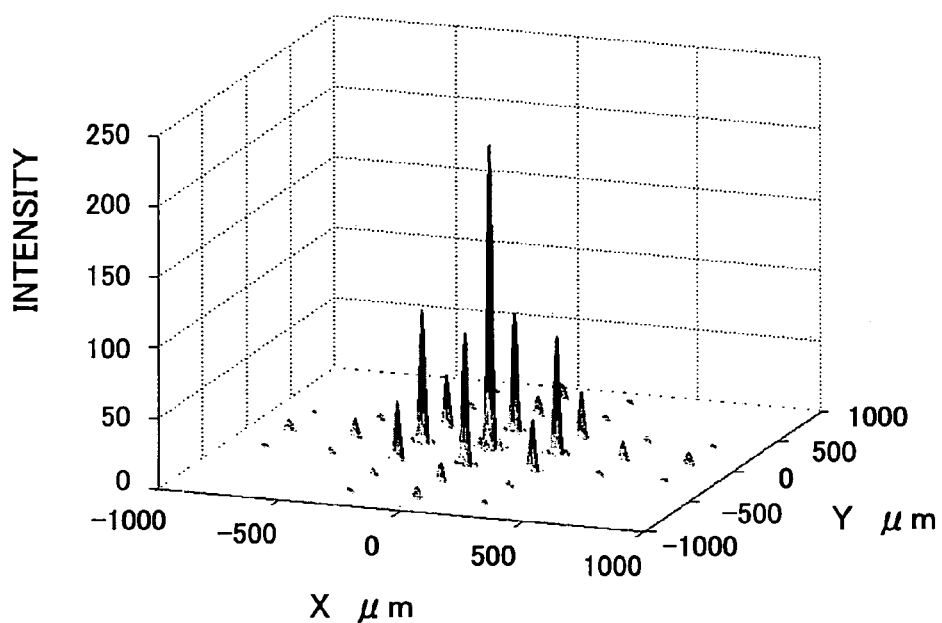
FIG. 34 is a diagram showing the simulation result of intensity distribution I(x, y) of the transmission type sensor device of FIG. 28.

If the simulation of the intensity distribution I(x, y) of the light-receiving surface 36a of the light receiving unit 36 is performed, the results as shown in FIG. 34 will be obtained. According to the above formulas (18), the results of calculations of the intensity distribution I(x, y) are shown in FIG. 34.

Next, the position detection method using the 4-division PD 55 will be explained.

As for the spot intensity of light beams 421-429, it turned out to the displacement of the X-direction over transparent-body angle grating 30, and the Y-direction that the height of a peak changes only in the X-direction, and the Y-direction, respectively. These displacements are detectable using the 4-division PD 55 shown in FIG. 35 using this principle.

Figure 35:
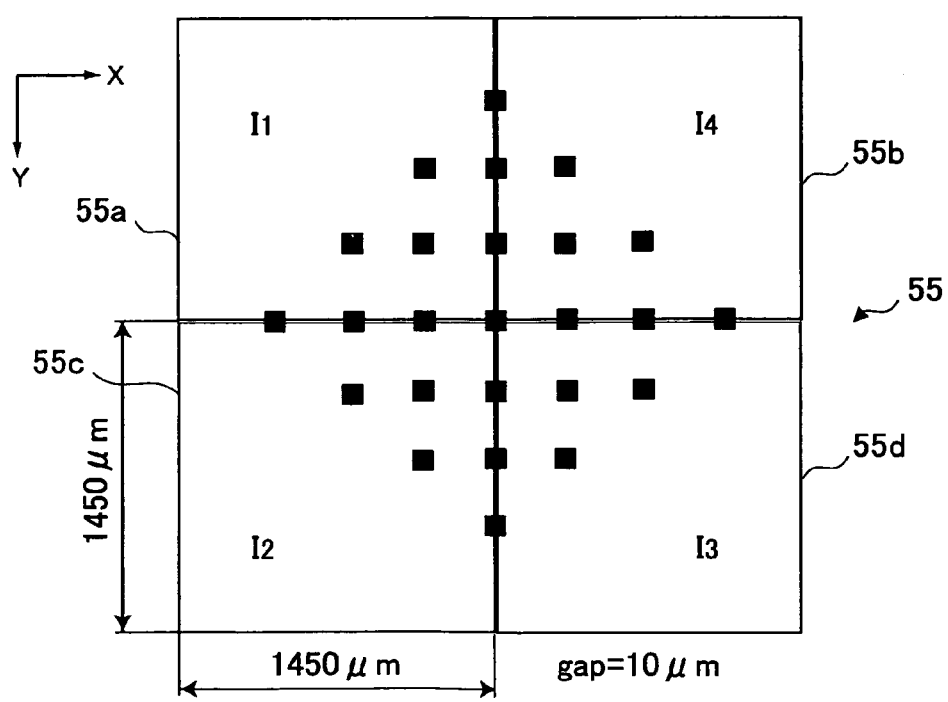
FIG. 35 is an enlarged diagram showing the composition of a 4-division photodetector.

The detection principle and the simulation result will be explained. The 4-division PD 55 is substantially the same as in the case where combined two rows of four photodetectors 55a-55d at a time in the X and Y directions as mentioned above, and the four photodiodes are formed. In FIG. 35, if the sensor outputs of the X-direction and the Y-direction are set to SX and SY, the outputs of the photodetectors 55a-55d are defined as follows by using I1-I4 which are indicated in FIG. 35, respectively.

$$S_X = 100 \cdot \frac{I_3 + I_4 - I_1 - I_2}{I_1 + I_2 + I_3 + I_4}(\%) \quad (19)$$

$$S_Y = 100 \cdot \frac{I_2 + I_3 - I_1 - I_4}{I_1 + I_2 + I_3 + I_4}(\%) \quad (20)$$

Figure 36:
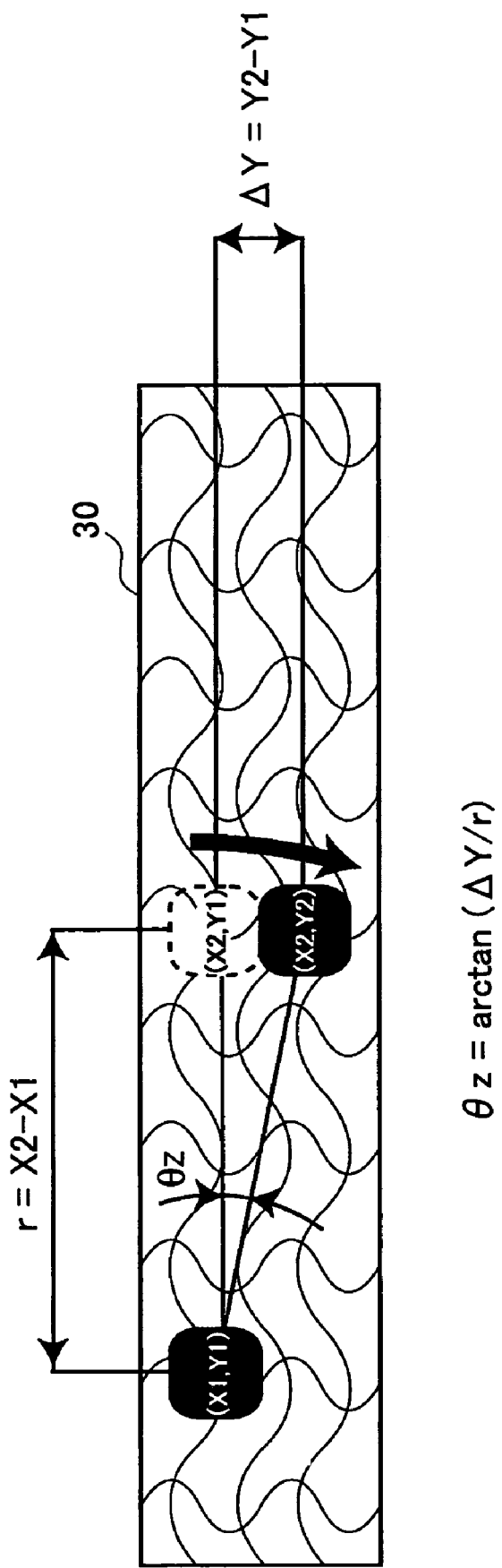
FIG. 36 is a diagram for explaining the method of determining a rotation angle θz from the relative spatial relationship of X and Y displacement.

As shown in FIG. 36, the rotation angle of the direction of θz can be determined from the relative spatial relationship of X and Y displacement by using two probes. The position and position detecting method using many components type PD will be explained.

It becomes possible to detect more degrees of freedom by detecting the behavior of peak each of a spot using many components type PD unlike the detecting method using the above-mentioned 4-division PD 55.

Figure 37:
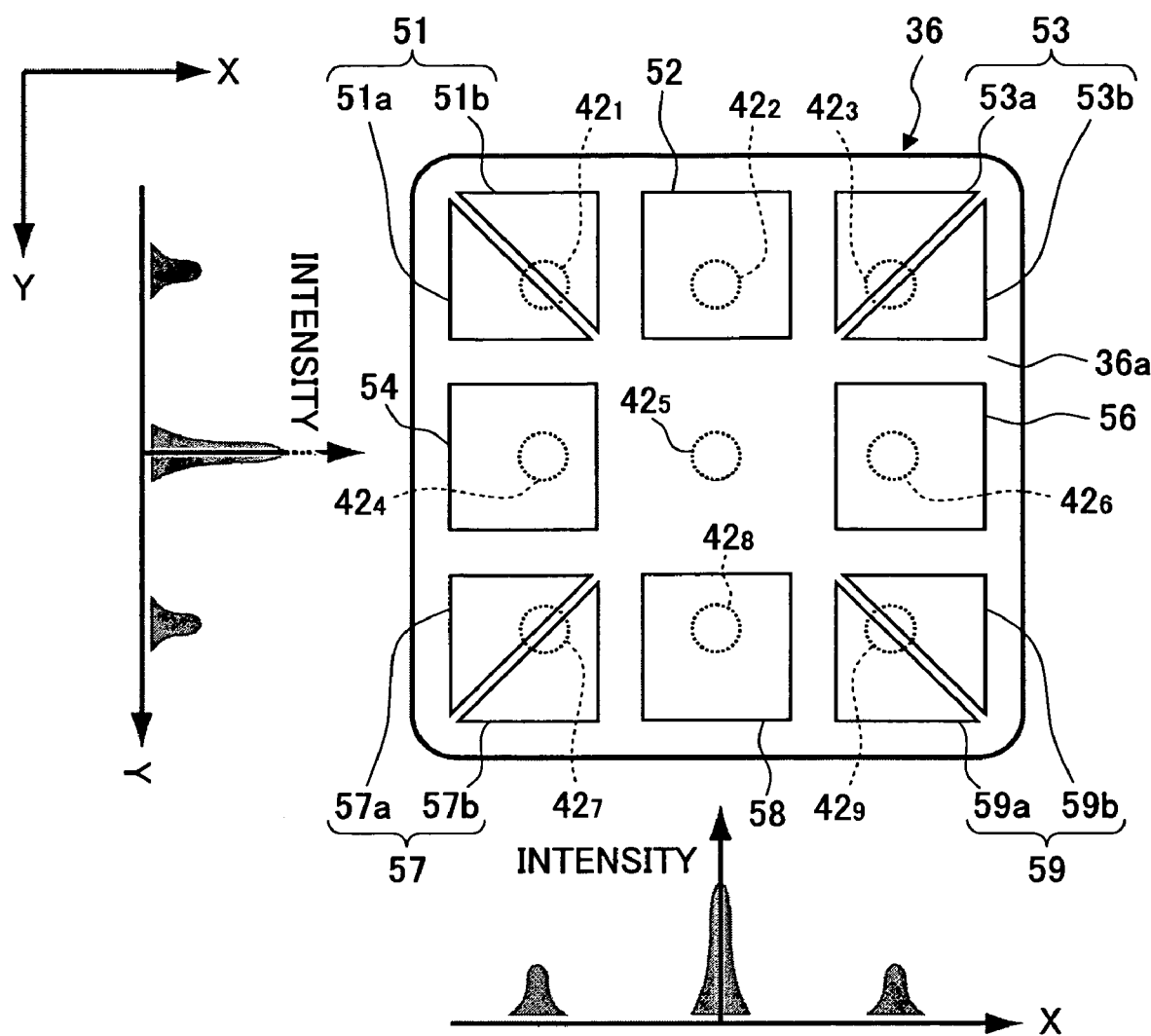
FIG. 37 is a diagram for explaining the arrangement of the plurality of photodiodes in the light receiving unit.
Figure 38:
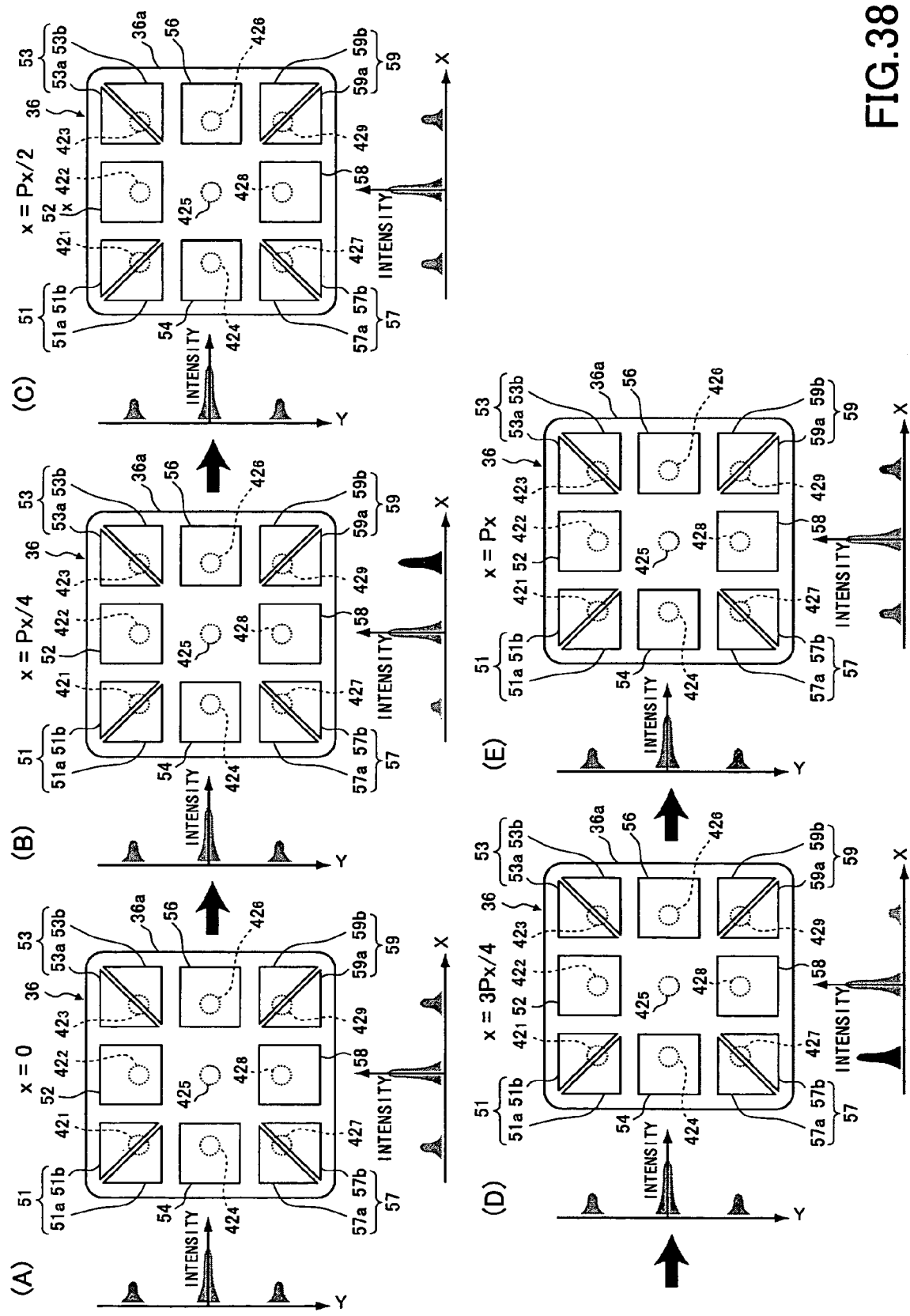
FIG. 38 is a diagram for explaining the method of detecting an X-direction displacement of the transmission type sensor device of FIG. 28.

In the light-receiving surface 36a (refer to FIG. 32) of the light receiving unit 36, many peaks will be located in a line in the XY directions at a fixed period. The photodiodes 51-54, 56-59 as shown in FIG. 37 to nine main peaks in the large number peak are arranged.

The photodiodes 52, 54, 56, and 58 are arranged at four sides of the light-receiving surface 36a, and, as for this light receiving unit 36, the 2 division PD 51, 53, 57, and 59 which cut the square aslant are arranged in four corners of the light-receiving surface 36a.

The method of detecting three degrees of freedom of a position and a position using the light receiving unit 36 which includes the multiple-division type PD is described about the detecting method of X and Y positions, and the detecting method of θz.

First, the detecting method of X and Y positions will be described. FIG. 38(A)-(E) shows the method of detecting a displacement of the X-direction of the transmission type sensor device of FIG. 28 as an example.

If a displacement arises in the X direction, as shown in FIG. 38(A)-(E), the height distribution in the peaks of the spots on the photodiodes 51-54 and 56-59 will change only in the X-direction. The sensor output of the X-direction of the light receiving unit 36 is set to SX.

The sensor output SX of the X-direction of the light receiving unit 36 is calculated from calculation of the formula (21) using the intensity detection values IX1 and IX2 of the photodiodes 54 and 56 arranged in the intermediate position of the two sides of the X direction of the light-receiving surface 36a. Similarly, the sensor output of the Y direction of the light receiving unit 36 is set to SY.

The sensor output SY of the light receiving unit 36 is calculated from calculation of the formula (22) using the intensity detection values IY1 and IY2 of the photodiodes 52 and 58 arranged in the intermediate position of the two sides of the Y-direction of the light-receiving surface 36a.

$$S_X = 100 \cdot \frac{I_{X2} - I_{X1}}{I_{X1} + I_{X2}}(\%) \quad (21)$$

-continued $$S_Y = 100 \cdot \frac{I_{Y2} - I_{Y1}}{I_{Y1} + I_{Y2}} (\%) \tag{22}$$

Next, the detecting method of the direction of θz around the Z-axis will be explained. If the rotation angle θz arises, the whole spots of light beams 421-429 will rotate the peak based on spots only the θz same as the Z axis. Then, θz is detectable by detecting intensity change of a spot using eight photodetectors of 2 division PD 51, 53, 57, and 59 arranged in four corners of light-receiving surface 36a.

Figure 39:
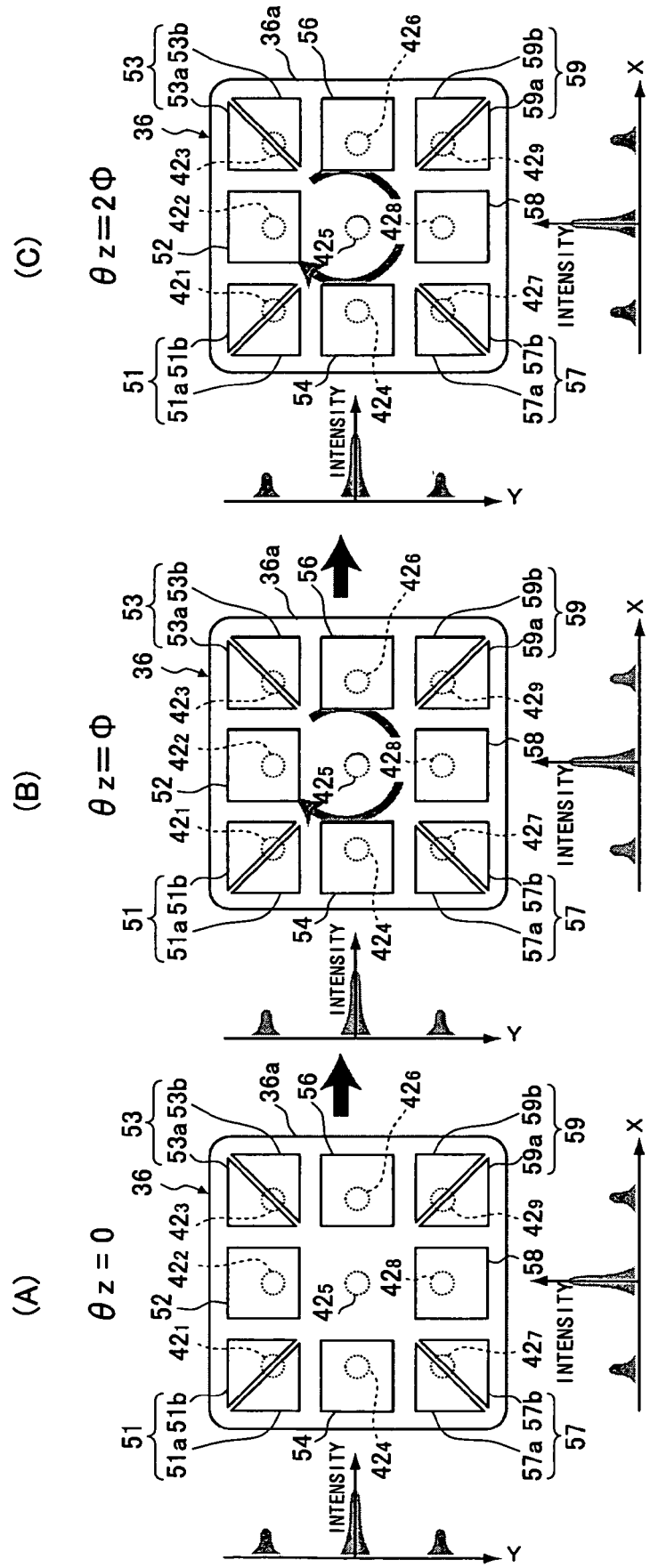
FIG. 39 is a diagram for explaining the principle of the method of detecting X and Y positions of the transmission type sensor device of FIG. 28.

The detection principle of the detecting method of X and Y positions of the transmission type sensor device of FIG. 28 is shown in FIG. 39(A)-(C).

When the outputs of eight photodetectors 51a, 51b, 53a, 53b, 57a, 57b, 59a, and 59b of the 2 division PD 51, 53, 57, and 59 are set to Iθz1, Iθz2, Iθz3, Iθz4, Iθz5, Iθz6, Iθz7, and Iθz8, the output Sθz of the direction of θz of the light receiving unit 36 is determined in accordance with the following formula (23).

$$S_{\theta Z} = 100 \cdot \frac{(I_{\theta z2} + I_{\theta z4} + I_{\theta z6} + I_{\theta z8}) - (I_{\theta z1} + I_{\theta z3} + I_{\theta z5} + I_{\theta z7})}{(I_{\theta z1} + I_{\theta z3} + I_{\theta z5} + I_{\theta z7}) + (I_{\theta z2} + I_{\theta z4} + I_{\theta z6} + I_{\theta z8})} (\%) \tag{23}$$

Figure 40:
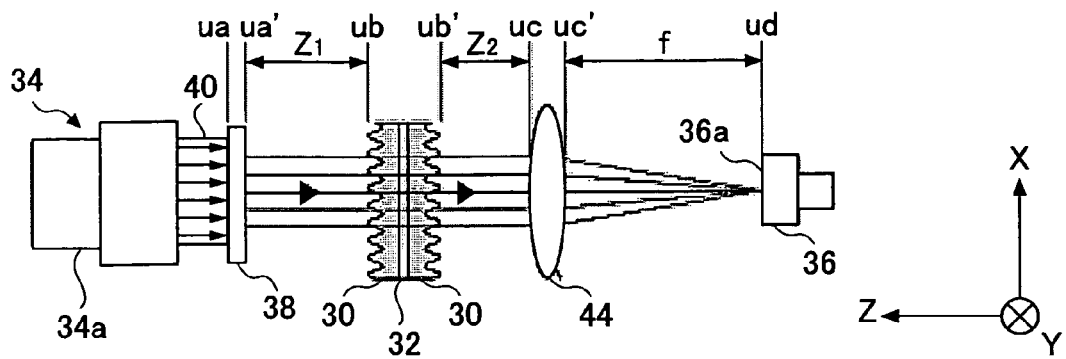
FIG. 40 is a diagram showing the modification of the optical system of the transmission type sensor device of FIG. 28.

FIG. 40 shows the modification of the optical system of the transmission type sensor device of this embodiment.

As shown in FIG. 40, the reference grating in the transmission type sensor device 22 may be provided such that a pair of transparent-body angle gratings 30 are attached to the front surface and the back surface of the transparent substrate 32 in a back-to-back formation. That is, this reference grating comprises a transparent substrate 32, a first reference grating 30 disposed on the front surface of the transparent substrate 32, and a second reference grating 30 disposed on the back surface of the transparent substrate 32 so that the first and second reference gratings 30 face in 180-degree opposite directions.

By using the reference grating for the optical system of transmission type sensor device 22, it is possible to acquire the detection signals of the positions of the X-direction and the Y-direction and the rotation angles θx, θy, and θz around the respective axes, except the Z-direction detection signal.

Next, the structure of reflection type sensor device 70 used as a reflection type surface encoder will be explained with reference to FIG. 41.

Figure 41:
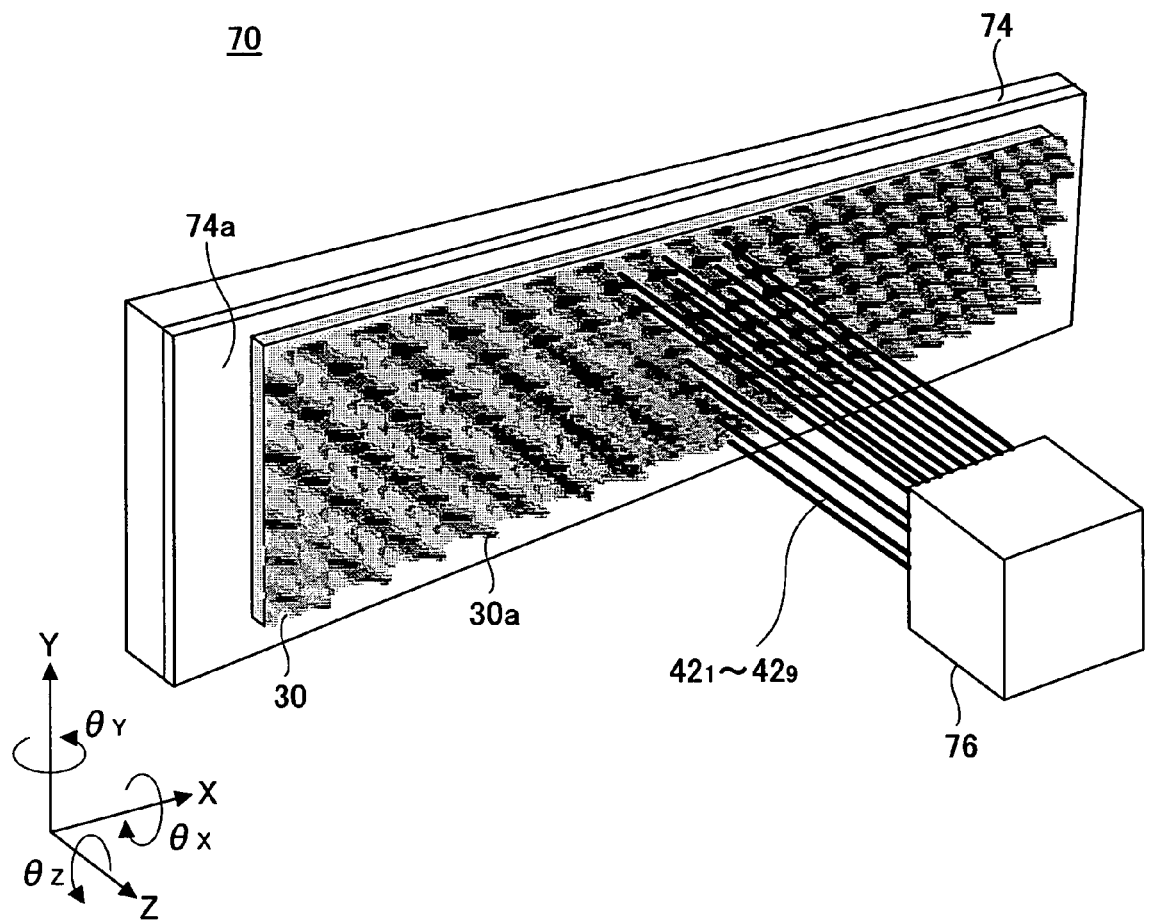
FIG. 41 is a perspective view showing the structure of a reflection type sensor device in an embodiment of the invention.

As shown in FIG. 41, the reflection type sensor device 70 is provided with the following. The transparent-body angle grating (reference grating) 30 by which extension formation is carried out in the moving direction of the 1st stage 14, the substrate 74 in which reflection surface (mirror) 74a which holds transparent-body angle grating 30 to a perpendicular state is formed, the optical sensor unit 76 which emits light in the plurality of parallel light beams to the transparent-body angle grating 30, and receives the reflected light beams from the reflection surface 74a, the optical sensor unit 76 which has a light emitting unit (not shown) which emits light in the plurality of parallel light beams, and a light receiving unit (not shown) which receives the plurality of reflected light beams which penetrate the transparent-body angle grating 30 and are reflected by the reflection surface 74a.

Since the optical sensor unit 76 is provided in the side which faces the detecting surface 30a of the transparent-body angle grating 30 in the reflection type sensor device 70, it is possible to approach the linear motor 18 in the transparent-body angle grating 30 rather than that of the transmission type sensor device of FIG. 28 mentioned above, and it is possible to detect the X-direction, the Y-direction and the rotation angles θx, θy, and θz around the respective axes in the near position of the linear motor 18.

Figure 42:
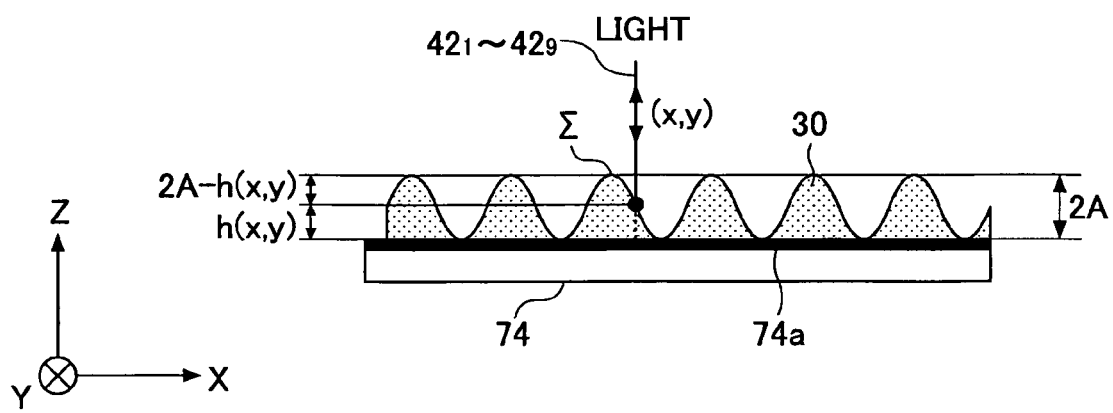
FIG. 42 is a diagram for explaining the model in which the transparent-body angle grating is attached to the reflection surface of the reflection type sensor device of FIG. 41.

The principle of detection of the state of the reflection type sensor device 70 will be explained. The model of the transparent-body angle grating 30 on the reflection surface 74a is shown in FIG. 42.

Similar to the transmission type sensor device of FIG. 28 mentioned above, the configuration of the detecting surface 30a of transparent-body angle grating 30 is what laid the sinusoidal wave in the two dimensional manner as represented by the following formula (24).

$$h(x, y) = -A_x \cos\left(2\pi \frac{x}{P_x}\right) - A_y \cos\left(2\pi \frac{y}{P_y}\right) \tag{24}$$

The pitches Px and Py of the surface configuration of the transparent-body angle grating 30 are on the order of several 100 micrometers or less, and the amplitudes Ax and Ay there of are on the order of several 100 nm or less, and the transparent-body angle grating 30 serves as a diffraction grating if light enters into it.

In the model of the reflection type sensor device 70 like the transmission type sensor device of FIG. 28 mentioned above, light is treated as a wave, and it is analyzed by calculating the amplitude and the phase angle. That is, it is not the model of geometrical optics but a model of wave optics which is used.

In the following description, suppose that, as shown in FIG. 42, light enters into a position (x, y) of the transparent-body angle grating 30 perpendicularly. When the light goes from surface sigma to reflection surface 74a of the substrate 74 at this time, the light, after progressing by the distance: 2A-h(x, y), enters into the transparent-body angle grating 30, and progresses by the distance h(x, y).

Figure 43:
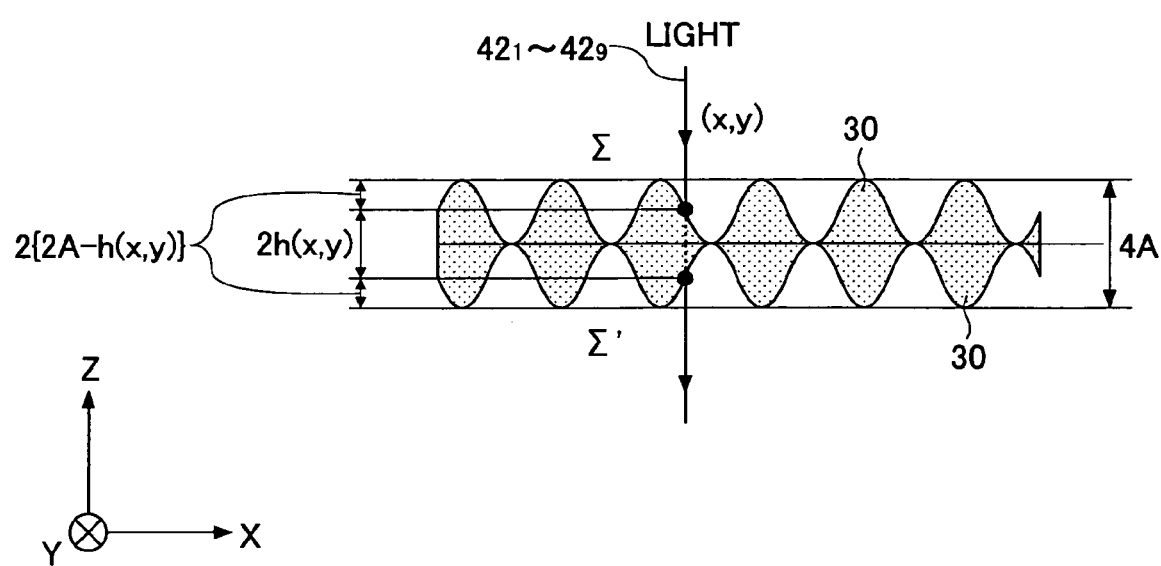
FIG. 43 is a diagram for explaining the virtual model in which the light of the reflection type sensor device of FIG. 41 is transmitted at the location where it is reflected by the reflection surface.

And the light reflected by the reflection surface 74a follows the same optical path and goes to surface sigma. The model supposed that it penetrates as it is in the place in which light is reflected in reflection surface 74a is shown in FIG. 43.

When the index of refraction besides n and transparent-body angle grating 30 is set to 1 for the index of refraction of transparent-body angle grating 30 at this time, this light enters from surface sigma and optical path length L when going to surface sigma (FIG. 43 sigma') again is expressed as being the following formula (25).

$$L = 2\{2A - h(x, y)\} + n \cdot 2h(x, y) \tag{25}$$

Since there is the optical path length L when the light goes from surface sigma to surface sigma again, the phase angle is delayed by kL which is the product of the wave number k ($=2\pi/\lambda$, $\lambda$: the wavelength of light) and the optical path length. Therefore, the phase function Gr(x, y) which the transparent-body angle grating 30 has can be expressed as being the following formula (26).

$$\begin{aligned}
Gr(x, y) &= e^{-ikL} \\
&= e^{-ik2\{2A - h(x, y) + n \cdot h(x, y)\}} \\
&= e^{-ik2(n-1)h(x, y)} \cdot e^{i4kA}
\end{aligned} \tag{26}$$

$$Gr(x, y) = e^{-i2k(n-1)h(x, y)} \tag{27}$$

Since the constant term $e^{-i4kA}$ is negligible, the above phase function G(x, y) can be expressed by the above formula (27).

When the displacements of the X-direction and the Y-direction and the rotation angle around the Z axis arise in the transparent-body angle grating 30, the formula (27) can be expressed as being the following formula (28).

$$Gr(x, y) = e^{-i2k(n-1)\{h(x'+\Delta x, y'+\Delta y)+\theta_Y \cdot x+\theta_X \cdot y\}} \quad (28)$$

$$\begin{bmatrix} x' \\ y' \end{bmatrix} = \begin{bmatrix} \cos\theta_Z & -\sin\theta_Z \\ \sin\theta_Z & \cos\theta_Z \end{bmatrix} \begin{bmatrix} x \\ y \end{bmatrix}$$

The above is the model of the transparent-body angle grating 30 provided on the reflection surface 74*a*.

Figure 44:
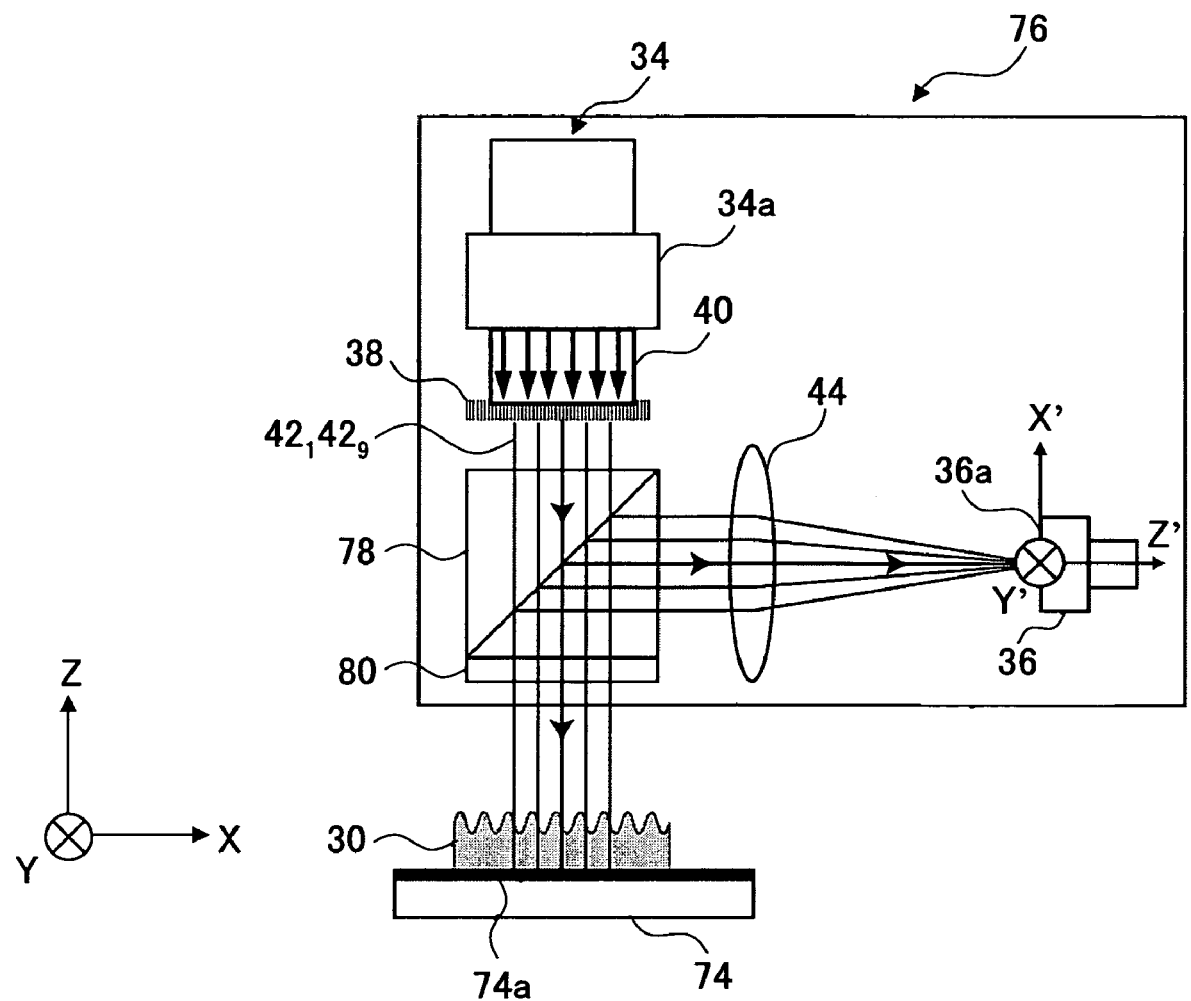
FIG. 44 is a diagram showing the structure of the optical system of the reflection type sensor device of FIG. 41.

FIG. 44 shows the structure of the optical system of reflection type sensor device 70 of FIG. 41. In FIG. 44, the elements which are the same as corresponding elements in the transmission type sensor device of FIG. 28 are designated by the same reference numerals.

Since the optical sensor unit 76 is the structure which has the light emitting unit 34 and the light receiving unit 36, it is possible to miniaturize the whole apparatus rather than what forms light emitting unit 34 and light receiving unit 36 in another object.

The parallel light 40 coming out from the laser light source (LD)34*a* of the light emitting unit 34 enters into the spectrum plate 38 having the grid pattern in which the minute openings are located in a line periodically in the two-dimensional manner. In the spectrum plate 38, the light diffracted by the minute openings 38A-38I of the grid pattern interferes mutually, and it penetrates the polarization beam splitter (PBS) 78 and the ¼ wavelength plate 80. And on the transparent-body angle grating 30, nine parallel light beams 421-429 are generated in which the peaks appear at the same spacing as the opening spacing of the grid pattern.

After penetrating the transparent-body angle grating 30, being reflected by the reflection surface 74*a* and penetrating the transparent-body angle grating 30 again, it is reflected in the direction of 90 degrees by the polarization beam splitter 78, and is focused on the light-receiving surface 36*a* of the light receiving unit 36 by the objective lens 44.

Like the above-mentioned transmission type sensor device of FIG. 28, the model of the reflection type sensor device 70 is summarized, and the intensity distribution I(x, y) on the light-receiving surface 36*a* of the light receiving unit 36 is determined.

The intensity distribution I(x, y) of the light-receiving surface 36*a* in this embodiment is represented by the following formulas (29).

$$ua'(x, y) = ua(x, y) \cdot g(x, y), \quad (29)$$

$$ub(x, y) = F^{-1}\left[ F[ua'(x, y)] \cdot F\left[ \frac{ie^{-ik\sqrt{z_0^2+x^2+y^2}}}{\lambda\sqrt{z_0^2+x^2+y^2}} \right] \right],$$

$$ub'(x, y) = ub(x, y) \cdot Gr(x, y)$$

$$uc(x, y) = F^{-1}\left[ F[ub'(x, y)] \cdot F\left[ \frac{ie^{-ik\sqrt{z_1^2+x^2+y^2}}}{\lambda\sqrt{z_1^2+x^2+y^2}} \right] \right],$$

$$uc'(x, y) = uc(x, y) \cdot L(x, y)$$

-continued $$ud(x, y) = F^{-1}\left[ F[uc'(x, y)] \cdot F\left[ \frac{ie^{-ik\sqrt{z_2^2+x^2+y^2}}}{\lambda\sqrt{z_2^2+x^2+y^2}} \right] \right],$$

$$I(x, y) = |ud(x, y)|^2$$

Next, the structure of the reflection type sensor device 90 using the reflection surface angle grating will be explained with reference to FIG. 45.

Figure 45:
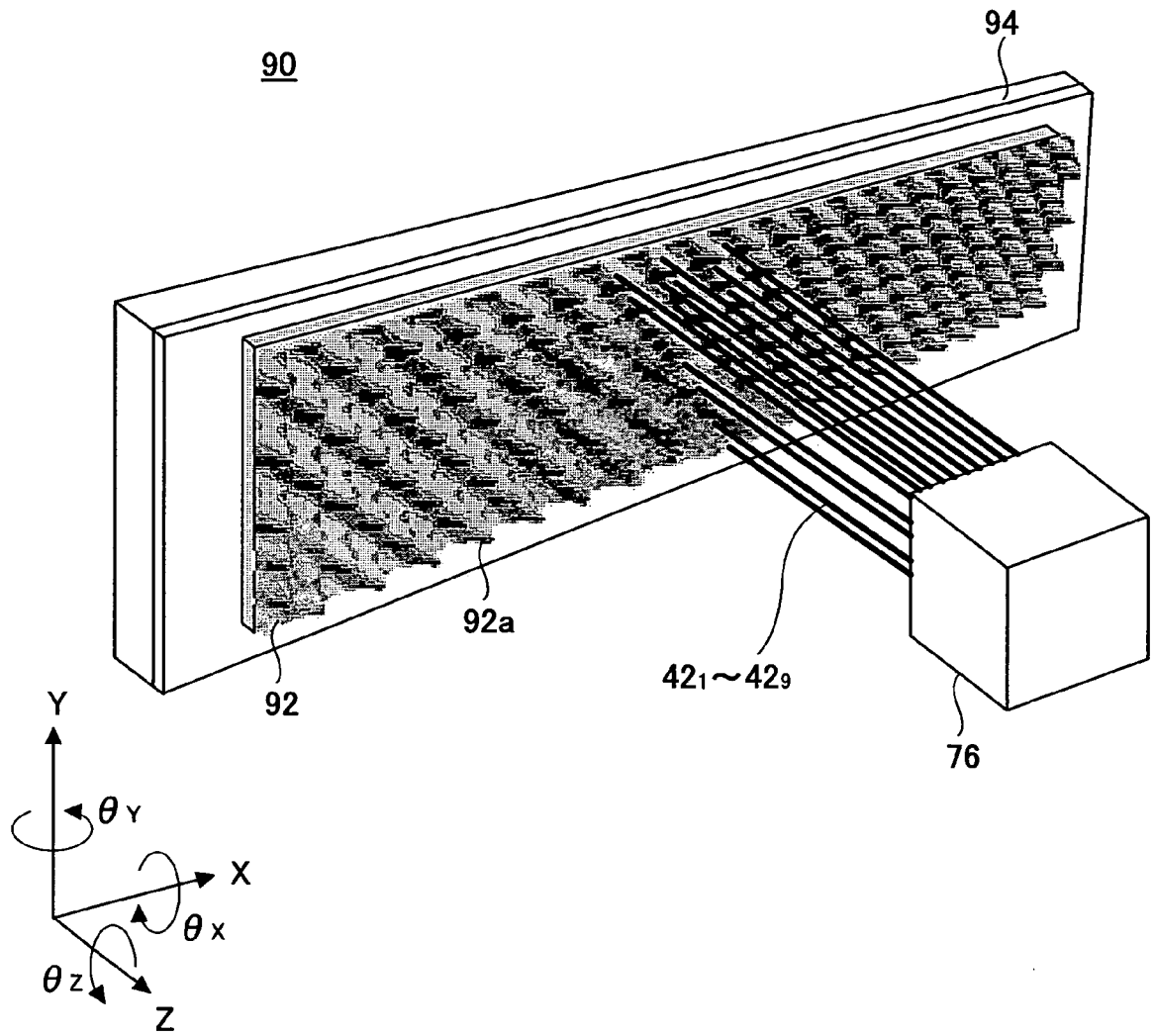
FIG. 45 is a perspective view showing the structure of the reflection type sensor device using the reflection surface angle grating in an embodiment of the invention.

As shown in FIG. 45, the reflection type sensor device 90 is provided with the following. The reflective surface angle grating (reference grating) 92 by which extension formation is carried out in the moving direction of the 1st stage 14, the substrate 94 which holds the reflection surface angle grating 92 in a perpendicular state, the optical sensor unit 76 which emits light in the plurality of parallel light beams to the reflection surface angle grating 92 and receives the reflected light, the reflection film with which the reflection surface angle grating 92 reflects light in the detecting surface 92*a* is formed.

The optical sensor unit 76 has a light emitting unit (not shown) which emits light in the plurality of parallel light beams, and a light receiving unit (not shown) which receives the plurality of reflected light beams reflected by the detecting surface 92*a* of the reflection surface angle grating 92.

Since the optical sensor unit 76 is provided in the side which faces the detecting surface 92*a* of reflection surface angle grating 92 in the reflection type sensor device 90, it is possible to approach the linear motor 18 in the reflection surface angle grating 92 rather than that of the transmission type sensor device of FIG. 28 mentioned above, and it is possible to detect the X-direction, the Y-direction and the rotation angles θx, θy, and θz around the respective axes in the near position of the linear motor 18.

Figure 46:
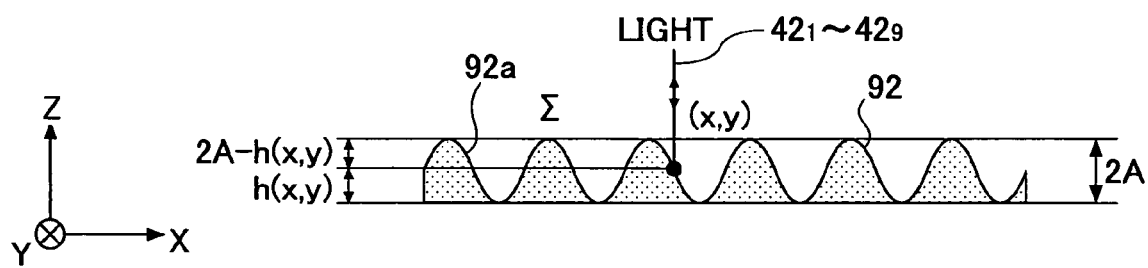
FIG. 46 is a diagram showing the model of the reflection surface angle grating in the reflection type sensor device of FIG. 45.

The principle of the state detection of the reflection type sensor device 90 will be explained. FIG. 46 shows the model of the reflection surface angle grating 92.

The configuration of the reflection surface angle grating 92 is what laid the sinusoidal wave on top of two dimensions as represented by the following formula (30) like the transmission type sensor device of FIG. 28 mentioned above.

$$h(x, y) = -A_x\cos\left(2\pi\frac{x}{P_x}\right) - A_y\cos\left(2\pi\frac{y}{P_y}\right) \quad (30)$$

The pitches Px and Py of the surface configuration of the reflection surface angle grating 92 are on the order of several 100 micrometers or less and the amplitudes Ax and Ay thereof are on the order of several 100 nm or less, and the reflection surface angle grating 92 serves as a diffraction grating if light enters into it.

Then, in considering the model of an encoder, light is treated as a wave and it is analyzed by calculating the amplitude and the phase angle. That is, what is used in this embodiment is not the model of geometrical optics but the model of wave optics.

As shown in FIG. 46, light enter into a position (x, y) of the reflection surface angle grating 92 vertically from the upper part. The light is reflected by the reflection film disposed on the detecting surface 82*a* of the reflection surface angle grating 92 after only distance 2 A-h (x, y) progresses from surface sigma at this time.

Figure 1:
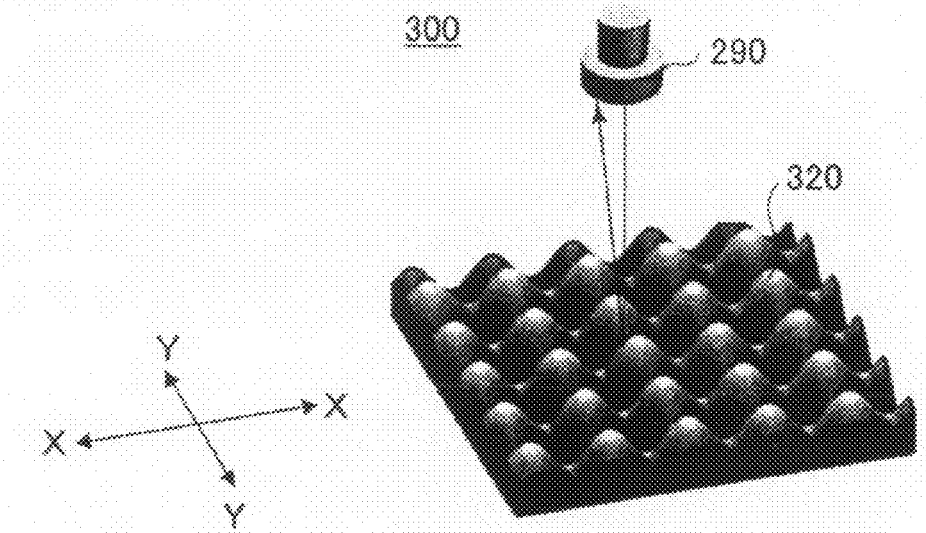
FIG. 1 is a diagram showing the composition of a sensor device which has a reference grating and a two-dimensional angle sensor.
Figure 2:
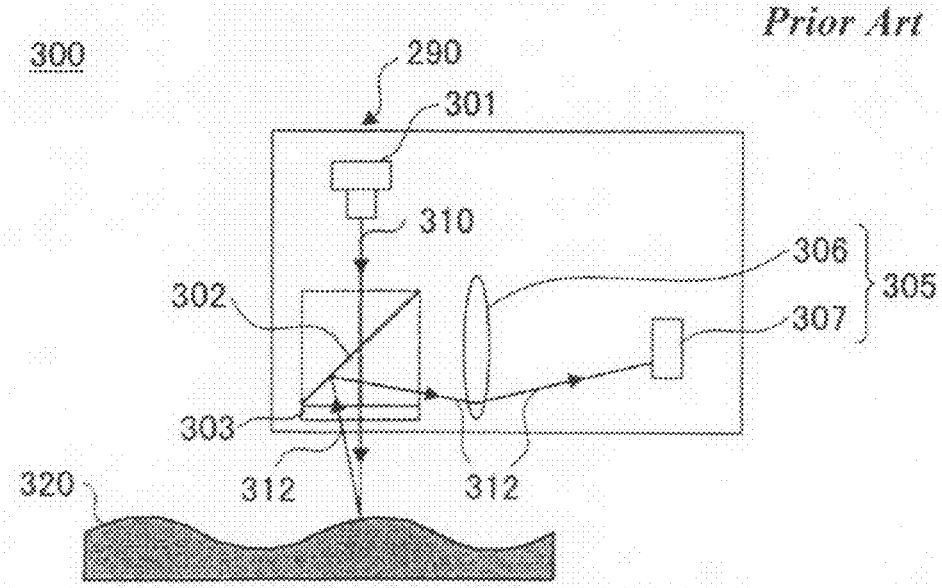
FIG. 2 is a diagram showing the composition of a two-dimensional angle sensor in the sensor device in FIG. 1.

The optical path length L when the light enters from surface sigma and goes to surface sigma (FIG. 2 sigma') again is expressed by the following formula (31).

$$L = 2\{2A - h(x, y)\} \quad (31)$$

Since there is the optical path length L when it goes from surface sigma to surface sigma again, the phase angle is delayed by kL which the product of the wave number k ($=2\pi/\lambda$, $\lambda$: the wavelength of light) and the optical path length. Therefore, the phase function Gr(x, y) which the reflection surface angle grating 92 has can be expressed as being the following formulas (32).

$$Gr(x, y) = e^{-ikL} \quad (32)$$
$$= e^{-ik2\{2A - h(x,y)\}}$$
$$= e^{-ik2h(x,y)} \cdot e^{-i4kA}$$

$$Gr(x, y) = e^{-i2kh(x,y)} \quad (33)$$

Since the constant term $e^{-i4kA}$ is negligible, the above phase function Gr(x, y) can be expressed by the above formula (33).

When the displacements of the X-direction and the Y-direction and the rotation angle around the Z-axis arise in the reflection surface angle grating 92, the formula (33) can be expressed as being the following formulas (34).

$$Gr(x, y) = e^{-i2k\{h(x' + \Delta x, y' + \Delta y) + \theta_Y \cdot x + \theta_X \cdot y\}} \quad (34)$$

$$\begin{bmatrix} x' \\ y' \end{bmatrix} = \begin{bmatrix} \cos\theta_Z & -\sin\theta_Z \\ \sin\theta_Z & \cos\theta_Z \end{bmatrix} \begin{bmatrix} x \\ y \end{bmatrix}$$

In the foregoing, the model of reflection surface angle grating 92 has been explained.

Next, the reflection type sensor device 90 using the above-mentioned reflection surface angle grating 92 will be explained.

Figure 47:
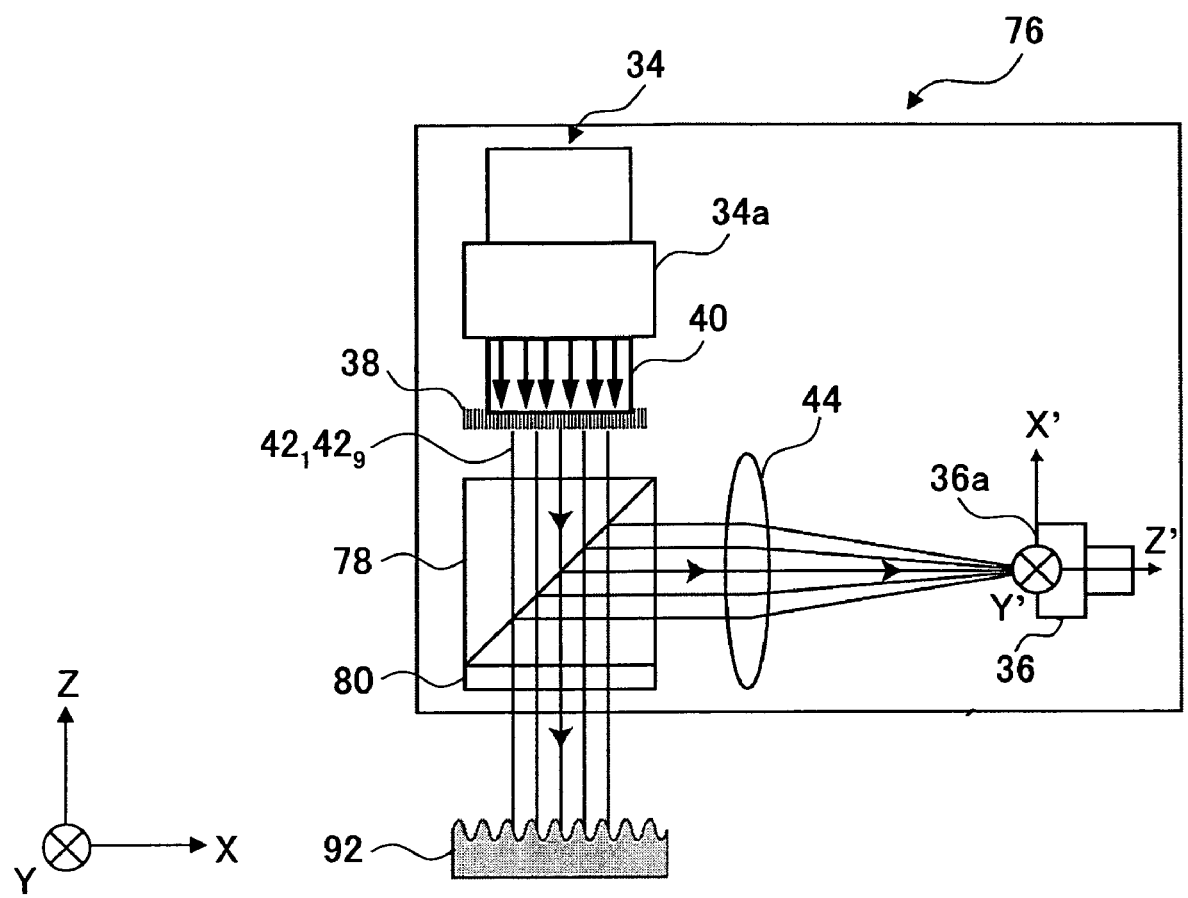
FIG. 47 is a diagram showing the structure of the optical system of the reflection type sensor device of FIG. 45.

FIG. 47 shows the structure of the optical system of the reflection type sensor device (reflection type surface encoder) of FIG. 45.

In FIG. 47, the elements which are the same as corresponding elements in the reflection type sensor device of FIG. 41 are designated by the same reference numerals.

Since the optical sensor unit 76 is the structure having the light emitting unit 34 and the light receiving unit 36 as shown in FIG. 47, it is possible to miniaturize the whole apparatus rather than in the case in which the light emitting unit 34 and the light receiving unit 36 are provided in separate components. The parallel light 40 coming out from the laser light source (LD) 34a of the light emitting unit 34 enters into the spectrum plate 38 having the grid pattern in which the minute openings are arranged in a line periodically in the two-dimensional manner.

In the spectrum plate 38, the light diffracted by the minute openings 38A-38I of the grid pattern interferes with each other, and it penetrates the polarization beam splitter (PBS) 78 and the ¼ wavelength plate 80. And on the transparent-body angle grating 30, nine parallel light beams 421-429 are generated in which the peaks appear at the same spacing as the opening spacing of the grid pattern.

It is reflected by the reflection film of the detecting surface 92a of the reflection surface angle grating 92, and it is reflected in the direction of 90 degrees by the polarization beam splitter 78, and it is focused on the light-receiving surface 36a of the light receiving unit 36 by the objective lens 44.

Similar to the transmission type sensor device of FIG. 28 mentioned above, the model of the reflection type sensor device 90 is summarized, and the intensity distribution I(x, y) of the light-receiving surface 36a of the light receiving unit 36 is determined.

The intensity distribution I(x, y) of the light-receiving surface 36a in this embodiment is represented by the following formulas (35).

$$ua'(x, y) = ua(x, y) \cdot g(x, y), \quad (35)$$

$$ub(x, y) = F^{-1}\left[F[ua'(x, y)] \cdot F\left[\frac{ie^{-ik\sqrt{z_0^2 + x^2 + y^2}}}{\lambda\sqrt{z_0^2 + x^2 + y^2}}\right]\right],$$

$$ub'(x, y) = ub(x, y) \cdot Gr(x, y)$$

$$uc(x, y) = F^{-1}\left[F[ub'(x, y)] \cdot F\left[\frac{ie^{-ik\sqrt{z_1^2 + x^2 + y^2}}}{\lambda\sqrt{z_1^2 + x^2 + y^2}}\right]\right],$$

$$uc'(x, y) = uc(x, y) \cdot L(x, y)$$

$$ud(x, y) = F^{-1}\left[F[uc'(x, y)] \cdot F\left[\frac{ie^{-ik\sqrt{z_2^2 + x^2 + y^2}}}{\lambda\sqrt{z_2^2 + x^2 + y^2}}\right]\right],$$

$$I(x, y) = |ud(x, y)|^2$$

Figure 48:
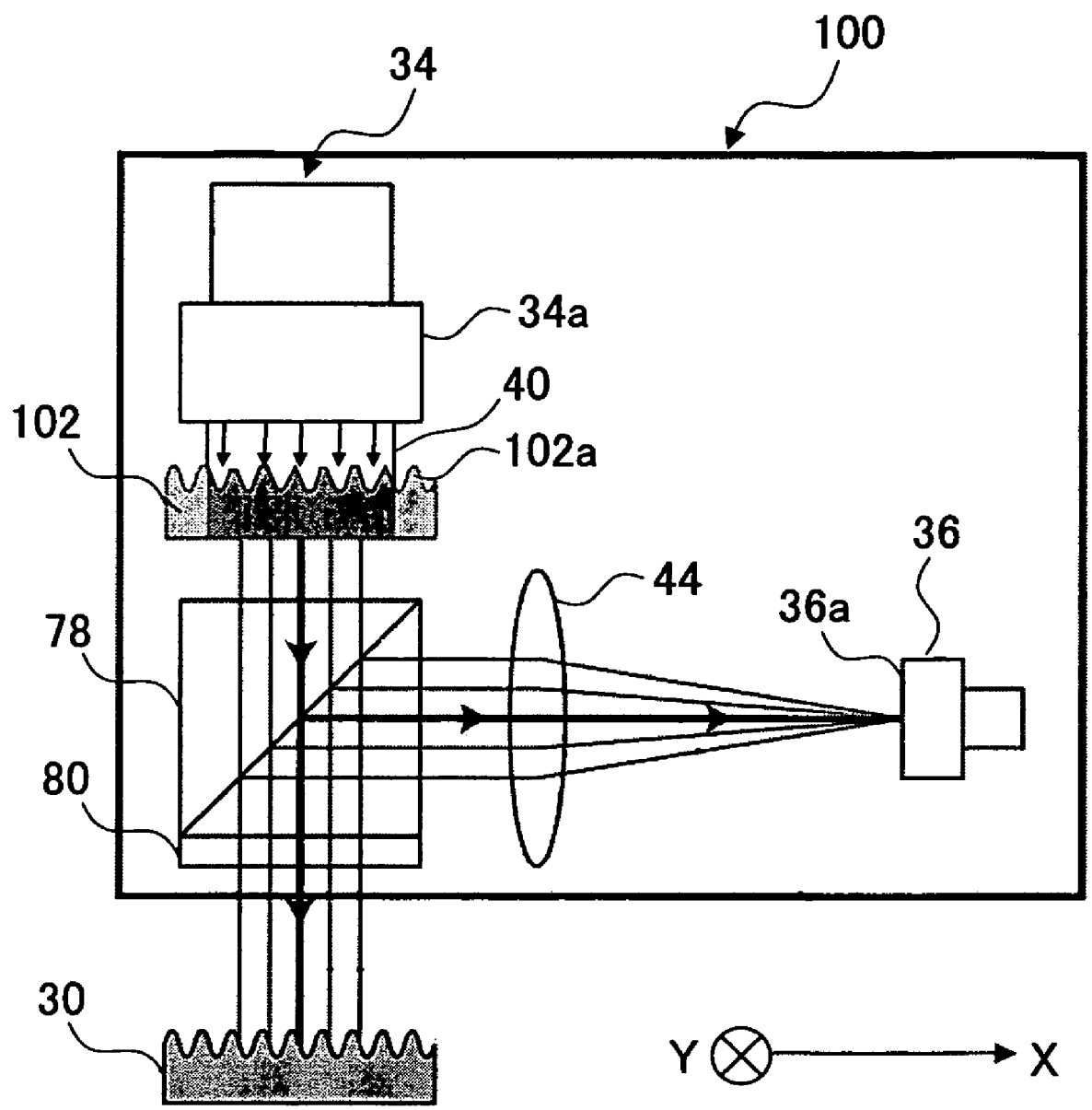
FIG. 48 is a diagram showing the structure of the optical sensor unit used in a reflection type sensor device in an embodiment of the invention.

FIG. 48 shows the structure of an optical sensor unit 100 used for the reflection type sensor device in an embodiment of the invention.

In FIG. 48, the elements which are the same as corresponding elements in the above-mentioned optical sensor unit 76 of FIG. 44 are designated by the same reference numerals, and a description thereof will be omitted.

As shown in FIG. 48, the optical sensor unit 100 has the light emitting unit 34 and the light receiving unit 36, and the parallel light 40 coming out from the laser light source (LD) 34a of the light emitting unit 34 enters into the incidence plane 102a of the transparent-body angle grating 102 which functions as a spectral unit.

The incidence plane 102a of the transparent-body angle grating 102 is provided in the configuration that is the same as that of the detecting surface 30a of the transparent-body angle grating 30 mentioned above. Namely, the three-dimensional concave curves and three-dimensional convex curves which have a profile of a predetermined sinusoidal-wave configuration on the incidence plane 102a are formed in the two-dimensional manner periodically.

The concavo-convex configuration of the incidence plane 102a is formed uniformly and with high precision in a manner that is the same as that of the transparent-body angle grating 30 mentioned above. The light emitting unit 34 is formed so that it may face the incidence plane 102a of the transparent-body angle grating 102 perpendicularly.

Since the parallel light 40 emitted from the light emitting unit 34 is irradiated to the whole incidence plane 102a and the concave curves and convex curves of the incidence plane 102a function as minute lenses, the parallel light 40 is converted into the plurality of light beams in which the light beams diffused in the concave curves and the light beams converged in the convex curves overlap. The number and pitch of the light beams which are produced at this time can be selectively set up with the radius of curvature of each concave curve and each convex curve.

Therefore, using the transparent-body angle grating 102 as a spectral unit, instead of the above-mentioned spectrum plate 38, makes it possible to perform the light beam conversion more precisely than the spectrum plate 38.

The light beams produced by the transparent-body angle grating 102 penetrate the polarization beam splitter (PBS) 78 and the ¼ wavelength plate 80. And on the transparent-body angle grating 30, the parallel light beams 421-42n are formed in which the peaks appear at predetermined intervals.

After the light beams penetrate the transparent-body angle grating 30, are reflected by the reflection surface 74a and penetrate the transparent-body angle grating 30 again, the light beams are reflected in the direction of 90 degrees by the polarization beam splitter 78, and are focused on the light-receiving surface 36a of the light receiving unit 36 by the objective lens 44.

Using the multiple-element type PD (see FIG. 32) or CCD (charge-coupled device) as the photodetector of the light receiving unit 36 makes it possible to measure the inclination attitude by the rotation around each axis, such as pitching, rolling, and yawing angles, in addition to the X and Y direction positions.

The above-described stage device of the invention can be widely applied to not only semiconductor manufacturing devices but also the field of art which needs micro fabrication, such as micromachines, optical communication parts for information technology, etc. That is, many of the current micromachine manufacturing techniques use semiconductor manufacturing technology, and the use of the stage device of the invention will make it possible to manufacture various smaller micromachines. Moreover, in the field of laser beam machining, it is demanded that the stage is moved by submicron accuracy at a very high speed.

Furthermore, in order to process a complicated configuration, a stage device having a large number of degrees of freedom is demanded. Although none of the conventional stage devices meets such demands, it is possible for the stage device of the invention to meet the demands of a high level of accuracy, a high speed and a large number of degrees of freedom. The stage device of the invention can be used also as a stage device for laser beam machining.

Moreover, the stage device of the invention is applicable to not only the above-mentioned surfaces but also the assembly processes of electronic parts, such as super-precision mechanical devices, super-precision measuring devices or mounters, inspection devices, and other devices in the office automation surface.

The present invention is not limited to the above-described embodiment, and variations and modifications may be made without departing from the scope of the present invention. In the above-described embodiments, the stage device in which the three two-dimensional angle sensors are provided has been explained. However, the present invention is not limited to the specific number of two-dimensional angle sensors in the above-described embodiments. For example, the composition in which only one two-dimensional angle sensor is provided may be sufficient to solve the above-mentioned problems of the related art.

The present invention is applicable to a stage device which can attain the miniaturization of the stage device and can perform measurement of a position of the stage to the base with high accuracy.

The disclosure of Japanese Patent Application No. 2004-131886, filed on Apr. 27, 2004, and Japanese Patent Application No. 2004-191828, filed on Jun. 29, 2004, and including the specification, drawings and claims, is incorporated herein by reference in its entirety.

What is claimed is:

1. A sensor device comprising:
   a reference grating having a configuration that is varied periodically in two dimensions;
   a light source emitting light to the reference grating;
   a spectral unit disposed between the light source and the reference grating and having a plurality of openings configured to convert the light emitted by the light source into a plurality of parallel light beams through the plurality of openings, wherein said plurality of parallel light beams output from the spectral unit reach the reference grating directly without changing respective spaces between the light beams and each of said plurality of parallel light beams is reflected by the reference grating; and
   a detector unit comprising a photodetector configured to receive the light beams reflected by the reference grating, wherein the detector unit is configured to detect a state of a movable body relative to the reference grating based on a change of the reflected light beams collectively received by the photodetector.

2. The sensor device according to claim 1 wherein the photodetector comprises a plurality of photodiodes which include at least four photodiodes, provided in a central part of a surface of the detector unit receiving the reflected light beams, wherein the photodiodes are configured to detect a state of the movable body by rotational movement of the movable body around a X-axis and to detect a state of the movable body by rotational movement of the movable body around a Y-axis.

3. The sensor device according to claim 1 wherein the photodetector comprises a plurality of photodiodes which include at least two pairs of photodiodes, provided at four corner parts of a surface of the detector unit receiving the reflected light beams, wherein the photodetectors are configured to detect a state of the movable body by rotational movement of the movable body around a Z-axis.

4. The sensor device according to claim 1 wherein a charge-coupled device is used as the photodetector.

5. The sensor device according to claim 1 wherein the reference grating has a configuration which is symmetrical in the two dimensions of the reference grating within a surface of the reference grating.

6. A sensor device comprising:
   a reference grating having a detecting surface on which concave curves and convex curves in a predetermined configuration are periodically formed in two dimensions;
   a reflection surface provided on a back surface of the reference grating;
   a light emitting unit configured to be movable relative to the reference grating and operationally coupled to a spectral unit disposed between the light emitting unit and the reference grating, said spectral unit comprising a plurality of openings and configured to transmit a plurality of parallel light beams from the plurality of openings to the detecting surface of the reference grating perpendicularly, wherein said plurality of parallel light beams output from the spectral unit reach the reference grating directly without changing respective spaces between the light beams and each of said plurality of light beams is reflected by the reflection surface; and
   a light receiving unit configured to be movable integrally with the light emitting unit and comprising a plurality of photodetectors configured to collectively receive the plurality of the light beams which are reflected by the reflection surface.

7. A sensor device comprising:

a reference grating having a detecting surface on which concave curves and convex curves in a predetermined configuration are periodically formed in two dimensions;

a reflection surface provided on the detecting surface of the reference grating;

a light emitting unit configured to be movable relative to the reference grating and operationally coupled to a spectral unit disposed between the light emitting unit and the reference grating, said spectral unit comprising a plurality of openings and configured to transmit a plurality of parallel light beams from the plurality of openings to the detecting surface of the reference grating perpendicularly, wherein said plurality of parallel light beams output from the spectral unit reach the reference grating directly without changing respective spaces between the light beams and each of said plurality of parallel light beams is reflected by the reference grating; and a light receiving unit configured to be movable integrally with the light emitting unit and comprising a plurality of photodetectors comprising to collectively receive the plurality of the light beams which are reflected by the reflection surface.

8. A stage device comprising:

a base;

a stage which is moved on the base;

a motor which drives movement of the stage;

a raising unit which functions to raise the stage from the base; and a sensor device which detects a state of the stage, the sensor device comprising a reference grating having a configuration that is varied periodically in two dimensions;

a light source emitting light to the reference grating;

a spectral unit disposed between the light source and the reference grating and having a plurality of openings to convert the light emitted by the light source into a plurality of light beams through the plurality of openings, wherein each of the plurality of light beams is reflected by the reference grating and said plurality of parallel light beams output from the spectral unit reach the reference grating directly without changing respective spaces between the light beams; and a detector unit comprising a photodetector configured to receive collectively the light beams reflected by the reference grating, wherein the detector unit is configured to detect a state of the stage relative to the reference grating based on a change of the reflected light beams collectively received by the photodetector.

9. The stage device according to claim 8, wherein the motor is constituted by a planar motor, and the raising unit is constituted by an air bearing.

* * * * *